(12) United States Patent
Ikeda et al.

(10) Patent No.: US 6,208,571 B1
(45) Date of Patent: Mar. 27, 2001

(54) SEMICONDUCTOR MEMORY DEVICE, CIRCUIT BOARD MOUNTED WITH SEMICONDUCTOR MEMORY DEVICE, AND METHOD FOR TESTING INTERCONNECTION BETWEEN A SEMICONDUCTOR MEMORY DEVICE WITH A CIRCUIT BOARD

(75) Inventors: Mitsutaka Ikeda; Tsutomu Taniguchi; Yoshikazu Homma, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/500,467

(22) Filed: Feb. 9, 2000

(30) Foreign Application Priority Data

Apr. 30, 1999 (JP) .................................................. 11-124399
Nov. 9, 1999 (JP) .................................................. 11-318457

(51) Int. Cl.$^7$ ...................................................... G11C 7/00
(52) U.S. Cl. ............................................ 365/201; 365/63
(58) Field of Search ..................... 365/201, 63; 714/720, 714/722, 733

(56) References Cited

U.S. PATENT DOCUMENTS

| 5,987,623 | * | 11/1999 | Ushida ................................. | 365/201 |
| 5,995,425 | * | 11/1999 | Henkels et al. ....................... | 365/201 |
| 6,016,561 | * | 1/2000 | Roohparvar et al. ................. | 714/720 |
| 6,067,255 | * | 5/2000 | Jung et al. ........................ | 365/189.02 |
| 6,078,536 | * | 6/2000 | Moon et al. ......................... | 365/201 |

\* cited by examiner

*Primary Examiner*—Son T. Dinh
(74) *Attorney, Agent, or Firm*—Arent Fox Kintner Plotkin & Kahn PLLC

(57) ABSTRACT

A semiconductor memory device comprises a detecting unit and a testing unit. The detecting unit detects a plurality of times a state of a predetermined terminal when the power is switched on, and activates the testing unit when all results of the detections show expected values. The device shifts to a connection testing mode by activation of the testing unit, and performs predetermined testing. Therefore, the testing can be performed by causing the device to shift to the testing mode without using terminals dedicated to testing. Besides, a shift to the connection testing mode by activation due to an erroneous operation or power-supply noise is prevented from occurring. In another semiconductor memory device the conversion circuit receives parallel testing patterns via a plurality of input terminals and converts the patterns into serial output patterns. Since the parallel testing patterns are converted into serial output patterns, connection testing can be performed even when the number of output terminals is small. Furthermore, another semiconductor memory device comprises an operation circuit and a conversion circuit. The operation circuit receives parallel testing patterns via a plurality of input terminals, performs a logic operation, and outputs parallel operation result patterns. The conversion circuit receives the parallel operation result patterns and converts the patterns into serial output patterns. The converted output patterns are sequentially output from output terminals. The testing patterns fed to the conversion circuit by the operation circuit can be reduced. Accordingly, the output patterns become shorter, and testing time is reduced.

25 Claims, 35 Drawing Sheets

| Pin | A0 | A1 | A2 | A3 | A4 | A5 | A6 | A7 | A8 | A9 | A10 | A11 | A12 | A13 | A14 | A15 | A16 | A17 | A18 | A19 | A20 | A21 | WE | A-1 | DQ0 DQ1 DQ2 DQ3 DQ4 DQ5 DQ6 DQ7 | DQ8 DQ9 DQ10 DQ11 DQ12 DQ13 DQ14 DQ15 | RY/BY |
|---|---|---|---|---|---|---|---|---|---|---|---|---|---|---|---|---|---|---|---|---|---|---|---|---|---|---|---|
| Walking-1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | L H H H H H H H | | L |
| | 0 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | H L H H H H H H | | H |
| | 0 | 0 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | H H L H H H H H | | H |
| | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 0 | 0 | H H H L H H H H | | H |
| | 0 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 0 | H H H H L H H H | | H |
| | 0 | 0 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | H H H H H L H H | | H |
| | 0 | 0 | 0 | 0 | 0 | 0 | 1 | 0 | 0 | 0 | 0 | 0 | 0 | 0 | 0 | 0 | 0 | 0 | 0 | 0 | 0 | 0 | 0 | 0 | H H H H H H L H | | H |
| | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 | 0 | H H H H H H H L | | H |
| | 0 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 | L H H L H H H H | | H |
| | 0 | 0 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | L H H H L H H H | | H |
| | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 | 0 | L H H H H L H H | | H |
| | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 | L H H H H H L H | | H |
| | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | L H H H H H H L | | H |
| | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | H L H L H H H H | | H |
| | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | H L H H L H H H | | H |
| | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | H L H H H L H H | | H |
| | 0 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | H L H H H H L H | | H |
| | 0 | 0 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | H L H H H H H L | | H |
| | 0 | 0 | 0 | 0 | 0 | 0 | 0 | 0 | 0 | 0 | 0 | 0 | 0 | 0 | 0 | 0 | 0 | 0 | 1 | 0 | 0 | 0 | 0 | 0 | H H L L H H H H | | H |
| | 0 | 0 | 0 | 0 | 0 | 0 | 0 | 0 | 0 | 0 | 0 | 0 | 0 | 0 | 0 | 0 | 0 | 0 | 0 | 1 | 0 | 0 | 0 | 0 | H H L H L H H H | | H |
| | 0 | 0 | 0 | 0 | 0 | 0 | 0 | 0 | 0 | 0 | 0 | 0 | 0 | 0 | 0 | 0 | 0 | 0 | 0 | 0 | 1 | 0 | 0 | 0 | H H L H H L H H | | H |
| | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 0 | 0 | H H L H H H L H | | H |
| | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 0 | H H L L L H H L | | H |
| | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | H H H L L H H H | | L |
| All-0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | H H H H H H H H | | H |
| Walking-0 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | L H H H H H H H | | L |
| | 1 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | H L H H H H H H | | H |
| | 1 | 1 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | H H L H H H H H | | H |
| | 1 | 1 | 1 | 0 | 1 | 1 | 1 | 1 | 1 | 1 | 1 | 1 | 1 | 1 | 1 | 1 | 1 | 1 | 1 | 1 | 1 | 1 | 1 | 1 | H H H L H H H H | | H |
| | 1 | 1 | 1 | 1 | 0 | 1 | 1 | 1 | 1 | 1 | 1 | 1 | 1 | 1 | 1 | 1 | 1 | 1 | 1 | 1 | 1 | 1 | 1 | 1 | H H H H L H H H | | H |
| | 1 | 1 | 1 | 1 | 1 | 0 | 1 | 1 | 1 | 1 | 1 | 1 | 1 | 1 | 1 | 1 | 1 | 1 | 1 | 1 | 1 | 1 | 1 | 1 | H H H H H L H H | | H |
| | 1 | 1 | 1 | 1 | 1 | 1 | 0 | 1 | 1 | 1 | 1 | 1 | 1 | 1 | 1 | 1 | 1 | 1 | 1 | 1 | 1 | 1 | 1 | 1 | H H H H H H L H | | H |
| | 1 | 1 | 1 | 1 | 1 | 1 | 1 | 0 | 1 | 1 | 1 | 1 | 1 | 1 | 1 | 1 | 1 | 1 | 1 | 1 | 1 | 1 | 1 | 1 | H H H H H H H L | | H |
| | 1 | 1 | 1 | 1 | 1 | 1 | 1 | 1 | 0 | 1 | 1 | 1 | 1 | 1 | 1 | 1 | 1 | 1 | 1 | 1 | 1 | 1 | 1 | 1 | L H H L H H H H | | H |
| | 1 | 1 | 1 | 1 | 1 | 1 | 1 | 1 | 1 | 0 | 1 | 1 | 1 | 1 | 1 | 1 | 1 | 1 | 1 | 1 | 1 | 1 | 1 | 1 | L H H H L H H H | | H |
| | 1 | 1 | 1 | 1 | 1 | 1 | 1 | 1 | 1 | 1 | 0 | 1 | 1 | 1 | 1 | 1 | 1 | 1 | 1 | 1 | 1 | 1 | 1 | 1 | L H H H H L H H | | H |
| | 1 | 1 | 1 | 1 | 1 | 1 | 1 | 1 | 1 | 1 | 1 | 0 | 1 | 1 | 1 | 1 | 1 | 1 | 1 | 1 | 1 | 1 | 1 | 1 | L H H H H H L H | | H |
| | 1 | 1 | 1 | 1 | 1 | 1 | 1 | 1 | 1 | 1 | 1 | 1 | 0 | 1 | 1 | 1 | 1 | 1 | 1 | 1 | 1 | 1 | 1 | 1 | L H H H H H H L | | H |
| | 1 | 1 | 1 | 1 | 1 | 1 | 1 | 1 | 1 | 1 | 1 | 1 | 1 | 0 | 1 | 1 | 1 | 1 | 1 | 1 | 1 | 1 | 1 | 1 | H L H L H H H H | | H |
| | 1 | 1 | 1 | 1 | 1 | 1 | 1 | 1 | 1 | 1 | 1 | 1 | 1 | 1 | 0 | 1 | 1 | 1 | 1 | 1 | 1 | 1 | 1 | 1 | H L H H L H H H | | H |
| | 1 | 1 | 1 | 1 | 1 | 1 | 1 | 1 | 1 | 1 | 1 | 1 | 1 | 1 | 1 | 0 | 1 | 1 | 1 | 1 | 1 | 1 | 1 | 1 | H L H H H L H H | | H |
| | 1 | 1 | 1 | 1 | 1 | 1 | 1 | 1 | 1 | 1 | 1 | 1 | 1 | 1 | 1 | 1 | 0 | 1 | 1 | 1 | 1 | 1 | 1 | 1 | H L H H H H L H | | H |
| | 1 | 1 | 1 | 1 | 1 | 1 | 1 | 1 | 1 | 1 | 1 | 1 | 1 | 1 | 1 | 1 | 1 | 0 | 1 | 1 | 1 | 1 | 1 | 1 | H L H H H H H L | | H |
| | 1 | 1 | 1 | 1 | 1 | 1 | 1 | 1 | 1 | 1 | 1 | 1 | 1 | 1 | 1 | 1 | 1 | 1 | 0 | 1 | 1 | 1 | 1 | 1 | H H L L H H H H | | H |
| | 1 | 1 | 1 | 1 | 1 | 1 | 1 | 1 | 1 | 1 | 1 | 1 | 1 | 1 | 1 | 1 | 1 | 1 | 1 | 0 | 1 | 1 | 1 | 1 | H H L H L H H H | | H |
| | 1 | 1 | 1 | 1 | 1 | 1 | 1 | 1 | 1 | 1 | 1 | 1 | 1 | 1 | 1 | 1 | 1 | 1 | 1 | 1 | 0 | 1 | 1 | 1 | H H L H H L H H | | H |
| | 1 | 1 | 1 | 1 | 1 | 1 | 1 | 1 | 1 | 1 | 1 | 1 | 1 | 1 | 1 | 1 | 1 | 1 | 1 | 1 | 1 | 0 | 1 | 1 | H H L H H H L H | | H |
| | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 0 | 1 | H H L L L H H L | | H |
| | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 0 | H H H L L H H H | | L |
| All-1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | H H H H H H H H | | H |

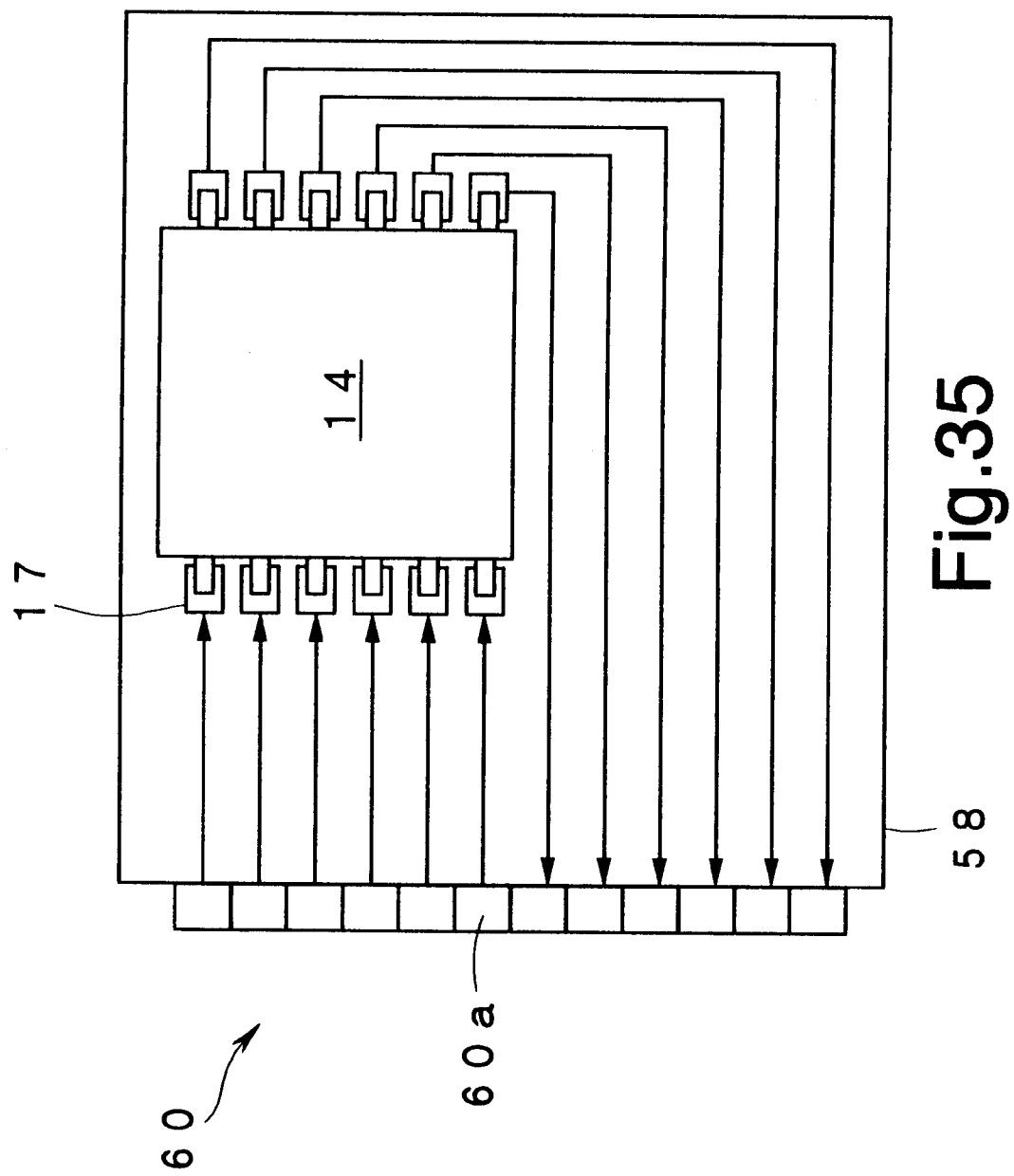

SEMICONDUCTOR MEMORY DEVICE, CIRCUIT BOARD MOUNTED WITH SEMICONDUCTOR MEMORY DEVICE, AND METHOD FOR TESTING INTERCONNECTION BETWEEN A SEMICONDUCTOR MEMORY DEVICE WITH A CIRCUIT BOARD

BACKGOUND OF THE INVENTION

1. Field of the Invention

The present invention relates to a semiconductor memory device, and more specifically, to a semiconductor memory device having a testing function.

The present invention also relates to a circuit board mounted with a semiconductor memory device.

The present invention further relates to a method for testing interconnection between a semiconductor memory device with a circuit board.

2. Description of the Related Art

A mounting density of a printed-wiring board or the like has been increasing due to downsizing of electronic components, and sizes of electronic apparatuses are getting smaller. For example, a package shape of a semiconductor memory device has been reduced from DIP (Dual In-line Package), to SOP (Small Outline Package) and to TSOP (Thin Small Outline Package). Spaces between terminals of semiconductor memory devices are also getting narrower, following downsizing of packages. Recently, CSP (Chip Size Package) in which terminals of a semiconductor memory device are arranged two-dimensionally has been developed.

Connection failures between terminals of electronic components and printed-wiring boards occurring at the time of mounting the electronic components on the boards have been increasing with downsizing of packages. And it is getting much more difficult to directly confirm an interconnection between a terminal and a printed-wiring board. For this reason, an interconnection testing method for easy and secure confirmation of a connection between an electronic component and a printed-wiring board mounted with the component has been desired.

As such a method, a boundary scanning method has been known. The boundary scanning method is a testing method standardized as IEEE/ANSI Standard 1491.1.

FIG. 1 is a block diagram showing an outline of the boundary scanning method.

A TDI (Test Data Input) terminal, a TMS (Test Mode Select) terminal, a TCK (Test Clock) terminal, and a TDO (Test Data Output) terminal are formed in each of electronic components 1a and 1b, and on a printed-wiring board 2. The TDI, TDO, TCK and TMS terminals are terminals dedicated to testing, and not used for other purposes. Each of the testing terminals of the electronic components 1a and 1b is connected to each of the corresponding testing terminals according to a wiring pattern 3 formed on the board 2.

A plurality of BS cells 4, an instruction register 5, a bypass register 6, and a TAP controller 7 are implemented in both of the electronic components 1a and 1b, as a testing circuit. The BS cells 4 are arranged in the electronic components 1a and 1b, corresponding to respective terminals T connected to a core unit 8, and have a latching function. The instruction register 5 is a circuit for storing an instruction for testing received by the TDI terminal. The bypass register 6 is a circuit for directly outputting data received by the TDI terminal to the TDO terminal. The TAP controller 7 has a function of decoding a test-mode signal received by the TMS terminal.

When a plurality of electronic components such as the electronic components 1a and 1b are mounted on the printed-wiring board 2 as shown in FIG. 1, the TDO terminal of the electronic component 1a is connected to the TDI terminal of the neighboring electronic component 1b. A scanning path PATH on a loop shown by thick solid lines is formed on the board 2.

An interconnection test is performed on the electronic components 1a and 1b and on the board 2 in the following manner. A controller (not shown in FIG. 1) connected to the external of the board 2 feeds a testing instruction and an input pattern from the TDI terminal to the electronic components 1a and 1b, by controlling each of the above terminals. Each of the testing circuits 4, 5, 6, and 7 of the electronic components 1a and 1b operates in accordance with the instruction and the input pattern from the controller, and outputs an output pattern from the TDO terminal.

The controller confirms a connection between each of the terminals T of the electronic components 1a and 1b and the printed-wiring board 2, by comparing the output pattern with expected values. Faults such as a soldering failure of each terminal and slight displacement of mounted position of the electronic components 1a and 1b can be detected.

The boundary scanning method needs terminals dedicated to testing and a plurality of testing circuits within an electronic component. Therefore, application of the boundary scanning method substantially affects chip sizes. For this reason, this method is mainly applied to logic products such as microprocessors and ASICs (Application Specific ICs).

Meanwhile, as a method of testing interconnections for semiconductor memory devices or the like, SCITT (Static Component Interconnection Test Technology) has been developed. Hereinafter, an example of an SDRAM (Synchronous DRAM) to which the SCITT method has been applied will be explained.

An SDRAM of this kind has a mode for testing interconnections, in addition to a normal operation mode. A shift to the connection testing mode is performed by feeding a predetermined signal to a predetermined terminal before a power-on sequence is performed. A semiconductor memory device operating in synchronization with a clock, such as an SDRAM, can easily distinguish internal circuit control at the time of the power becomes ON from normal operation control. Therefore, an erroneous shift to the connection testing mode during a normal operation is prevented by controlling a shift to the testing mode only at the time the power becomes ON.

During the connection testing mode, each terminal of the SDRAM, except for terminals used as control terminals, is used either as an inputting test terminal feeding an input pattern or as an outputting test terminal outputting an output pattern. For this reason, terminals dedicated to testing are not necessary in the SCITT method. In an SDRAM, a simple operation circuit carrying out a logic operation on input patterns and outputting a result of the operation as an output pattern is implemented. However, a scale of the circuit necessary for testing interconnection is smaller than the boundary scanning method.

In the SCITT method described above, a memory controller, for example, mounted on a printed-wiring board together with an SDRAM feeds an input pattern to the inputting test terminal of the SDRAM. The SDRAM carries out a logic operation and outputs a result of the operation as an output pattern. The memory controller compares the output pattern with expected values and confirms an interconnection between each of the terminals in the SDRAM and the board. In this manner, faults such as a soldering failure of a terminal and slight displacement of mounted position of a chip can be detected.

The SCITT method can detect a connection failure for all terminals except for power supply terminals, a ground terminal, and a control terminal for testing. The faults which can be detected are stuck-at 0 failures, stuck-at 1 failures, open failures, and 2-net AND-type and OR-type short failures.

As has been described above, the SCITT method does not need dedicated testing terminals and the scale of the circuit necessary for testing is smaller than in the boundary scanning method. Therefore, the chip size is not affected by application of the SCITT method.

In order to carry out the boundary scanning method described above, the TDI terminals, the TMS terminals, the TCK terminals, and the TDO terminals dedicated to testing are formed in the electronic components 1a and 1b, and the testing circuits such as the instruction register 5 and the TAP controller 7 are implemented. Therefore, the chip sizes of the electronic components 1a and 1b increase. Since an increase in a chip size directly affects production costs, application of the boundary scanning method to a semiconductor memory device, such as a DRAM, especially, has been difficult.

The SCITT method described above are to be applied to a semiconductor memory device of clock synchronous type, such as an SDRAM. More specifically, by limiting a target of the SCITT method to a semiconductor device having a power-on sequence, an erroneous shift to the testing mode during a normal operation is prevented with certainty.

Meanwhile, in the case where the SCITT method is applied to an asynchronous semiconductor memory device not having the power-on sequence, no technique to prevent an erroneous shift to the testing mode during a normal operation has been proposed. Therefore, if the existing SCITT method is applied to an asynchronous semiconductor memory device not using a clock, such as a flash memory or an SRAM, an erroneous shift to the connection testing mode may occur during a normal operation.

Furthermore, no technique has been proposed to apply the SCITT method to a semiconductor memory device such as a flash memory comprising a switching terminal for switching data input/output terminals between 8 bits and 16 bits.

Moreover, the existing SCITT method is not applicable to the case where a terminal of a semiconductor memory device mounted on a printed-wiring board is not connected to the external of the device. In such a case, interconnection test cannot be performed properly.

SUMMARY OF THE INVENTION

An object of the present invention is to carry out interconnection test by causing a semiconductor memory device to shift to a connection testing mode without using dedicated testing terminals.

Anther object of the present invention is to carry out testing by causing an asynchronous semiconductor memory device not using a clock signal to shift to a connection testing mode only upon necessity.

Still another object of the present invention is to provide a semiconductor memory device that can prevent a shift to a connection testing mode caused by an erroneous operation during a normal operation or by power-supply noise, and to provide a circuit board mounted with the semiconductor memory device.

Yet another object of the present invention is to cause a semiconductor memory device comprising a reset terminal to shift to a connection testing mode only upon necessity.

Still yet another object of the present invention is to prevent a shift to the connection testing mode again after shifting to the connection testing mode has been completed.

Another object of the present invention is to provide a semiconductor memory device that can prevent activation of a testing unit in advance before or after delivery of the device.

Another object of the present invention is to perform a terminal connection testing in response to each word formation in a semiconductor memory device that can switch the word formation of data from input/output terminals with a switching terminal.

Another object of the present invention is to easily control a shift from the connection testing mode to a normal operation.

Another object of the present invention is to perform the interconnection test with certainty by using a testing unit having a simple configuration.

Another object of the present invention is to provide a semiconductor memory device enabling execution of the interconnection test even in the case where the number of output terminals is small.

Another object of the present invention is to provide a semiconductor memory device enabling reduction in an output pattern and interconnection testing time.

Another object of the present invention is to perform connection testing of each terminal in a semiconductor memory device comprising an output terminal not used in a predetermined normal operation, regardless of what a current operation mode is.

Another object of the present invention is to perform the interconnection test between each terminal of a semiconductor memory device and connecting parts of a circuit board on a circuit board mounted with the device.

Another object of the present invention is to provide a testing method for the semiconductor memory device enabling testing an interconnection between each terminal of a semiconductor memory device and a circuit board, by causing the device to shift to the connection testing mode only upon necessity.

A semiconductor memory device of the present invention comprises a detecting unit and a testing unit. The detecting unit detects a plurality of times a state of a predetermined terminal at the time the power is switched on, and activates the testing unit when all results of the detections show expected values. The semiconductor memory device shifts to a connection testing mode by activation of the testing unit, and performs a predetermined testing. Therefore, the testing can be performed by causing the semiconductor memory device to shift to the connection testing mode without using terminals dedicated to testing. In an asynchronous semiconductor memory device not using a clock signal, a shift to the connection testing mode is performed only upon necessity.

In order to activate the testing unit, states of all predetermined terminals should agree with expected values at the time of detection performed a plurality of times by the detecting unit. Therefore, a shift to the connection testing mode by activation of the testing unit due to an erroneous operation or power-supply noise is prevented from occurring in a normal operation.

According to one of the aspects of the semiconductor memory device of the present invention, a detecting unit detects a state of a predetermined terminal at the time a rest signal fed to a reset terminal is changed. Since the reset signal is not changed during a normal operation, erroneous activation of a testing unit is prevented. In order to activate the testing unit, detection of the predetermined terminal's state by the detecting unit is necessary. Therefore, even in the case where the reset signal is changed accidentally due to power-supply noise or the like, the testing unit is not activated.

According to another aspect of the semiconductor memory device of the present invention, a detecting unit detects a state of a predetermined terminal at the time a reset signal either activates or inactivates respectively twice or more. Since the reset signal is not changed in succession during a normal operation, erroneous activation of a testing unit is prevented. In order to activate the testing unit, detection of the predetermined terminal's state by the detecting unit is necessary. Therefore, even in the case where the reset signal is changed accidentally due to power-supply noise or the like, the testing unit is not activated. Besides, since the detecting unit needs to detect only either rising edge or falling edge of the reset signal, a circuit to be needed for detection can be made simpler.

According to another aspect of the semiconductor memory device of the present invention, a signal received by a predetermined terminal is transmitted to an internal circuit and a detecting unit via an input circuit. The input circuit is kept activate regardless of a level of a reset signal. Therefore, the detecting unit can detect a state of the predetermined terminal with certainty, even when the reset signal changes.

According to another aspect of the semiconductor memory device of the present invention, a detecting unit detects a state of each of the predetermined terminals at two successive edges of a reset signal. The reset signal is not changed in succession during a normal operation. Therefore, erroneous activation of a testing unit can be prevented. In order to activate the testing unit, detection of the state of the predetermined terminal by the detecting unit is necessary. Therefore, even in the case where the reset signal is changed accidentally due to power-supply noise or the like, the testing unit is not activated.

According to another aspect of the semiconductor memory device of the present invention, a predetermined terminal whose state is detected by a detecting unit includes an activation terminal receiving an activation signal for activating an internal circuit, and a control terminal receiving a write control signal or a read control signal for accessing implemented memory elements. The detecting unit activates a testing unit when the activation state of both the activation terminal and the control terminal is detected a plurality of times. Therefore, erroneous activation of the testing unit does not occur, since a reset terminal is not changed when the activation state of the activation terminal and the control terminal is detected during a normal operation.

According to another aspect of the semiconductor memory device of the present invention, a testing unit is inactivated when a change of a reset signal is inactivated during activation of the testing unit. In order to carry out a normal operation, the reset signal needs to be in an inactivation state. Therefore, a shift to the normal operation mode is possible at the same time the testing unit becomes inactivated. As a result, control for switching from the testing mode to the normal operation mode becomes easier. In a semiconductor memory device comprising a reset terminal, a normal operation is generally performed after a reset signal is changed from activation state to inactivation state upon the power is switched on. Therefore, it is not necessary for a user of the semiconductor memory device to consider a connection testing mode, and by implementing the connection testing mode does not degrade operational easiness of the semiconductor memory device. In case of an erroneous shift to the connection testing mode, the testing mode is canceled since the reset signal is changed to the inactivation state during a normal operation.

According to another aspect of the present invention, the semiconductor memory device comprises an activity storing circuit storing information that a testing unit was activated after the power was switched on. The activity storing circuit prohibits reactivation of the testing unit when the stored information is retained therein. For this reason, the testing unit is not activated twice or more after the power is switched on. Therefore, the testing unit is not activated even if a detecting unit detects a predetermined terminal's state a plurality of times during a normal operation after the activation of the testing unit.

According to another aspect of the present invention, the semiconductor memory device comprises an inactivity storing circuit for storing information that a testing unit was inactivated after the power was switched on. The inactivity storing circuit prohibits reactivation of the testing unit when the stored information is retained therein. For this reason, the testing unit is not activated twice or more after the power is switched on. Therefore, the testing unit is not activated even if a detecting unit detects a predetermined terminal's state a plurality of times during a normal operation after activation of the testing unit.

According to another aspect of the present invention, the semiconductor memory device of comprises an activity prohibiting activation of a testing unit regardless of a detection result obtained by a detecting unit. Therefore, in the case where the semiconductor memory device is delivered to a customer not requiring a connection testing mode, activation of the testing unit is always prohibited by setting the activity prohibiting circuit to a predetermined state in a manufacturing process. Furthermore, erroneous activation of the testing unit is prevented by setting a predetermined value to the activity prohibiting circuit after completion of testing by the testing unit.

According to another aspect of the semiconductor memory device of the present invention, a testing unit thereof comprises an operation circuit. Furthermore, a portion of terminals therein is used as inputting or outputting test terminals while the testing unit is kept active. The operation circuit carries out a logic operation of input patterns fed via the inputting test terminal and outputs a result of the operation as an output pattern from the outputting test terminal. Therefore, for example, by feeding the input patterns from an external controlling device or the like via the inputting test terminal and receiving the output pattern via the outputting test terminal, a connection failure can be detected for each terminal. In this manner, interconnection test can be performed without having terminals dedicated to testing. For example, interconnection test between each terminal and a circuit board can be performed when the semiconductor memory device is mounted on the circuit board.

According to another aspect of the present invention, the semiconductor memory device comprises an input/output terminal for reading and writing data from and in implemented memory elements, an extended input/output terminal used together with the input/output terminal at the time of extending a word formation of data, and a switching terminal for switching the word formation. The switching terminal is generally controlled in a normal operation, and only the input/output terminal or both the input/output terminal and the extended input/output terminal are used for reading and writing data. The input/output terminal and the extended input/output terminal serve as outputting test terminals when a testing unit is active. For this reason, the operation result by the operation circuit is output only from the input/output terminal or from the input/output terminal as well as the extended input/output terminal, depending on a state of the switching terminal. Furthermore, output patterns that are changed between the cases of extending the word formation and not extending the word formation are output from the input/output terminal. As a result, in the semiconductor memory device that can switch the word formation of data from input/output terminals by using a switching terminal, interconnection test of terminals corresponding to each word formation can be performed.

According to another aspect of the semiconductor memory device of the present invention, a testing unit inverts a portion or all of output patterns output from an extended input/output terminal at the time of extending a word formation. Therefore, without increasing a size of the testing unit, interconnection test can be performed by causing the output patterns from the input/output terminal and from the extended input/output terminal changed at the time of extending the word formation.

According to another aspect of the semiconductor memory device of the present invention, a testing unit inverts the logic of an output pattern output from an input/output terminal, by being controlled by a switching terminal. In other words, the output pattern from the input/output terminal is changed depending on a controlling state (signal level) of the switching terminal. Therefore, by confirming the output pattern, interconnection test for the switching terminal not belonging to either inputting test terminals or outputting test terminals can be performed. As a result, for example, even if the switching terminal is fixed to high level or low level on a circuit board or the like, a connection failure of the switching terminal can be found.

According to another aspect of the present invention, the semiconductor memory device comprises a conversion circuit. The conversion circuit receives parallel input patterns (testing patterns) via a plurality of input terminals at the time of testing an interconnection between each terminal and a circuit board. The conversion circuit converts the patterns into serial output patterns to be sequentially output from an output terminal. Since the parallel input patterns are converted into serial output patterns and output from the output terminal, interconnection test can be performed even when the number of output terminals is small. In the present invention, the number of output terminals does not depend on the number of input terminals, and at least one output terminal is sufficient.

Besides, using only terminals used in a normal operation, terminal connection can be performed without terminals dedicated to testing.

The output patterns (expected values) from the output terminals are the patterns that only have been converted to serial patterns from the parallel input patterns. Therefore, a user or the like performing the interconnection test can easily analyze the output patterns and identify where a connection failure exists.

The conversion circuit is configured with a simple parallel-serial conversion circuit. Therefore, a circuit area needed for interconnection test can be small and the chip size is not affected by the testing circuit.

According to another aspect of the present invention, the semiconductor memory device comprises a plurality of conversion circuits each corresponding to each of output terminals. Each of the conversion circuits converts parallel input patterns to serial output patterns. Each of the output terminals outputs the serial output pattern. As a result, parallel output patterns are output by a plurality of the output terminals and time necessary for outputting the output patterns is shortened. Therefore, time necessary for testing can also be reduced.

According to another aspect of the semiconductor memory device of the present invention, a conversion circuit is configured of a shift register serially connecting a plurality of latch circuits. Therefore, the conversion circuit can be constructed easily.

According to another aspect of the semiconductor memory device of the present invention, an operation circuit receives parallel input patterns (testing patterns) via a plurality of input terminals at the time of testing an interconnection between each terminal of the semiconductor memory device and a circuit board used in a normal operation, performs a logic operation, and outputs parallel operation result patterns. A conversion circuit receives the parallel operation result patterns from the operation circuit and converts the patterns into serial output patterns. The converted output patterns are then sequentially output from output terminals.

By performing an operation on the input patterns, the amount of data (the number of bits) of the input patterns fed to the conversion circuit can be reduced. As a result, the output patterns become shorter, and testing time is reduced. Moreover, the scale of the conversion circuit becomes smaller.

Since the parallel input patterns are converted into the serial patterns and output from the output terminals, interconnection test can be performed even if the number of the output terminals is small. The number of the output terminals does not depend on the number of the input terminals, and at least one output terminal is sufficient.

According to another aspect of the present invention, the semiconductor memory device comprises a second output terminal used in a predetermined operation mode among a plurality of normal operation modes. A pattern generating circuit sequentially receives output patterns from a conversion circuit and generates second serial output patterns different from the output patterns having been received. The second output patterns having been generated are output from the second output terminal. Therefore, in an operation mode not using the second output terminal, the interconnection test is performed by using the conversion circuit. Meanwhile, in an operation mode using the second output terminal, the interconnection test is performed by using the conversion circuit and the pattern generating circuit. The input patterns can be identical regardless of whether or not the second output terminal is used.

According to another aspect of the present invention, the circuit board mounted with the semiconductor memory device comprises a controlling circuit and connecting parts connecting terminals of the semiconductor memory device. The controlling circuit feeds a signal to a predetermined terminal of the semiconductor memory device via the connecting part and activates the testing unit. The controlling circuit feeds an input pattern to the inputting test terminal via the connecting part and receives an output pattern from the outputting test terminal. Therefore, by comparing the output pattern with expected values, interconnection test between each terminal of the semiconductor memory device and each of the connecting parts can be performed.

According to another aspect of the present invention, the circuit board mounted with the semiconductor memory device comprises terminal unit and connecting parts connecting terminals of the semiconductor memory device described above. The terminal unit is connected to the terminals of the semiconductor memory device via the connecting parts. Therefore, for example, by receiving an output pattern from the outputting test terminal after feeding a signal from the external of the circuit board to a predetermined terminal via the terminal unit and feeding an input pattern to the inputting test terminal, interconnection test between each terminal of the semiconductor memory device and each of the connecting parts can be performed.

According to another aspect of the present invention, the circuit board mounted with the semiconductor memory device comprises a controlling circuit and connecting parts interconnecting each of the terminals of the semiconductor memory device. The controlling circuit feeds parallel input patterns to the input terminals of the semiconductor memory device via the connecting parts, and receives serial output patterns sequentially from the output terminal. By comparing the output patterns with expected values, interconnection test between each of the terminals of the semiconductor memory device and each of the connecting parts can be performed.

According to another aspect of the circuit board mounted with the semiconductor memory device of the present invention, terminal unit is connected to each of terminals of the semiconductor memory device via connecting parts. Therefore, interconnection test can be performed between each of the terminals and each of the connecting parts by feeding the input patterns from the external of the circuit board to the input terminals via the terminal unit and outputting the output pattern from the output terminal to the external of the circuit board via the terminal unit.

According to another aspect of the present invention, in the method for testing interconnection between a semiconductor memory device with a circuit board, a predetermined signal is fed a plurality of times to the predetermined terminal of the above-described semiconductor memory device mounted on a circuit board, and the testing unit of the semiconductor memory device is activated. An input pattern is then fed to the inputting test terminal, and an output pattern from the outputting test terminal is received to be compared with expected values. In this manner, interconnection test between each terminal of the semiconductor memory device and the circuit board can be performed.

According to another aspect of the present invention, in the method for testing interconnection between the semiconductor memory device with the circuit board, parallel input patterns are fed to the input terminals of the semiconductor memory device. By comparing an output pattern from the output terminal with expected values prepared in advance interconnection test can be performed between each of the terminals of the semiconductor memory device and each of the connecting parts of a circuit board.

BRIEF DESCRIPTION OF THE DRAWINGS

FIG. 17 is an explanation diagram showing the expected value of the input patterns and the output patterns in the 8 bitss mode;

FIG. 18 is an explanation diagram showing the expected value of the input patterns and the output patterns in the 16-bits mode;

FIG. 32 is an explanation diagram showing a logic table of the decoder of FIG. 31;

FIG. 35 is a block diagram showing another example of he circuit board mounted with the semiconductor memory device according to the present invention.

DESCRIPTION OF THE PREDERRED EMBODIMENTS

Hereinafter, embodiments of the present invention will be explained with reference to the accompanying drawings.

Figure 2:
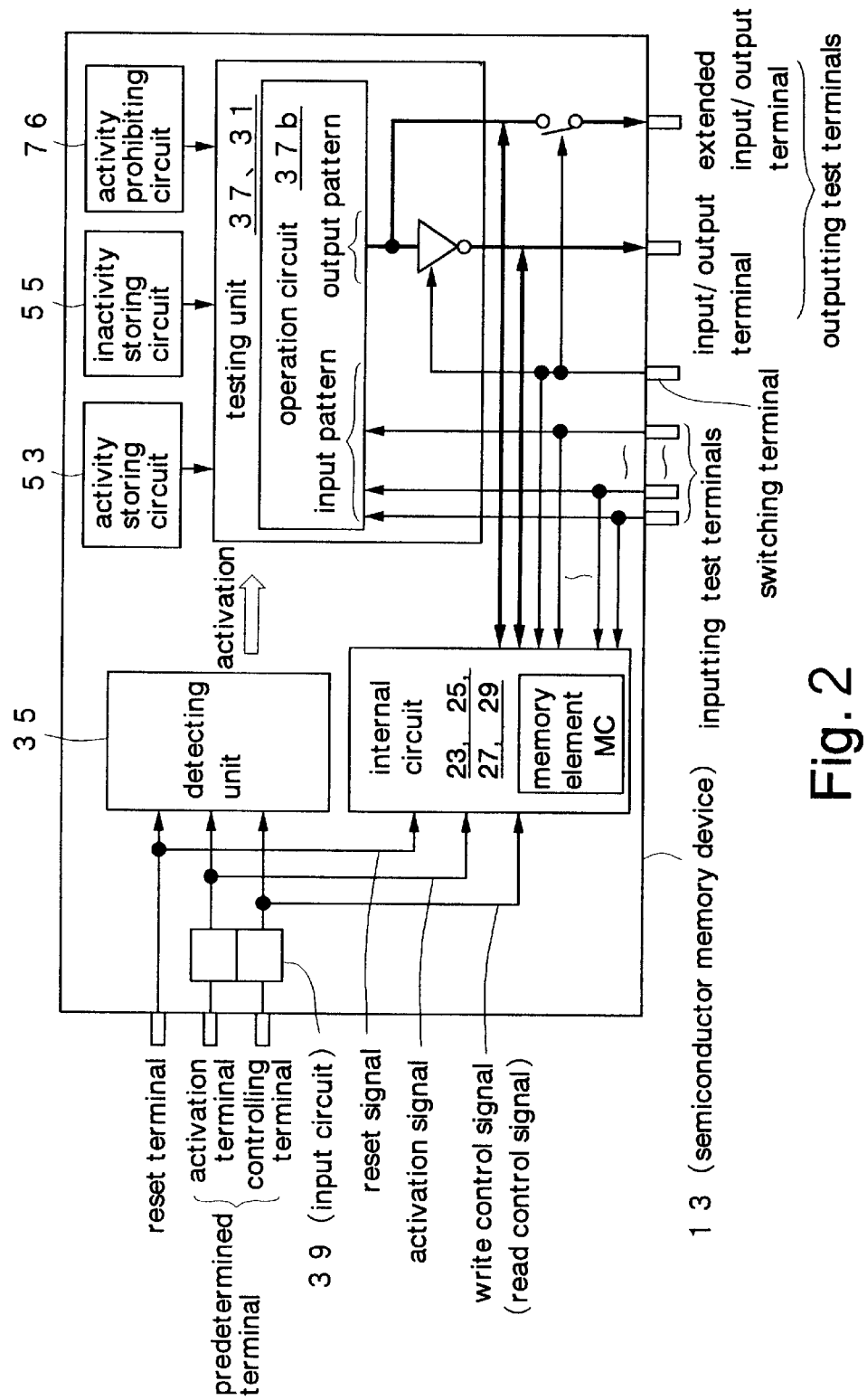
FIG. 2 is the block diagram showing a basic principle of a semiconductor memory device according to the present invention.

FIG. 2 is a block diagram showing a basic principle of the first and second embodiments of a semiconductor memory device of the present invention.

A semiconductor memory device 13 comprises a detecting unit 35, an internal circuit 23, 25, 27, and 29, a testing unit 37 and 31, an activity storing circuit 53, an inactivity storing circuit 55, and an activity prohibiting circuit 76. The testing unit marked with 37 and 31 includes an operation circuit 37b.

The detecting unit 35 detects a state of a predetermined terminal at the time a reset signal fed to a reset terminal is changed. The predetermined terminal refers to an activation terminal receiving an activation signal for activating the internal circuit, and a controlling terminal receiving a read or write control signal for accessing implemented memory elements MC, for example. The semiconductor memory device 13 further comprises input/output terminals, extended input/output terminals, and a switching terminal. The input/output terminals read and write data from and in the implemented memory element MC. The extended input/output terminals are used together with the input/output terminals at the time of extending a word formation of data. The switching terminal is used for switching the word formation. A portion of terminals of the device 13 is used as inputting or outputting test terminals when the testing unit is active.

A signal received by the predetermined terminal is transmitted to the internal circuit marked with 23, 25, 27, and 29 and to the detecting unit 35, via an input circuit 39.

The activity storing circuit 53 stores information that the testing unit 31 and 37 has been activated after the power is switched on, while the inactivity storing circuit stores information that the testing unit 31 and 37 has been inactivated after the power is switched on. The activity prohibiting circuit 76 prohibits activation of the testing unit 31 and 37, regardless of a result of detection by the detecting unit 35.

Figure 3:
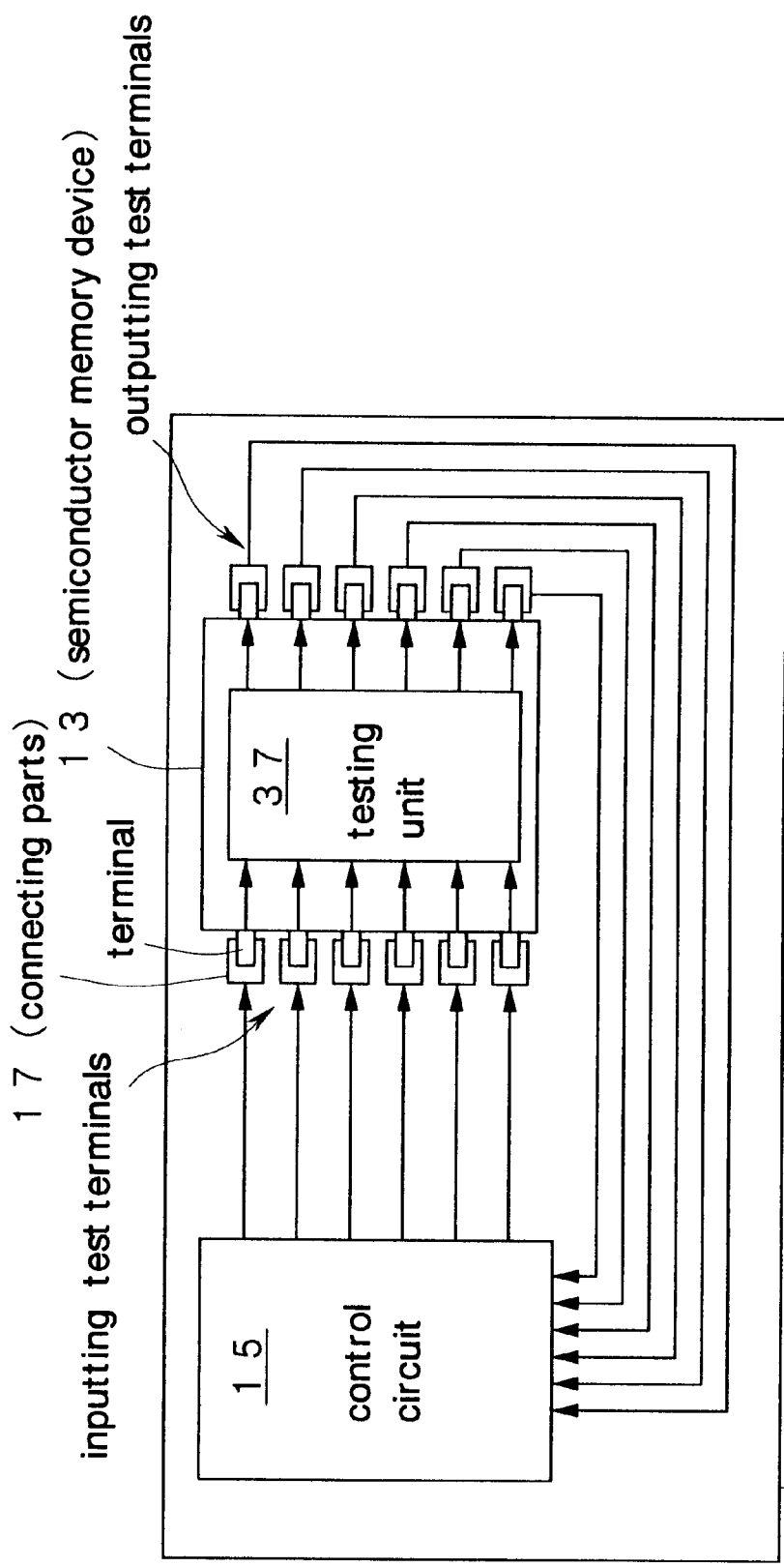
FIG. 3 is a block diagram showing a basic principle of a method for testing interconnection between a semiconductor memory device with a circuit board and a circuit board mounted with the semiconductor memory device according to the present invention.

FIG. 3 is a block diagram showing a basic principle of a method for testing interconnection between a semiconductor memory device with a circuit board a circuit board mounted with the semiconductor memory device according to the present invention.

A circuit board 11 mounted with the semiconductor memory device comprises a control circuit 15 and connecting parts 17 each connecting respective terminals of the semiconductor memory device 13. The control circuit 15 feeds an input pattern to each of the inputting test terminals via the corresponding connecting part 17, and receives an output pattern from the corresponding outputting test terminal.

Figure 4:
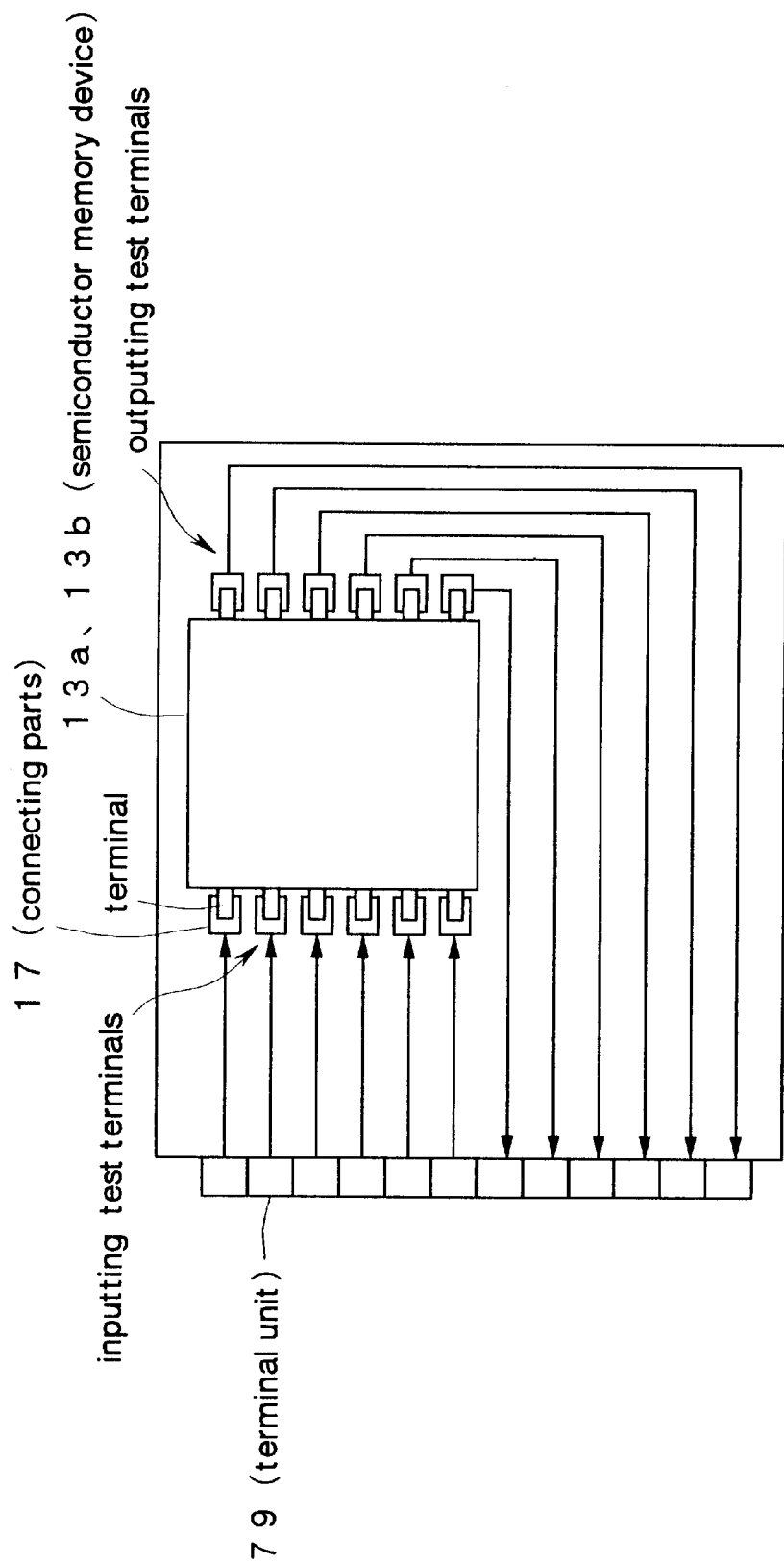
FIG. 4 is a block diagram showing another basic principle of the circuit board mounted with the semiconductor memory device of the present invention.

FIG. 4 is a block diagram showing another basic principle of the circuit board mounted with the semiconductor memory device of the present invention.

The circuit board 11 mounted with the semiconductor memory device comprises terminal unit 79 and connecting parts 17 connecting terminals of semiconductor memory devices 13a and 13b. The terminal unit 79 is connected to the terminals of the semiconductor memory devices 13a and 13b via the connecting parts 17.

Figure 5:
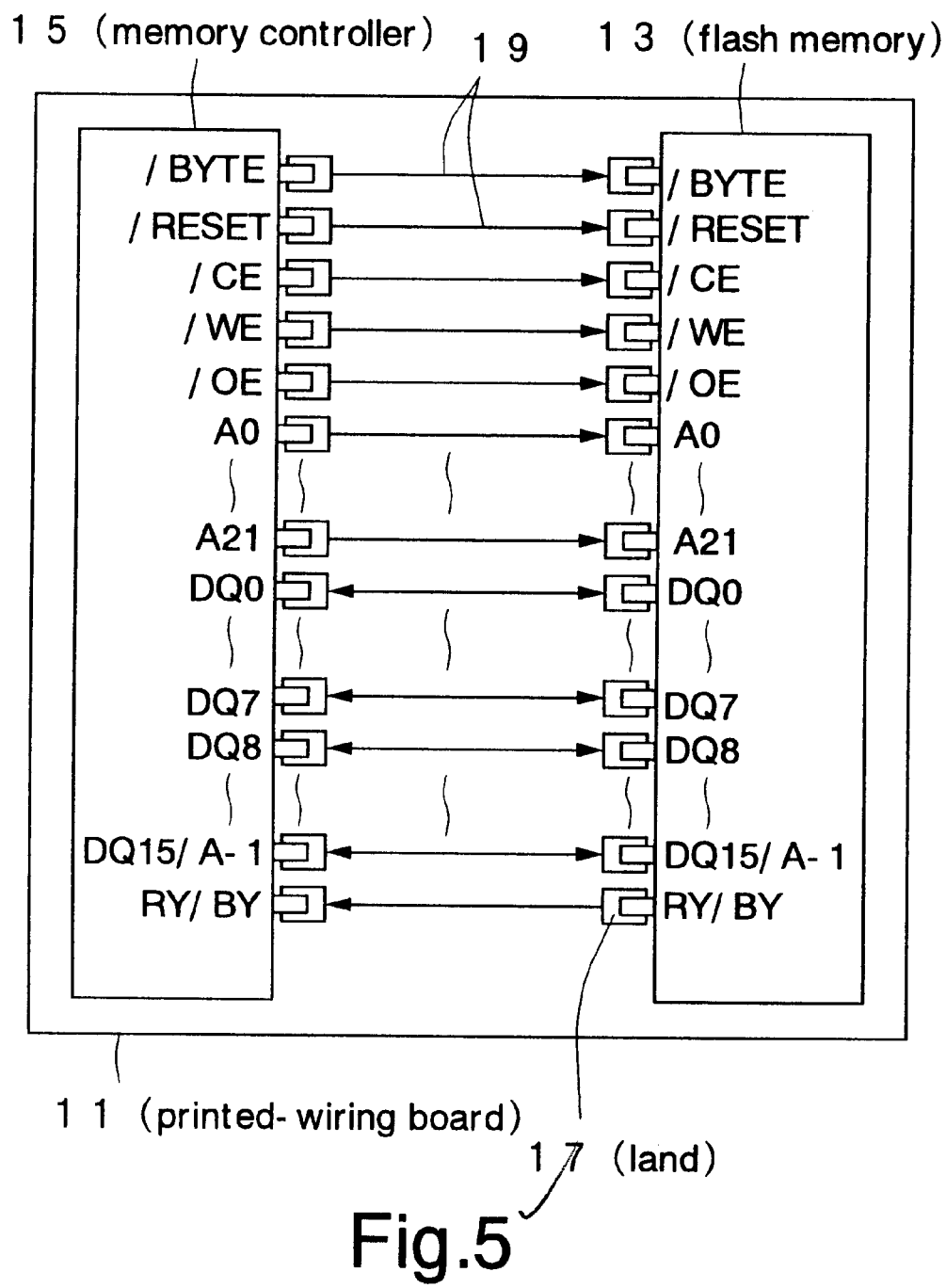
FIG. 5 is a whole configuration diagram showing the first embodiment of the semiconductor memory device, the first embodiment of the circuit board mounted with the semiconductor memory device, and the first embodiment of a method for testing interconnection between a semiconductor memory device with a circuit board.

FIG. 5 shows the first embodiment of the semiconductor memory device, the first embodiment of the circuit board mounted with the semiconductor memory device and the first embodiment of a method for testing interconnection between a semiconductor memory device with a circuit board.

In FIG. 5, a memory controller 15 and the semiconductor memory device 13 which is a 64M bits flash memory are mounted on the circuit board 11 which is a printed-wiring board. The printed-wiring board 11, the flash memory 13, and the memory controller 15 respectively correspond to the circuit board, the semiconductor memory device, and the control circuit shown in FIG. 3. Terminals of the flash memory 13 (such as a /BYTE terminal) and terminals of the memory controller 15 are soldered on lands 17 formed on the printed-wiring board 11. The lands 17 correspond to the connecting parts 17 shown in FIG. 3. The lands 17 of the flash memory 13 and the lands 17 of the memory controller 15 are connected to each other according to a wiring pattern 19 shown by arrows in FIG. 5. The directions of the arrows show the directions in which signals are fed.

The memory controller 15 is formed by a logic LSI such as a gatearray. The memory controller 15 has a control circuit for a normal operation of the flash memory 13, a control circuit for activating a SCITT decoder 37 of the flash memory 13 which will be explained later, a circuit for inputting a test input pattern to the flash memory 13, and a circuit for comparing expected values with an output pattern from the flash memory 13 in response to the input pattern.

Figure 1:
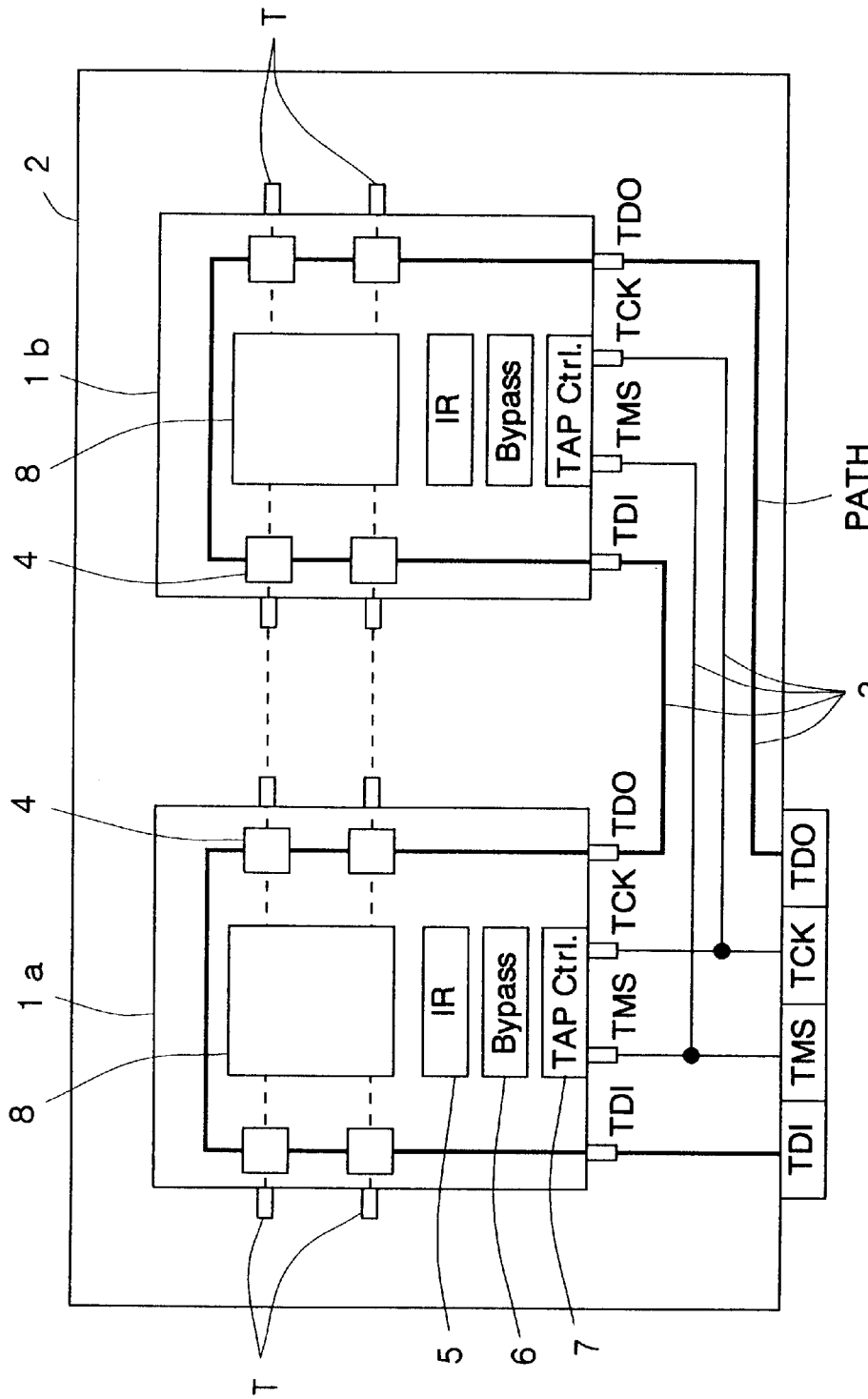
FIG. 1 is a block diagram showing the outline of the boundary scanning method in the prior art.

Alternatively, the memory controller 15 has a control circuit for a normal operation of the flash memory 13 and a control circuit for boundary scanning. In other words, a control signal for activating the SCITT decoder 37 of the flash memory 13 is fed by causing the BS cell 4 or the like shown in FIG. 1, and an input pattern for testing is fed to the flash memory 13. An output pattern in response to the input pattern is then output from the flash memory 13 to the memory controller 15.

Each of the flash memory 13 and the memory controller 15 comprises the switching terminal /BYTE, a reset terminal /RESET, a chip enable terminal /CE, a write enable terminal /WE, an output enable terminal /OE, address terminals A0–A21, data input/output terminals DQ0–DQ14, a multipurpose terminal DQ15/A-1, and a ready/busy terminal RY/BY. The chip enable terminal /CE and the write enable terminal /WE correspond to the activation terminal and the control terminal shown in FIG. 2. The data input/output terminals DQ0–DQ14 and the multipurpose terminal DQ15/A-1 of the flash memory 13 correspond to the extended input/output terminals shown in FIG. 2. The expression "/", as in /BYTE or /RESET, for example, means negative logic. That is, the terminals become active when the level of signals therein is low. The ready/busy terminal RY/BY means that the flash memory 13 is either ready or busy. The multipurpose terminal DQ15/A-1 serves as an address terminal A-1 when the switching terminal /BYTE receives a low-level signal, while serves as a data input/output terminal DQ15 when the /BYTE terminal receives a high-level signal.

The flash memory 13 has a function of switching a word formation of input/output data by using the /BYTE terminal. The flash memory 13 is in an 8 bits mode when the switching terminal /BYTE receives the low-level signal. At this time, the data input/output terminals DQ8–DQ14 in upper bits are not used. The flash memory 13 shifts to a 16 bits mode when the switching terminal /BYTE receives the high-level signal. The multipurpose terminal DQ15/A-1 serves as the data input/output terminal DQ15 and all the data input/output terminals DQ0–DQ15 in lower and upper bits are used in this case.

Figure 6:
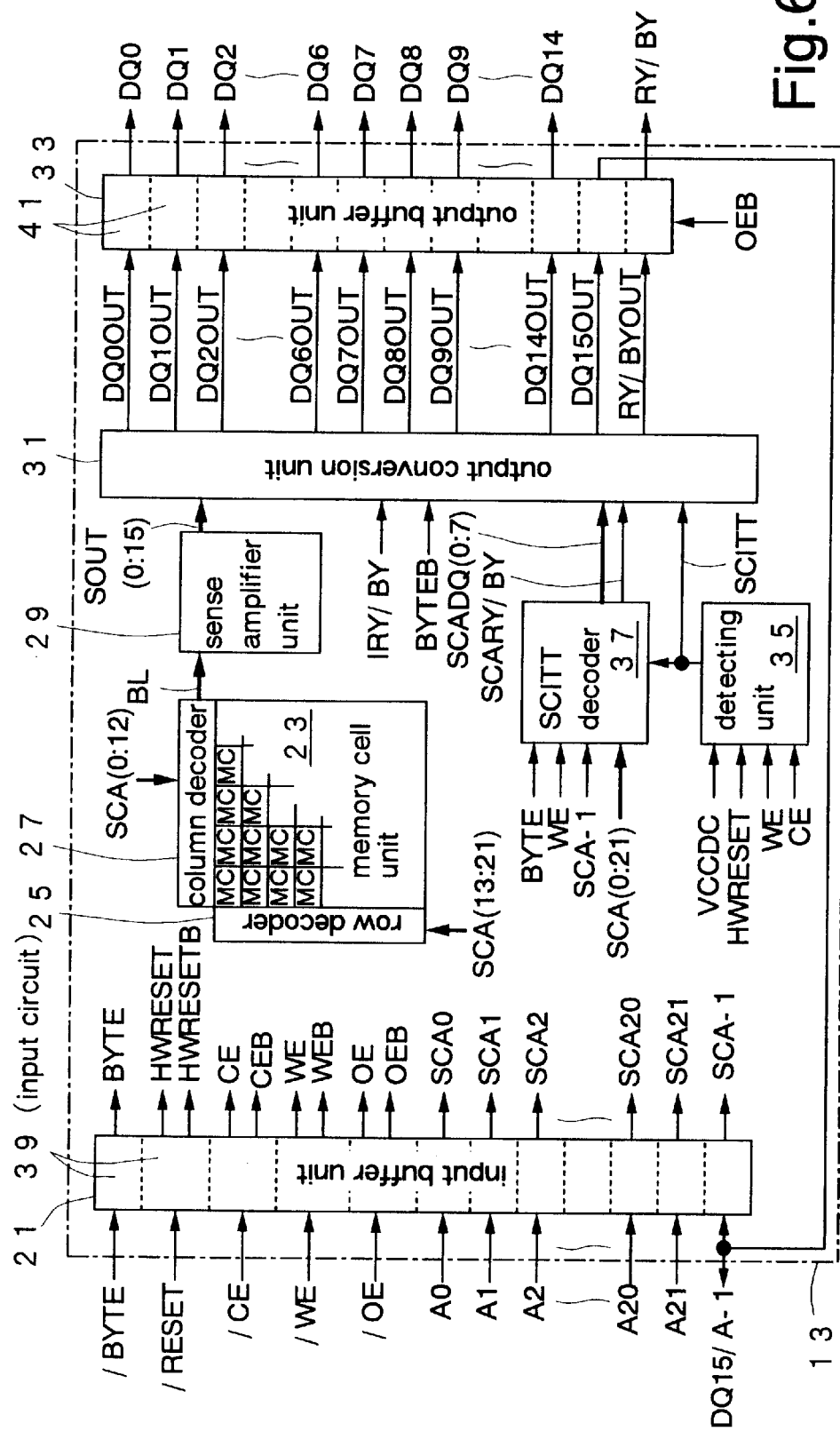
FIG. 6 is a block diagram showing an internal configuration of the flash memory of FIG. 5.

FIG. 6 is a block diagram showing an internal configuration of the flash memory 13. In the following explanation, signals fed via the terminals have the same reference codes as the terminal reference codes, such as "a reset signal /RESET". In FIG. 6, bold arrows show signal lines comprising a plurality of lines.

The flash memory 13 has an input buffer unit 21, a memory cell unit 23, a row decoder 25, a column decoder 27, a sense amplifier unit 29, an output conversion unit 31, an output buffer unit 33, a detecting unit 35, and a SCITT decoder 37. The SCITT decoder 37 and the output conversion unit 31 correspond to the testing unit shown in FIG. 2. The memory cell unit 23, the row decoder 25, the column decoder 27, and the sense amplifier 29 correspond to the internal circuit in ig. 2. Input circuits to the data input/output terminals DQ0–DQ15 and a write circuit to the memory cell 23 are not shown in FIG. 6.

The input buffer unit 21 comprises a plurality of the input circuits 39. Each of the input circuits 39 converts input signals from the memory controller 15 to internal signals and outputs the internal signal within the chip. More specifically, a switching signal /BYTE is converted into switching signals BYTE and BYTEB, and a reset signal /RESET is converted into hardware resetting signals HWRESET and HWRESETB. A chip enable signal /CE is converted into chip enable signals CE and CEB, and a write enable signal /WE is converted into write enable signals WE and WEB. An output enable signal /OE is converted into output enable signals OE and OEB, and address signals A0–A21 and A-1 are converted into address signals SCA0–SCA21 and SCA-1. The chip enable signal /CE corresponds to the activation signal shown in FIG. 2. The write enable signal/WE corresponds to the write control signal and the read control signal shown in FIG. 2. The internal signals suffixed with "B" designate signals of negative logic. Other internal signals are positive logic signals. Each of the input circuits 39 is not controlled by the reset signal /RESET. Therefore, the signals fed to the input circuits 39 are always output as the internal signals regardless of the level of the input signal /RESET.

The address signals SCA13–SCA21 are fed to the row decoder 25, while the address signals SCA0–SCA12 are fed to the column decoder 27. In the memory cell unit 23, a plurality of memory cells MC are arranged vertically and horizontally. The memory cells MC correspond to the memory elements shown in FIG. 2. The row decoder 25 and the column decoder 27 are circuits for selecting a memory cell in row direction and in column direction, respectively. A signal output from the selected memory cell MC is output to the sense amplifier 29 via the column decoder 27 and a bit line BL. The sense amplifier 29 amplifies a weak signal output from the memory cell MC and outputs the amplified signal as data output signals SOUT0–15. The output conversion unit 31 receives the data output signals SOUT0–15, an internal ready/busy signal IRY/BY, the switching signal BYTEB, operation result signals SCADQ0–SCADQ7 and SCARY/BY, and a testing mode signal SCITT, and outputs output signals DQ0OUT–DQ15OUT and RY/BYOUT to the output buffer 33.

The output buffer 33 comprises a plurality of output circuits 41. The output circuits 41 receive the output signal DQ0OUT–DQ15OUT and RY/BYOUT, and output corresponding data input/output signals DQ0–DQ15 and the ready/busy signal RY/BY to the external thereof. The output buffer 33 is controlled by the output enable signal OEB and the signals from the output buffer 33 are output only when the output enable signal is low level.

The detecting unit 35 receives a power-on signal VCCDC, the hardware resetting signal HWRESET, the write enable signal WE, and the chip enable signal CE, and outputs the testing mode signal SCITT.

The SCITT decoder 37 receives the switching signal BYTE, the write enable signal WE, and the address signals SCA0–SCA21 and SCA-1, and outputs the operation result signals SCADQ0–SCADQ7 and SCARY/BY.

For the sake of easier understanding of the following explanation, the names of the signals may be omitted, such as the "RESET signal" meaning the "reset signal RESET", the "WE signal" meaning the "write enable signal WE", and the "CE signal" meaning the "chip enable signal CE".

Figure 7:
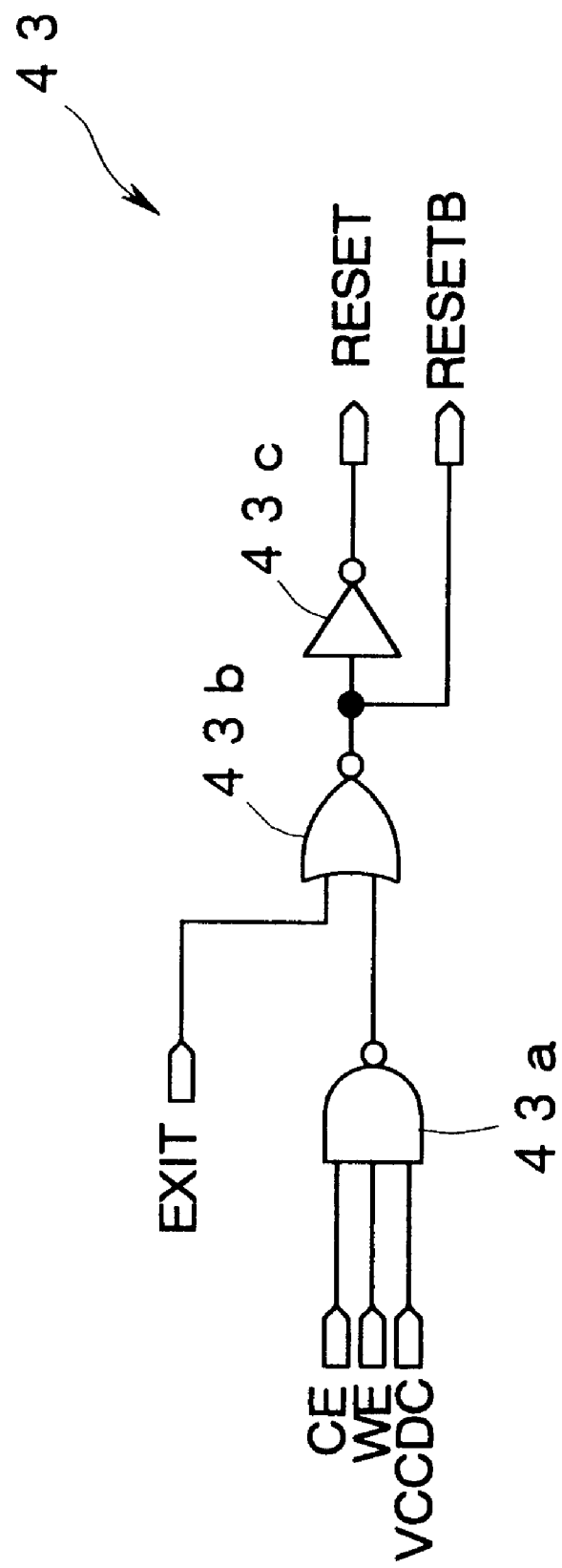
FIG. 7 is a circuit diagram showing a reset generation circuit of the detecting unit of FIG. 6.
Figure 8:
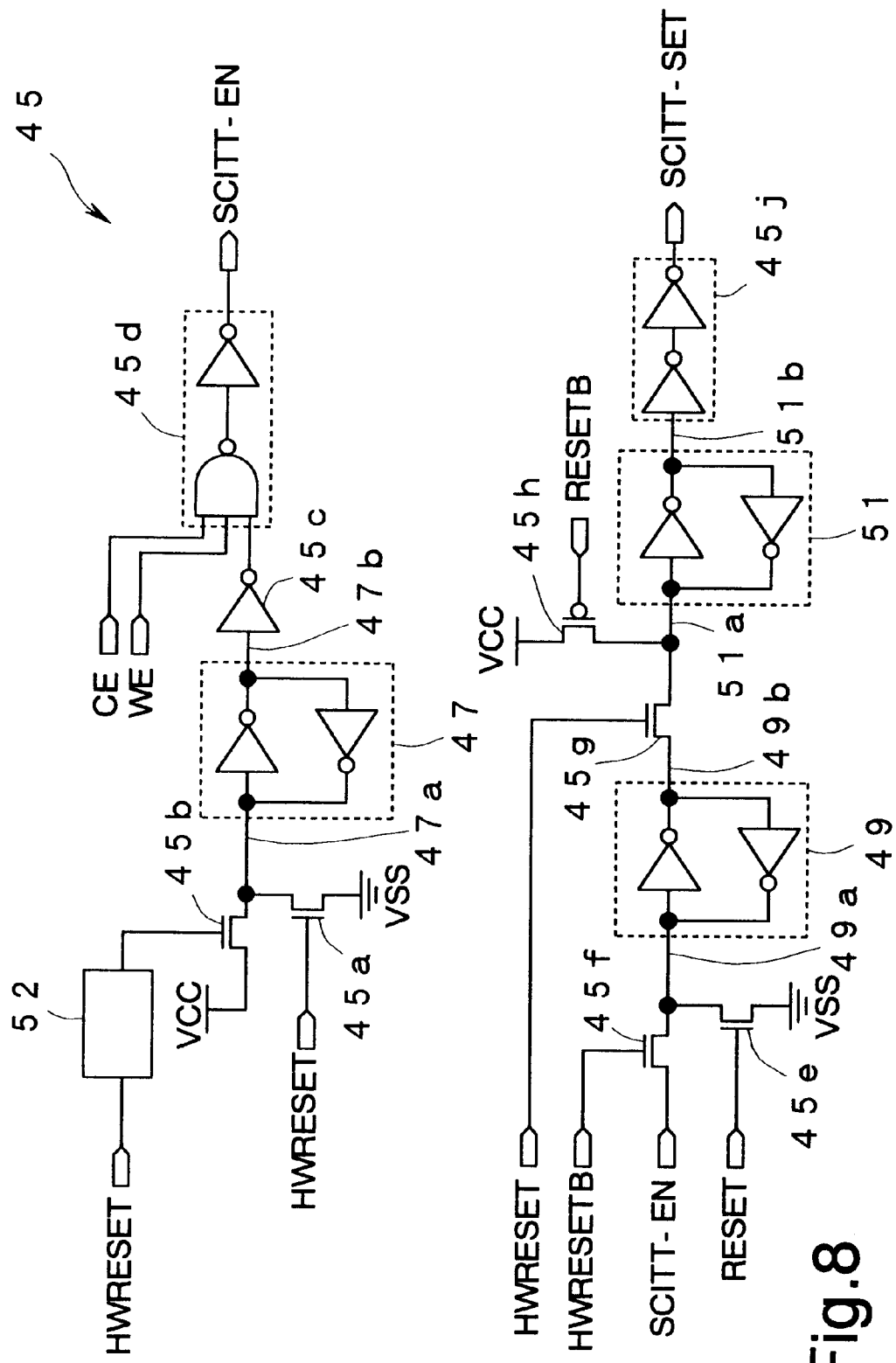
FIG. 8 is a circuit diagram showing an initialization circuit of the detecting unit of FIG. 6.
Figure 9:
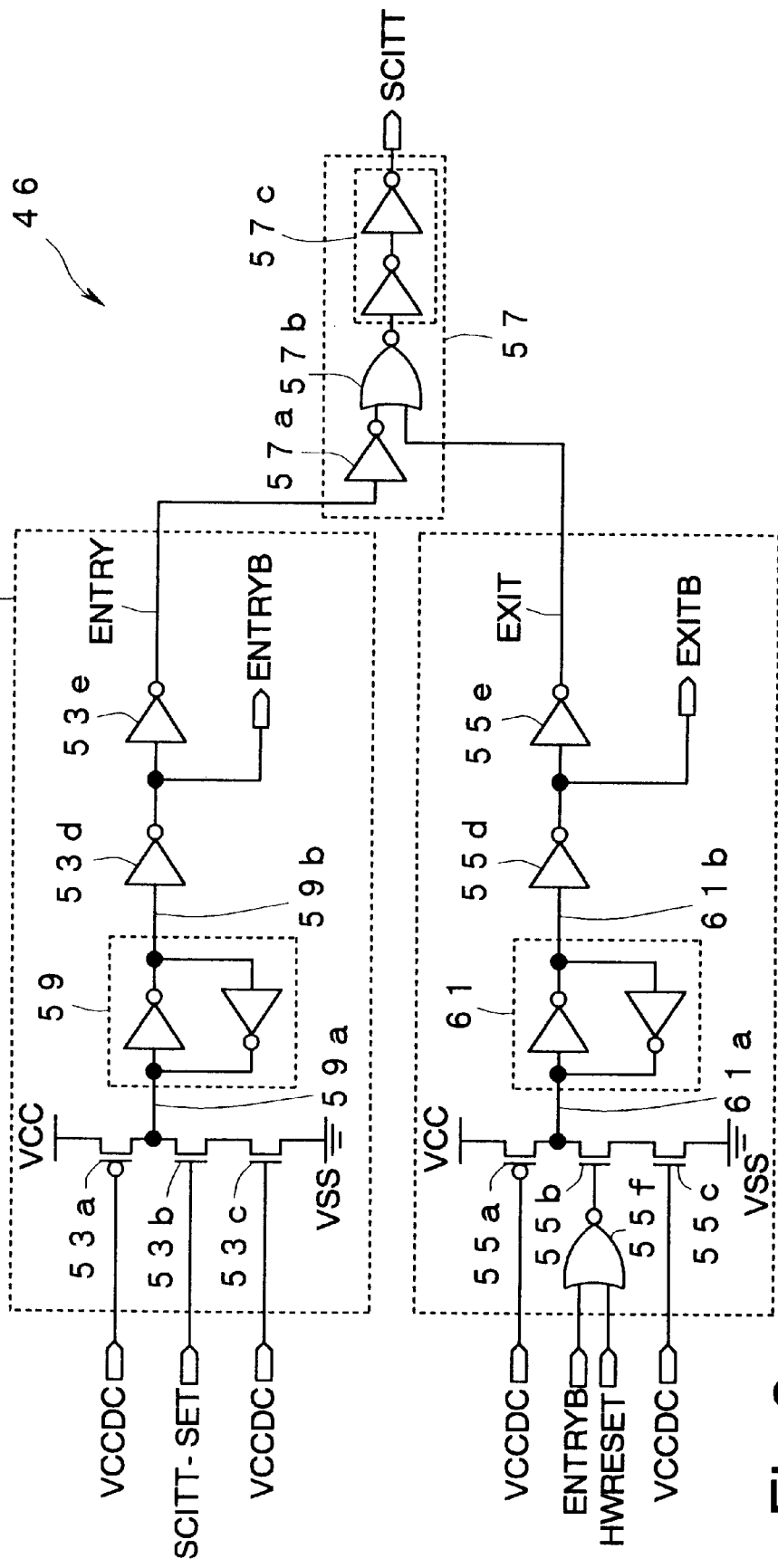
FIG. 9 is a circuit diagram showing a testing mode occurring circuit of the detecting unit of FIG. 6.

FIGS. 7 through 9 show details of the detecting unit 35. The detecting unit 35 comprises a reset generation circuit 43, an initialization circuit 45, and a testing mode occurring circuit 46.

As shown in FIG. 7, the reset generation circuit 43 comprises a 3-input NAND gate 43a, a 2-input NOR gate 43b, and an inverter 43c connected in series. Inputs of the NAND gate 43a receive the CE signal, the WE signal, and the VCCDC signal. An output of the NAND gate 43a is connected to one of the inputs of the NOR gate 43b. The other input of the NOR gate 43b receives an exit signal EXIT which will be explained later. The NOR gate 43b outputs the reset signal RESETB. The inverter 43c receives the reset signal RESETB and outputs the reset signal RESET.

As shown in FIG. 8, the initialization circuit 45 comprises a first latch 47, a second latch 49, and a third latch 51 in each of which an input and an output of two inverters are connected to each other.

A drain of an nMOS 45a and a source of an nMOS 45b are connected to an input 47a of the first latch 47. A source of the nMOS 45a is connected to a ground line VSS and a drain of the nMOS 45b is connected to a power supply line VCC. A gate electrode of the nMOS 45a receives the HWRESET signal. An output of a reset pulse generator 52 is connected to a gate electrode of the nMOS 45b. The reset pulse generator 52 receives the HWRESET signal. The reset pulse generator 52 is a circuit for outputting a positive pulse when the /RESET signal changes from low level to high level. An output 47b of the first latch 47 is connected to the inverter 45c. An output of the inverter 45c is connected to an input of a 3-input AND circuit 45d. Other inputs of the AND circuit 45d receive the CE signal and the WE signal. The AND circuit 45d outputs a testing mode enable signal SCITT-EN. The CE signal and the WE signal are used as signals whose levels are detected for a shift to a connection testing mode which will be explained later.

A drain of an nMOS 45e and a source of an nMOS 45f are connected to an input 49a of the second latch 49. A source of the nMOS 45e is connected to the ground line VSS. A gate electrode of the nMOS 45e receives the RESET signal. A drain of the nMOS 45f receives the SCITT-EN signal. A gate electrode of the nMOS 45f receives the HWRESETB signal. An output 49b of the second latch 49 is connected to an input 51a of the third latch 51 via an nMOS 45g. A gate electrode of the nMOS 45g receives the HWRESET signal.

A drain of a pMOS 45h is connected to the input 51a of the third latch 51. A source of a pMOS 45h is connected to the power supply line VCC. A gate electrode of the PMOS 45h receives the RESETB signal. An output 51b of the third latch 51 is connected to an input of an inverter row 45j in which 2 inverters are connected in series. The inverter row 45j outputs a testing mode setting signal SCITT-SET.

The testing mode occurring circuit 46 comprises an activity storing circuit 53, an inactivity storing circuit 55, and a combinational circuit 57, as shown in FIG. 9.

The activity storing circuit 53 comprises a pMOS 53a, nMOSes 53b and 53c connected serially, an entry latch 59 connecting an input and an output of two inverters, and two inverters 53d and 53e connected serially. A source of the pMOS 53a is connected to the power supply line VCC. A source of the nMOS 53c is connected to the ground line VSS. Gate electrodes of the pMOS 53a and the nMOS 53c receive the VCCDC signal. A gate electrode of the nMOS 53b receives the SCITT-SET signal. Drains of the pMOS 53a and the nMOS 53b are connected to an input 59a of the entry latch 59. An output of the entry latch 59 is connected to an input of the inverter 53d. Inverters 53d and 53e output the entry signals ENTRYB and ENTRY, respectively.

The inactivity storing circuit 55 comprises a pMOS 55a, nMOSes 55b and 55c connected serially, an exit latch 61 connecting an input and an output of two inverters, and two inverters 55d and 55e connected serially. A source of the pMOS 55a is connected to the power supply line VCC. A source of the nMOS 55c is connected to the ground line VSS. Gate electrodes of the pMOS 55a and the nMOS 55c receive the VCCDC signal. An output of a 2-input NOR gate 55f is connected to a gate electrode of the nMOS 55b. An input of the NOR gate 55f receives the ENTRYB signal and the HWRESET signal. Drains of the pMOS 55a and the nMOS 55b are connected to an input 61a of the exit latch 61. An output of the exit latch 61 is connected to an input of the inverter 55d. The inverters 55d and 55e output an entry signal EXITB and the entry signal EXIT, respectively.

The combinational circuit 57 comprises an inverter 57a, a 2-input NOR gate 57b, and an inverter row 57c connecting two inverters serially. An input of the inverter 57a receives the ENTRY signal. An output of the inverter 57a is connected to one of inputs of the NOR gate 57b. The other input of the NOR gate 57b receives the EXIT signal. An output of the NOR gate 57b is connected to an input of the inverter row 57c. The inverter row 57c outputs the testing mode signal SCITT.

Figure 10:
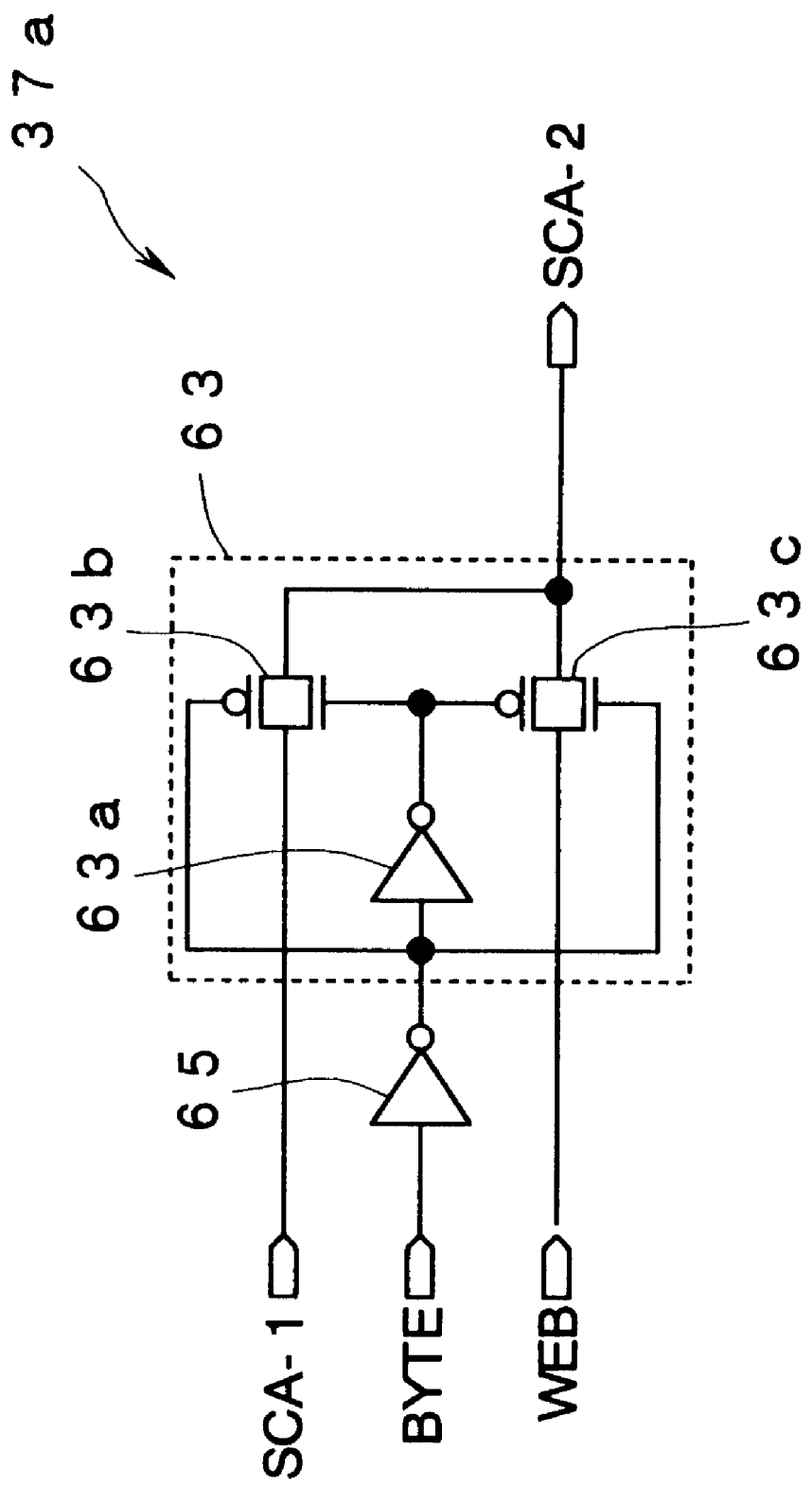
FIG. 10 is a circuit diagram showing a conversion circuit.
Figure 11:
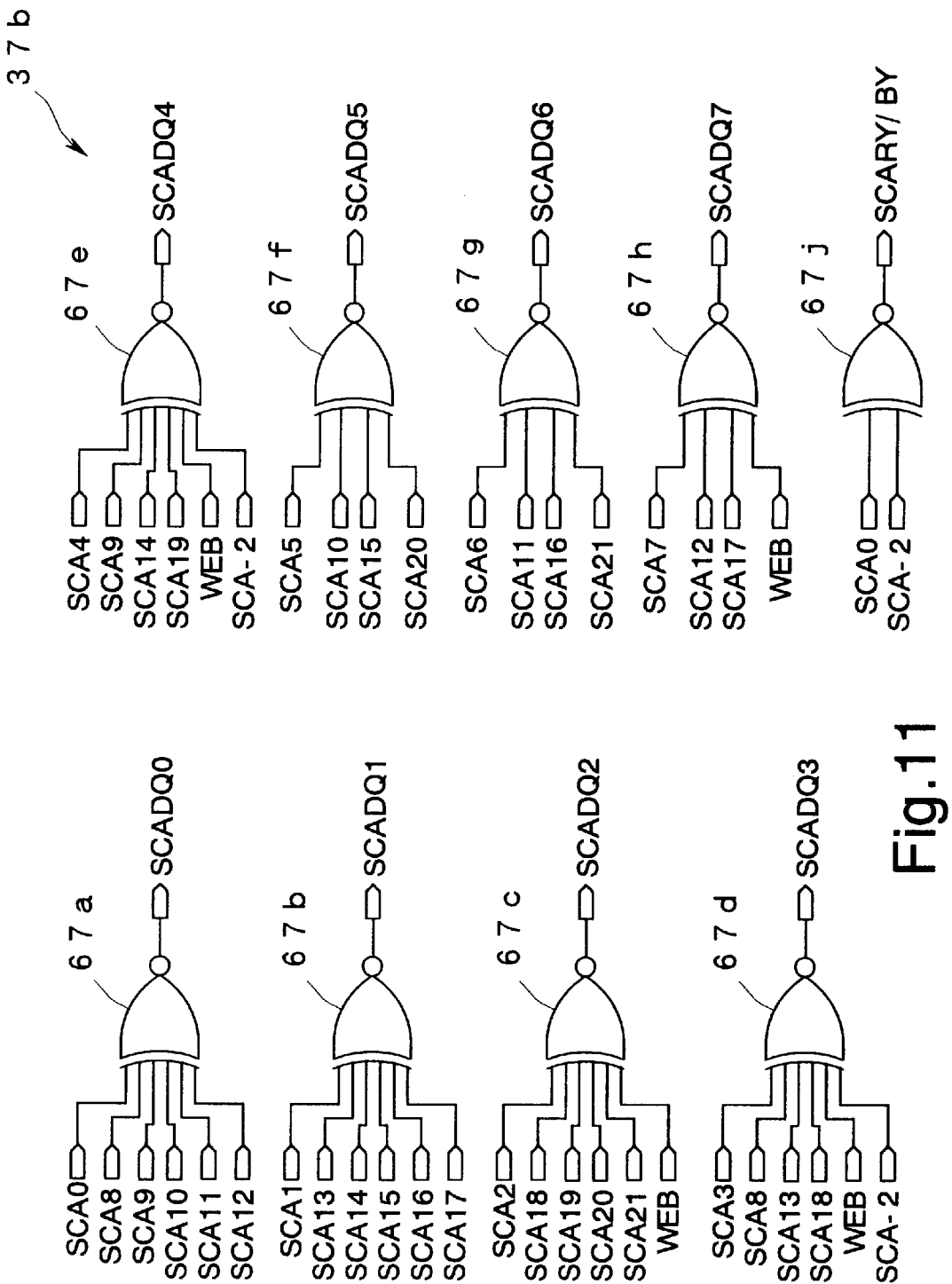
FIG. 11 is a circuit diagram showing an operation circuit.

FIGS. 10 and 11 show details of the SCITT decoder 37. The SCITT decoder 37 has a conversion circuit 37a and an operation circuit 37b. In the 16 bits mode in which the number of output terminals increases while the number of input terminals decreases, the conversion circuit 37a feeds a common signal (WEB signal) to different inputs of the operation circuit 37b. The operation circuit 37b carries out an operation on input patterns fed from the memory controller 15, and outputs an output pattern.

The conversion circuit 37a comprises an inverter 63 and CMOS transmission gates 63b and 63c each connecting a source and a drain of a PMOS and an nMOS, as shown in FIG. 10. An input of the inverter 63a, a gate electrode of the PMOS of the CMOS transmission gate 63b, and a gate electrode of the nMOS of the CMOS transmission gate 63c receive the BYTE signal via an inverter 65. An output of the inverter 63a is connected to gate electrodes of the nMOS and the pMOS of the CMOS transmission gates 63b and 63c, respectively. An input of the CMOS transmission gate 63b receives the address signal SCA-1. An input of the CMOS transmission gate 63c receives the WEB signal. Outputs of the MOS switches 63b and 63c are connected to each other, and output a signal SCA-2 for decoding. The conversion circuit 37a enables using the operation circuit 37b both in the 8 bits mode and in the 16 bits mode.

As shown in FIG. 11, the operation circuit 37b has 6-input XNOR gates 67a, 67b, 67c, 67d, and 67e, 4-input XNOR gates 67f, 67g, and 67h, and a 2-input XNOR gate 67j. Each of the XNOR gates is an exclusive NOR circuit. The XNOR gate 67a receives the address signals SCA0 and SCA8–SCA12, and outputs an operation result as the decoding signal SCADQ0. The XNOR gate 67b receives the address signals SCAL and SCA13–SCA17, and outputs the decoding signal SCADQ1. The XNOR gate 67c receives the address signals SCA2 and SCA18–SCA21, and the WEB signal, and outputs the decoding signal SCADQ2. The XNOR gate 67d receives the address signals SCA3, SCA8, SCA13, and SCA18, the WEB signal, and the SCA-2 signal, and outputs the decoding signal SCADQ3. The XNOR gate 67e receives the address signals SCA4, SCA9, SCA14, and SCA19, the WEB signal, and the SCA2 signal, and outputs the decoding signal SCADQ4. The XNOR gate 67f receives the address signals SCA5, SCA10, SCA15, and SCA20, and outputs the decoding signal SCADQ5. The XNOR gate 67g receives the address signals SCA6, SCA11, SCA16, and SCA21, and outputs the decoding signal SCADQ6. The XNOR gate 67h receives the address signals SCA7, SCA12, and SCA17, and the WEB signal, and outputs the decoding signal SCADQ7. The XNOR gate 67j receives the address signals SCA0 and the SCA-2 signal, and outputs the decoding signal SCARY/BY. The operation circuit 37b is activated only when the testing mode signal SCITT is high level.

Figure 12:
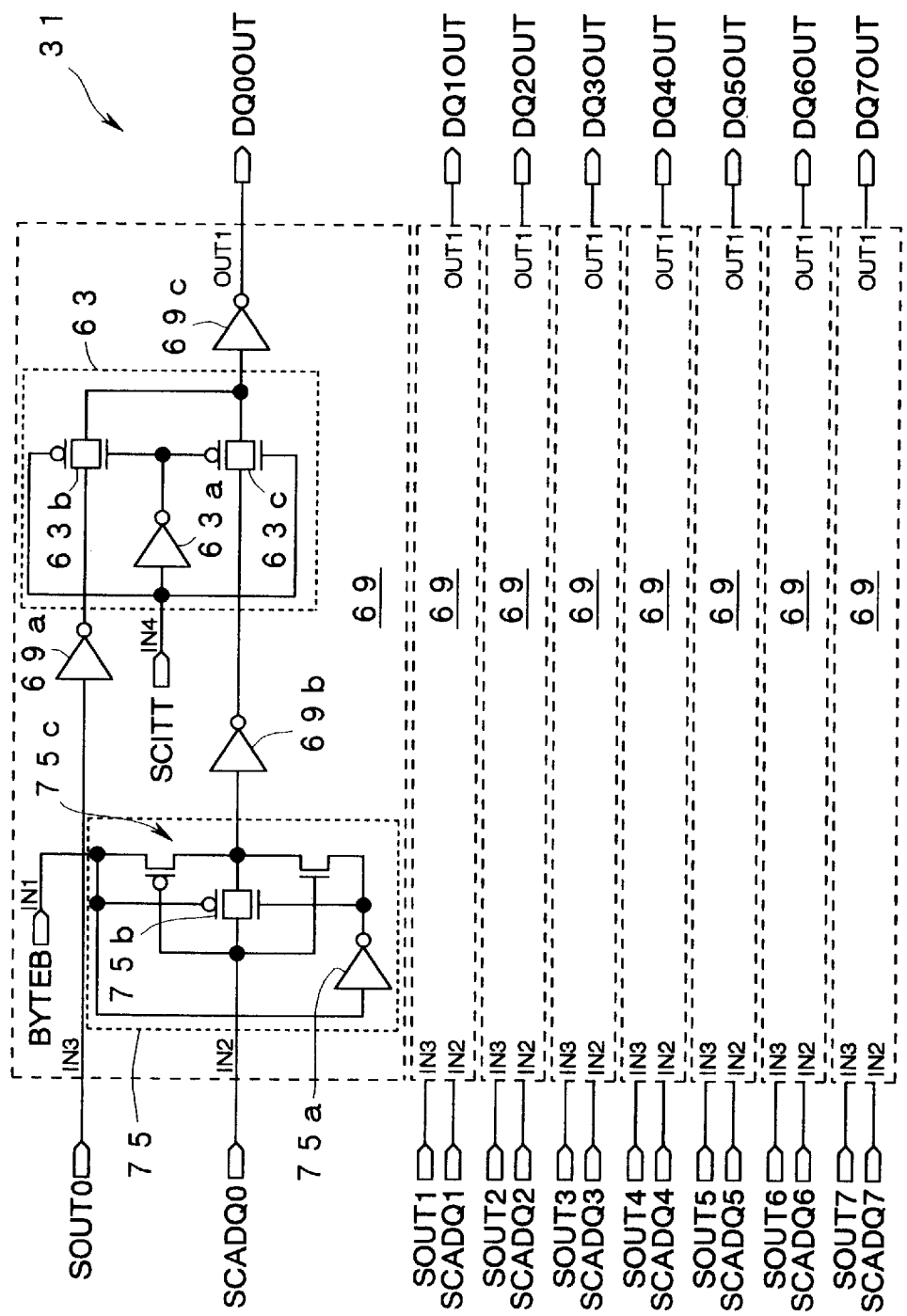
FIG. 12 is a circuit diagram showing an output conversion circuit.
Figure 13:
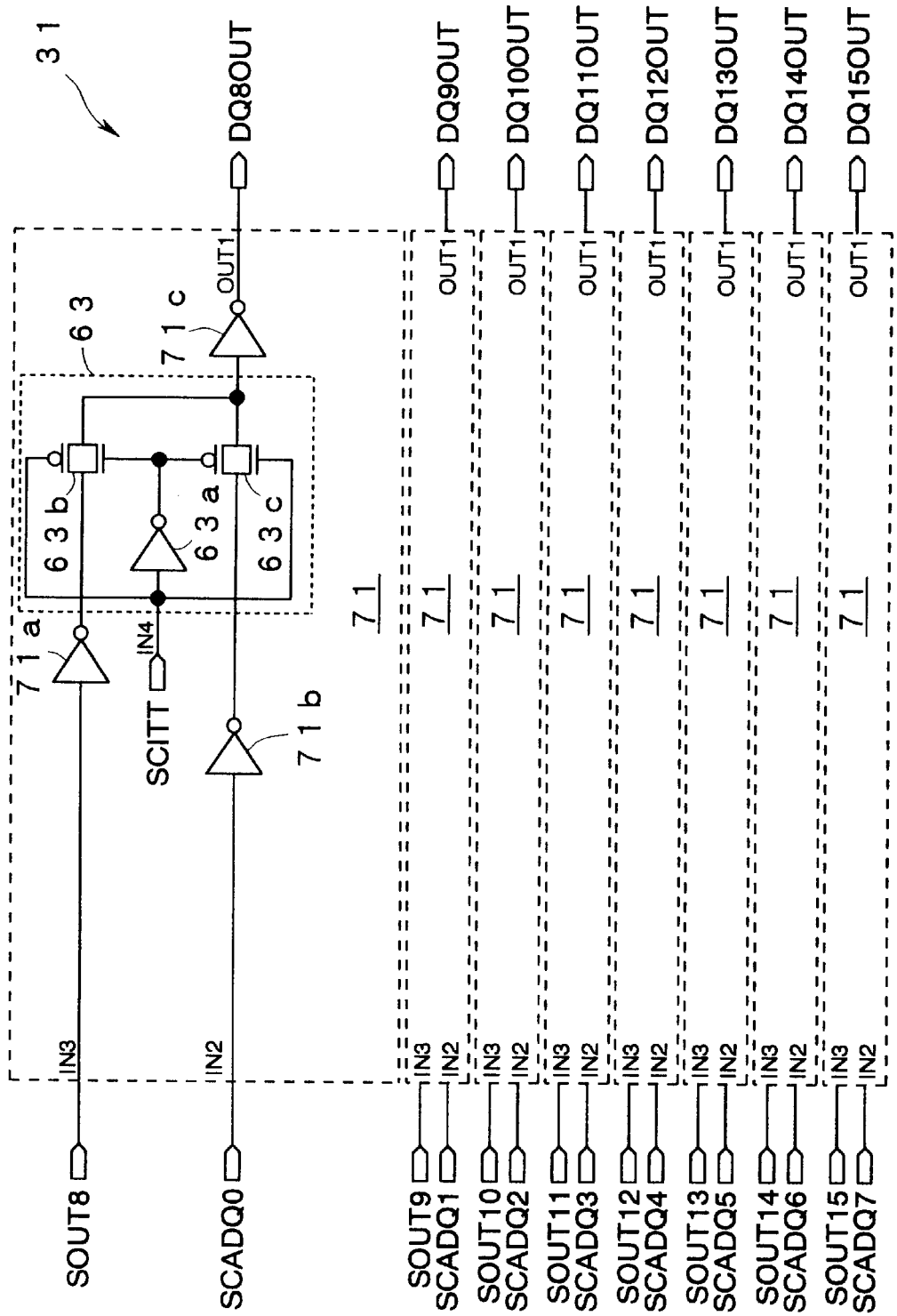
FIG. 13 is a circuit diagram showing an output conversion circuit.
Figure 14:
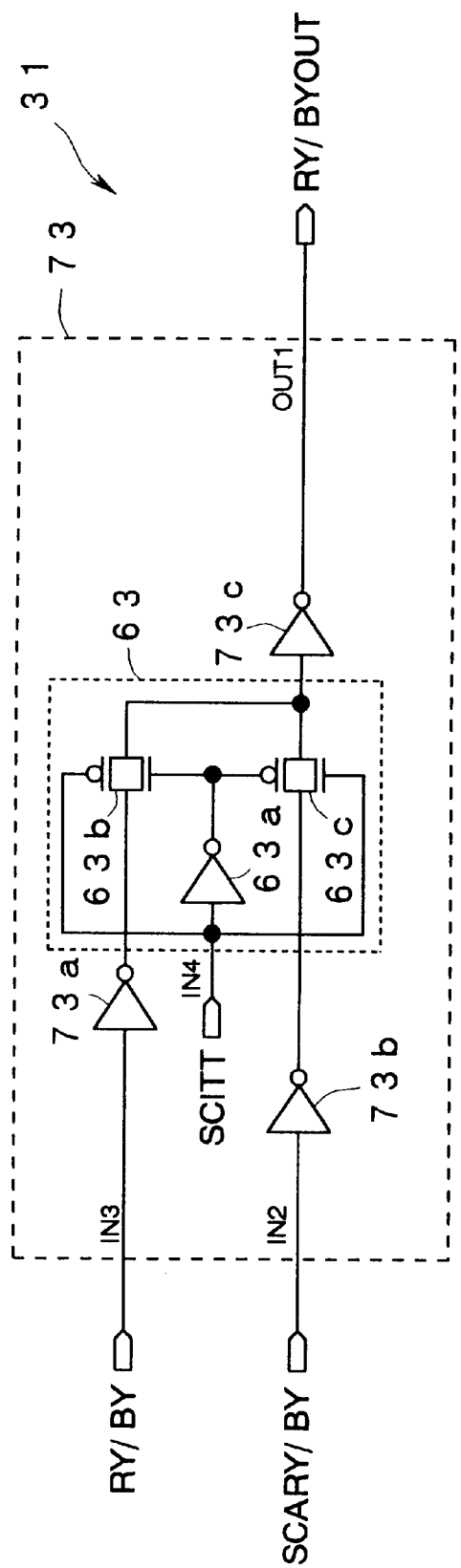
FIG. 14 is a circuit diagram showing an output conversion circuit.

FIGS. 12 through 14 show details of the output conversion unit 31. The output conversion unit 31 has a function to convert the data input/output terminals DQ0–DQ15 and the ready/busy terminal RY/BY into the outputting test terminals in the connection testing mode which will be explained later. The outputting test terminals are terminals for outputting output patterns generated by the operation circuit 37b to the external thereof, in the connection testing mode. The output conversion unit 31 has three output conversion circuits 69, 71, and 73 in accordance with the kind of the outputting test terminals.

The output conversion circuits 69 shown in FIG. 12 are circuits for outputting the data output signals SOUT0–SOUT7 corresponding to the data input/output signals DQ0–DQ7. Each of the conversion circuits 69 comprises an inverting circuit 75, three inverters 69a, 69b, and 69c, and the conversion circuit 63 shown in FIG. 10. The inverting circuit 75 comprises an inverter 75a, aMOS switch 75b, and a CMOS inverter 75c. An input terminal IN1 is connected to a source of a pMOS of the CMOS inverter 75c, a gate electrode of a PMOS of the MOS switch 75b, and an input of the inverter 75a. An output of the inverter 75a is connected to a source of an nMOS of the CMOS inverter 75c and a gate electrode of an nMOS of the MOS switch 75b. An input terminal IN2 is connected to an input of the MOS switch 75b and an input of the CMOS inverter 75c. An output of the MOS switch 75b and an output of the CMOS inverter 75c are connected to each other. These outputs are connected to an input of the MOS switch 63c of the conversion circuit 63, via the inverter 69b. An input of the MOS switch 63b of the conversion circuit 63 is connected to an output of the inverter 69a. An input terminal IN3 is connected to an input of the inverter 69a. An output of the conversion circuit 63 is connected to an output terminal OUT1 via the inverter 69c.

The input terminals IN1 and IN4 of the conversion circuits 69 receive the BYTEB signal and the SCITT signal. The input terminals IN2 and IN3 of the conversion circuits 69 respectively receive the decoding signal SCADQ0–SCADQ7, and the data output signal SOUT0–SOUT7, in response to each bit of the data input/output signals DQ0–DQ7. Likewise, an output terminal OUT1 of each of the conversion circuits 69 outputs the output signal DQ0OUT–DQ70UT corresponding to each bit of the data input/output signals DQ0–DQ7.

The output conversion circuits 71 shown in FIG. 13 are circuits for outputting data output signals SOUT8–SOUT15 corresponding to the data input/output signals DQ8–DQ15. The conversion circuits 71 have the same configuration as the output conversion circuits 69 shown in FIG. 12 except for the inverting circuit 75 not existing in the conversion circuits 71. In other words, the input terminal IN2 is connected directly to the input of the MOS switch 63c of the conversion circuit 63 via an inverter 71b.

The input terminal IN4 of each of the conversion circuits 71 receives the SCITT signal. The input terminals IN2 of the conversion circuits 71 receive the decoding signals SCADQ0–SCADQ7 each corresponding to a number resulted from subtraction of 8 from each bit of the data input/output signals DQ8–DQ15. The input terminals IN3 of the output conversion circuits 71 receive the data output signals SOUT8–SOUT15 each corresponding to each bit of the data input/output signals DQ8–DQ15. Likewise, the output terminals OUT1 of the conversion circuits 69 output the output signals DQ8OUT–DQ15OUT each corresponding to each bit of the data input/output signals DQ8–DQ15.

The output conversion circuit 73 shown in FIG. 14 is the same as the output conversion circuit 71 shown in FIG. 13. The input terminals IN2, IN3, and IN4 receive the SCARY/BY signal, the IRY/BY signal, and the SCITT signal, respectively. The output terminal OUT1 outputs the output signal RY/BYOUT.

An interconnection testing is carried out in the following manner between each of the terminals of the flash memory 13 and each of the lands 17 of the printed-wiring board 11 mounted with the flash memory 13 and the memory controller 15.

At the time the power is switched on, the flash memory 13 shifts to the connection testing mode in response to the control by the memory controller 15.

Figure 15:
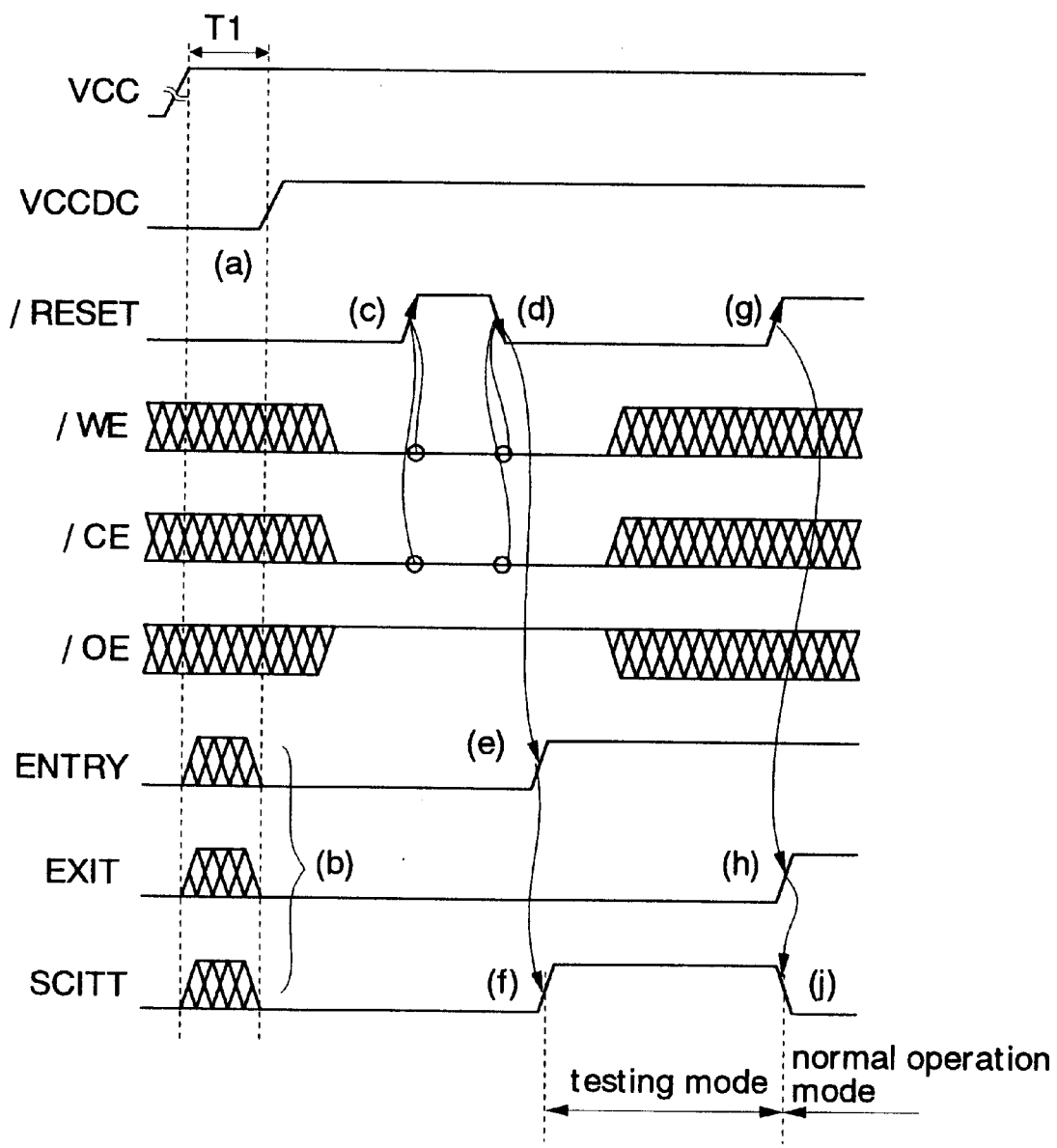
FIG. 15 is a timing chart showing a control of the connection testing mode.

FIG. 15 shows timings of main signals when the flash memory 13 shifts to the connection testing mode and then returns to a normal operation.

After the power is ON, the voltage of the power supply line VCC increases to a predetermined value. At this time, the memory controller 15 outputs the low-level /RESET signal (FIG. 15(a)). The VCCDC signal becomes high level, lagging Ti behind the time of voltage increase of the power supply line VCC. The HWRESET signal shown in FIG. 8 becomes high level due to the low-level /RESET signal. The nMOS 45a becomes ON, and the output 47b of the first latch 47 becomes high level. The testing mode enable signal SCITT-EN becomes low level due to the output 47b becoming high level. While the VCCDC signal is low level, the RESET signal and the RESETB signal shown in FIG. 7 are kept high level and low level, respectively. Therefore, the nMOS 45e shown in FIG. 8 becomes ON, and the output 49b of the second latch 49 becomes high. The HWRESETB signal becomes low level due to the low-level /RESET signal, and the nMOS 45f becomes OFF. The PMOS 45h becomes ON, and the output 51b of the third latch 51 becomes low level. The testing mode setting signal SCITT-SET becomes low level due to the output 51b becoming low level.

In the activity storing circuit 53 shown in FIG. 9, the PMOS 53a becomes ON while the VCCDC signal is low level, and the output 59b of the entry latch 59 becomes low level. By the low level of the entry latch 59, the ENTRYB and the ENTRY signals become high level and low level, respectively. By the high level of the ENTRY signal, the testing mode signal becomes low level (FIG. 15(b)).

Meanwhile, in the inactivity storing circuit 55 shown in FIG. 9, the pMOS 55a becomes ON and the output 61b of the exit latch 61 becomes low level while the VCCDC signal is low level. The entry latch 61 latches the low-level output, and the EXITB signal and the EXIT signal become high level and low level, respectively (FIG. 15(b)).

The VCCDC signal does not become low level except for the time the power becomes ON. Therefore, a high-level signal is not provided thereafter to the input 59a of the entry latch 59 and the input 61a of the exit latch 61. In other words, the output 59b of the entry latch 59 and the output 61b of the exit latch 61 will not change to low level again once the both change to high level.

The memory controller 15 outputs the low-level /WE and /CE signals. The RESET and the RESETB signals in FIG. 7 become low level and high level respectively, due to the low-level /WE and /CE signals. Therefore, the nMOS 45e and the PMOS 45h shown in FIG. 8 become OFF.

The memory controller 15 changes the /RESET signal to high level while outputting the low-level /WE and /CE signals (FIG. 15(c)). The HWRESET signal and the HWRESETB signal shown in FIG. 8 become low level and high level respectively, due to the high-level /RESET signal. The nMOS 45a becomes OFF due to the low-level HWRESET signal. The reset pulse generator 52 feeds a positive pulse to the gate electrode of the nMOS 45b. The nMOS 45b is kept ON for a predetermined period, and the output 47b of the first latch 47 becomes low level. Since both the CE and WE signals are high level, the testing mode enable signal SCITT-EN becomes high level due to the low-level output 47b. In other words, at a rising edge of the /RESET signal, detection of the low level of the /CE and /WE signals is performed (a first time).

The nMOS 45f becomes ON due to the high-level HWRESETB signal. Therefore, the high-level state of the SCITT-EN signal is transmitted to the second latch 49. The output 49b of the second latch 49 becomes low level. Since the nMOS 45g is OFF due to the low-level HWRESET signal, the low level of the output 49b of the second latch 49 is not transmitted to the third latch 51. In other words, the output 51b of the third latch 51 and the testing mode setting signal SCITT-SET are kept low level.

The memory controller 15 then changes the /RESET signal to low level while outputting the low-level /WE and /CE signals (FIG. 15(d)). Due to the low-level /RESET signal, the HWRESET signal becomes high level and the HWRESETB signal becomes low level shown in FIG. 8.

The nMOS 45a becomes ON due to the high-level HWRESET signal. The output 47b of the first latch 47 becomes high level again due to the nMOS 45a becoming ON, and the testing mode enable signal SCITT-EN becomes low level. Then MOS 45g becomes ON due to the high-level HWRESET signal, and the low-level state of the output 49b of the second latch 49 is transmitted to the third latch 51. At this time, the CE signal, the WE signal, and the VCCDC signal shown in FIG. 7 are all high level, and the EXIT signal is low level. For this reason, the high level of the RESETB signal is maintained. Therefore, the pMOS 45h shown in FIG. 8 is kept OFF. As a result, the output 51b of the third latch 51 becomes high level and the testing mode setting signal SCITT-SET becomes high level. In other words, the low-level state of the /CE and /WE signals is detected again at a rising edge of the /RESET signal.

The nMOS 53b of the activity storing circuit 53 shown in FIG. 9 becomes ON due to the high-level testing mode setting signal SCITT-SET. Since the VCCDC signal is high level, the output 59b of the entry latch 59 becomes high level. The ENTRYB and the ENTRY signals become low level and high level, respectively, due to the high-level output 59b (FIG. 15(e)).

Since the EXIT signal retains the low level thereof, the testing mode signal SCITT becomes high level due to the ENTRY signal becoming low level (FIG. 15(f)).

The flash memory 13 shifts to the connection testing mode due to the high level of the testing mode signal SCITT. The address terminals A0–A21 and the write enable terminal /WE of the flash memory 13 are used as the inputting test terminals for receiving input patterns in response to the shift to the connection testing mode. In the 8 bits mode, the multipurpose terminal DQ15/A1 is also used as the inputting test terminal. The flash memory 13 activates the operation circuit 37b shown in FIG. 11, and switches output paths of the output conversion circuits 69, 71 and 73 shown in FIGS. 12 through 14 to decoding signal sides.

For example, the output signals DQ0OUT–DQ70UT output from the conversion circuits 69 are in the same logic as the decoding signals SCAD0–SCAD7 when the /BYTE signal is low level (meaning the 8 bits mode). At this time, the output signals DQ80UT–DQ15OUT output from the output conversion circuits 71 are in the same logic as the decoding signals SCADQ0–SCADQ7.

The output signal RY/BYOUT output from the output conversion circuit 73 is in the same logic as the decoding signal SCARY/BY. The output signals DQ0OUT–DQ70UT output from the output conversion circuits 69 are in the inverted logic of the decoding signals SCADQ0–SCADQ7 when the /BYTE signal is high level (meaning the 16 bits mode). At this time, the output signals DQ80UT–DQ15OUT output from the output conversion circuits 71 are in the same logic as the decoding signals SCADQ0–SCADQ7. The output signal RY/BYOUT from the output conversion circuit 73 is in the same logic as the decoding signal SACRY/BY. In other words, in the 16 bits mode, the output signals DQ0OUT–DQ70UT and the output signals DQ80UT–DQ15OUT having the inverted logic of DQ0OUT–DQ70UT are generated by using the same decoding signals SCADQ0–SCADQ7.

Thereafter, the memory controller 15 performs the interconnection test while keeping the /RESET signal low level. After completion of the interconnection test, the memory controller 15 changes the /RESET signal to high level (FIG. 15(g)).

The output of the NOR gate 55f of the inactivity storing circuit 55 shown in FIG. 9 becomes high level by receiving the low-level ENTRYB signal and the HWRESET signal. The nMOS 55b becomes ON by receiving an output from the NOR gate 55f. Since the VCCDC signal is high level, the output 61b of the exit latch 61 becomes high level. The EXITB signal and the EXIT signal become low level and high level, respectively, due to the high-level output 61b (FIG. 15(h)). The output of the NOR gate 57b of the combinational circuit 57 becomes low level due to the high-level EXIT signal, and the testing mode signal SCITT becomes low level (FIG. 15(j)).

The flash memory 13 completes the connection testing mode by receiving the low-level SCITT signal. Since the /RESET signal is high level, the flash memory 13 shifts to a normal operation at the time of completion of the connection testing mode. The operation circuit 37b is inactivated, and the output paths of the output conversion circuits 69, 71, and 73 are changed to output-signal sides in the normal operation. The connection testing mode is completed by the change of the /RESET signal to high level. Therefore, the simple control circuit can carry out the shift to the normal operation mode.

Figure 16:
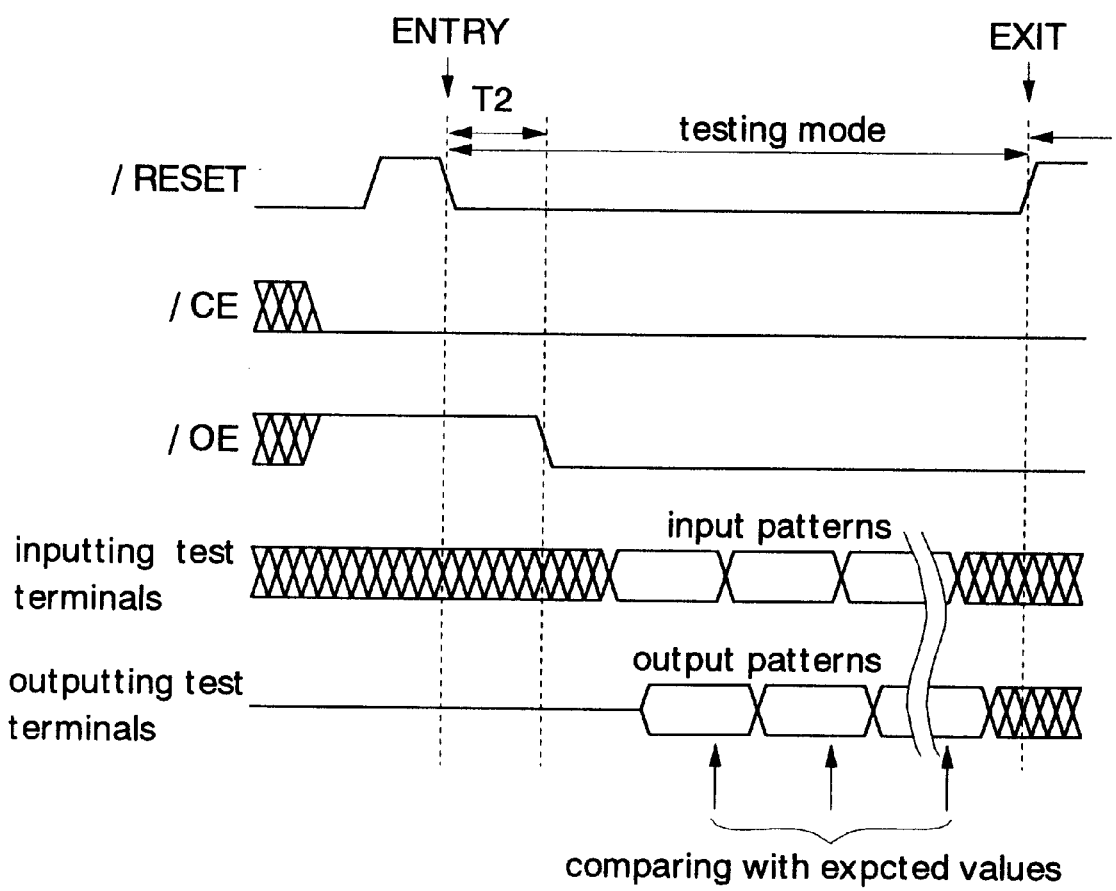
FIG. 16 is a timing chart showing the condition that the interconnection test is performed.

FIG. 16 shows timings of main signals at the time the memory controller 15 and the flash memory 13 perform the interconnection test.

The memory controller 15 changes the /RESET signal to low level and causes the flash memory to shift to the connection testing mode. The memory controller 15 changes the output enable signal /OE from high level to low level after a time T2 has elapsed from the change of /RESET signal. The flash memory 13 receives the low-level /OE signal and activates the output circuits 41 of the output buffer unit shown in FIG. 6.

The memory controller 15 then feeds input patterns to the inputting test terminals of the flash memory 13 in a predetermined period. The flash memory 13 receives the input patterns and performs a logic operation in the operation circuit 37b, and outputs the operation results as output patterns from the outputting test terminals. The memory controller 15 receives the output patterns and compares the patterns having been received with expected values. In this manner, a state of a connection between each of the terminals of the flash memory 13 and each of the lands 17 is judged. After all output patterns have been judged, the memory controller 15 changes the /RESET signal to high level and completes the connection testing mode.

FIG. 17 shows an example of the input patterns fed to the inputting test terminals by the memory controller 15 and the expected values of the output patterns from the outputting test terminals. The patterns shown in FIG. 17 are testing patterns at the time the flash memory 13 operates in the 8 bits mode. Therefore, the output patterns of the data output terminals DQ8–DQ15 shown by a stippled area are generated within the flash memory 13 but not output to the external thereof. In this example, the interconnection test is performed by using Walking-1 patterns, an All-0 pattern, Walking-0 patterns, and an All-1 pattern. The Walking-1 pattern sequentially inputs high-level data ("1" in FIG. 17) to only one target terminal among the inputting testing terminals. The All-0 pattern gives low-level data to all the inputting test terminals. The Walking-0 pattern sequentially inputs low-level data ("0" in FIG. 17) to only one target terminal among the inputting test terminals. The All-1 pattern gives high-level data to all the inputting test terminals.

Figure 18:
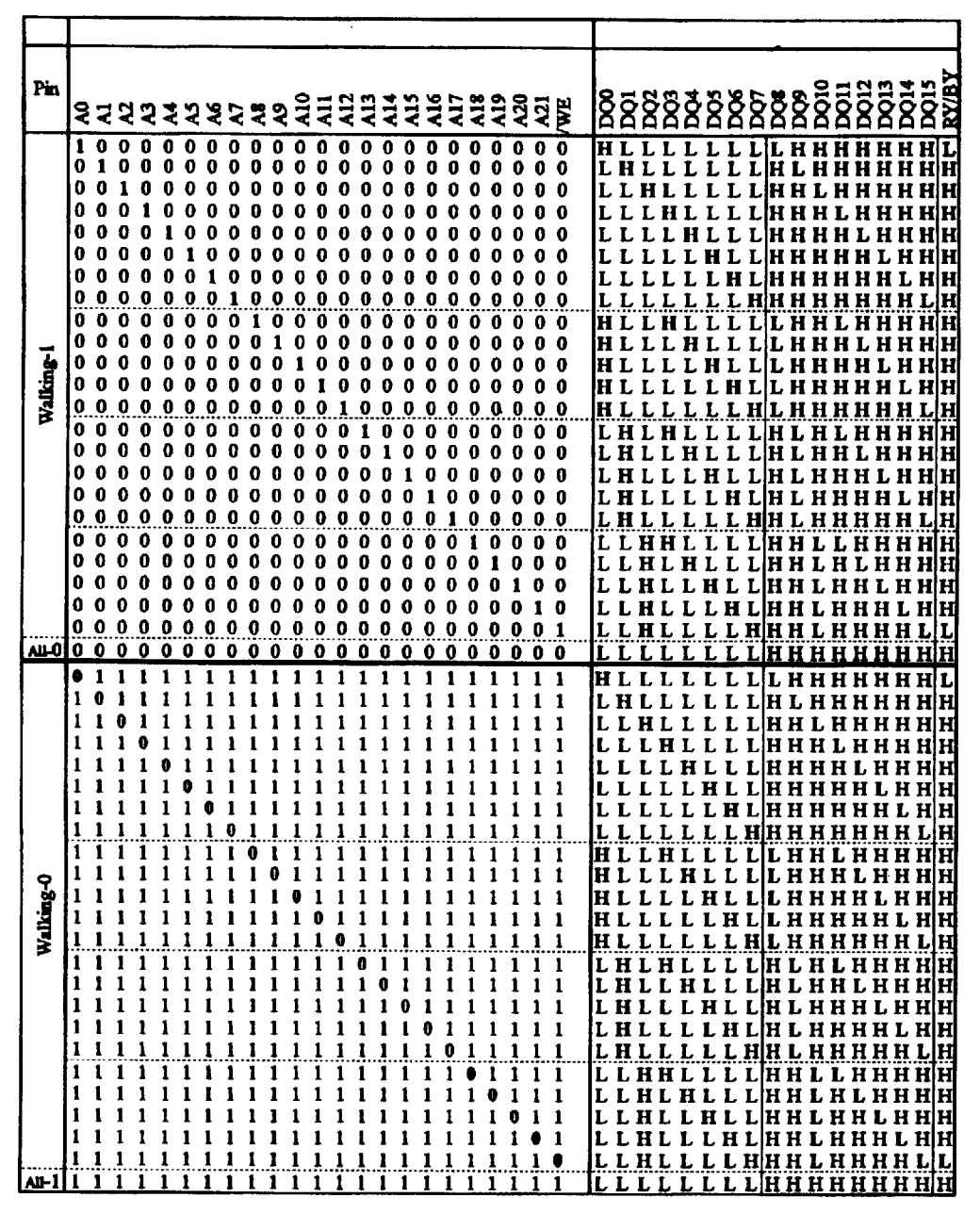

FIG. 18 shows another example of the input patterns fed to the inputting test terminals by the memory controller 15 and the expected values of the output patterns from the outputting test terminals. The patterns shown in FIG. 18 are testing patterns for the case of the flash memory 13 operating in the 16 bits mode. The testing patterns are generated in such a manner that the expected values of the lower-bit DQ0–DQ7 signals in the 16 bits mode do not become the same as those in the 8 bits mode. The output patterns of the lower-bit DQ0–DQ7 signals except for a portion thereof are in the inverted logic of the output patterns of the lower-bit DQ0–DQ7 signals at the time of the 8 bits mode shown in FIG. 17. By using such testing patterns, the operation circuit 37b can be configured simply as shown in FIG. 11.

The multipurpose terminal DQ15/A-1 is used as the data input/output terminal DQ15 at the time of the 16 bits mode. Therefore, the address terminal A-1 shown in FIG. 17 cannot be used as the inputting test terminal. For this reason, the SCA-2 signal fed from the WEB signal to the operation circuit 37b is generated by the conversion circuit 37a shown in FIG. 10.

The testing patterns and the operation circuit 37b are configured according to the following rules.

(Rule 1) When the number of the inputting test terminals is n and the number of the outputting test terminals used in common regardless of the state of the switching terminal /BYTE is m, a logic of number m of inputting test terminals are included in the logic (the operation result signals SCADQ0–SCADQ7) of the respective common outputting test terminals.

(Rule 2) In the case where the number n of the inputting test terminals is larger than the number m of the common outputting test terminals independent from the switching terminal /BYTE (that is, if n>m), a logic of the remaining number (n−m) of inputting test terminals are included in the logic of two different common outputting test terminals. This procedure is repeated until all the inputting test terminals are assigned. If n<m, a logic of number (m−n) of inputting test terminals are included in the logic of different outputting test terminals. If n=m, Rule 2 is not necessary.

(Rule 3) In the case where the number of the inputting test terminals connected to the logic of the common outputting test terminals is odd, the number of inputs is changed to even by adding another inputting test terminal.

(Rule 4) In the case where a terminal which may not be connected yet exists (for example, the RY/BY), the logic of two arbitrary inputting test terminals are included.

(Rule 5) The logic of a portion or all of the inputting test terminals switched by the switching terminal /BYTE is the inverted logic of the common outputting test terminals.

By using testing patterns described above, the SCITT decoder 37 and the output conversion unit 31 are configured by the simple operation circuit, the switching circuit, and the inverting circuit, and the interconnection test can be carried out in the 8 bits and the 16 bits modes.

For example, when the stuck-at 1 failure is found in the switching terminal /BYTE in the printed-wiring board 11 on which the switching terminal /BYTE is fixed to low level, the failure is detected by outputting a pattern which is in the inverted logic of the expected values. In the case where the switching terminal is fixed to high level, the stuck-at 0 failure thereof is also detected.

In the semiconductor memory device configured in the above manner and the circuit board mounted with the semiconductor memory device, and in the method for testing interconnection between a semiconductor memory device with a circuit board, the detecting unit 35 detecting the low level of the /CE and /WE signals at successively changing edges of the /RESET signal is formed in the flash memory 13. Therefore, without terminals dedicated to testing, the flash memory 13 shifts to the connection testing mode and the interconnection test can be carried out. Furthermore, in a semiconductor memory device of clock asynchronous type, such as the flash memory 13, a shift to the connection testing mode is carried out upon necessity and testing can be carried out.

In order to shift to the connection testing mode, the /CE signal and the /WE signal need to be low level at each edge of the successively changing /RESET signal. The /RESET signal does not change in a normal operation when the /CE and /WE signals are low level. Therefore, a shift to the connection testing mode due to an erroneous operation or power-supply noise in the normal operation is prevented.

The input circuits 39 in the input buffer unit 21 is not controlled by the /RESET signal. Therefore, the signals fed to the input circuits 39 can be fed to the detecting unit 35, the SCITT decoder 37, or the like, enabling a shift to the connection testing mode with certainty.

The detecting unit 35 cancels the connection testing mode when it detects a rising edge of the /RESET signal in the testing mode. Therefore, at the time of the cancellation of the testing mode, the flash memory 13 can be shifted to the normal operation mode. A user does not need to consider the connection testing mode. In other words, degradation of operational convenience can be prevented.

(1) The activity storing circuit 53 for storing the information of a shift to the testing mode and for prohibiting a shift to the testing mode when the stored information is stored after the power is switched on, and (2) the inactivity storing circuit 55 storing the information of canceling the testing mode and prohibiting a shift to the testing mode when the stored information is stored are used. Therefore, once a shift to the testing mode is completed, another shift to the testing mode is prevented. In this manner, in a normal operation, a shift to the testing mode due to an erroneous operation or power-supply noise can be prevented securely from occurring.

In the connection testing mode, the predetermined terminals of the flash memory 13 are used as the inputting test terminals and outputting test terminals. Therefore, without having terminals dedicated to testing, the interconnection test can be carried out.

The output conversion circuits 69 of the output conversion unit 31 are controlled by the /BYTE terminal so that the output patterns in the 8 bits mode and the 16 bits mode become different. Therefore, in the semiconductor memory device enabling switching a word formation of the data input/output terminals by using a switching terminal such as the /BYTE, connection testing in accordance with the word formation can be carried out. As a result, a connection failure of the /BYTE terminal not belonging to either the inputting test terminals or the outputting test terminals can be found. In other words, for the switching terminal /BYTE whose level has a high possibility of being fixed on the printed-wiring board 11, interconnection test can be carried out without including the /BYTE terminal in either the inputting test terminals or the outputting test terminals.

The output conversion circuits 69 of the output conversion unit 31 are controlled by the /BYTE terminal so that the logic of the output patterns from the data input/output terminals DQ0–DQ7 and DQ8–DQ15 become the inverse of each other in the 16 bits mode. Therefore, the interconnection test can be carried out without increasing the scale of the output conversion unit 31, by causing the output patterns from the input/output terminals and the extended input/output terminals to become different.

Figure 19:
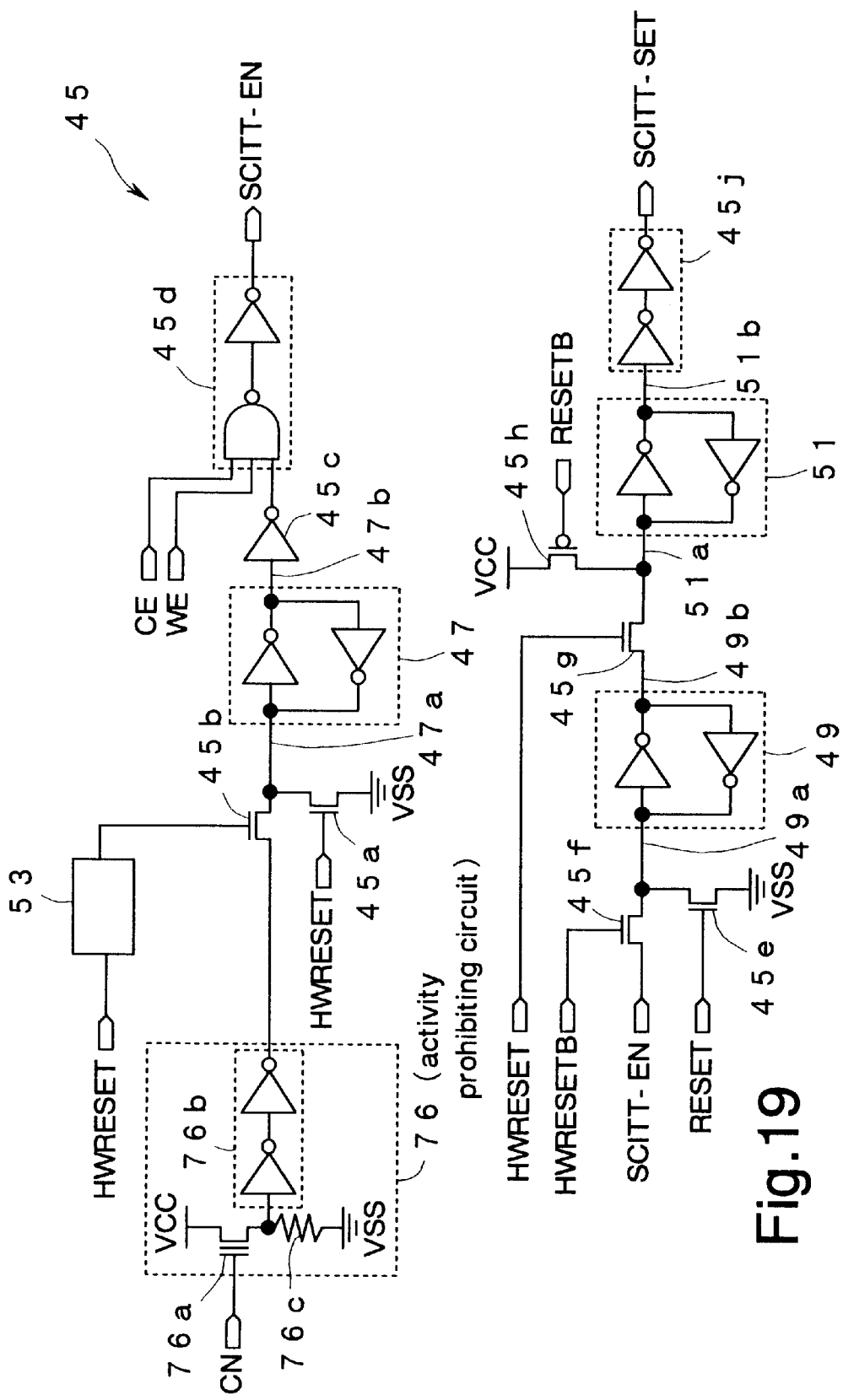
FIG. 19 is a circuit diagram showing the second embodiment of the semiconductor memory device according to the present invention.

FIG. 19 shows the second embodiment of the semiconductor memory device of the present invention.

In this embodiment, an activity prohibiting circuit 76 is connected to the drain of the nMOS 45b of the initialization circuit 45. The configuration of the second embodiment is the same as that of the first embodiment described above, except for the activity prohibiting circuit 76.

The activity prohibiting circuit 76 comprises a memory cell 76a of a flash memory, an inverter row 76b in which two inverters form a cascade connection, and a pulled-down high-resistance resistor 76c. A control gate of the memory cell 76a receives a control signal CN allowing voltage changes at the time of data writing and other operations. A drain of the memory cell 76a is connected to the power supply line VCC. A source of the memory cell 76a is connected to an input of the inverter row 76b. An output of the inverter row 76b is connected to the drain of the nMOS 45b.

In this embodiment, in the case where a shift to the connection testing mode is necessary, "1" is written in the memory cell 76a in advance. The memory cell 76a stays ON when "1" is written therein, and the output of the inverter row 76b is kept high level at all times. In other words, the same circuit operation is carried out as in the first embodiment of the semiconductor memory device described above, and a shift to the connection testing mode becomes possible.

Meanwhile, in the case where a shift to the testing mode is not necessary, "0" is written in the memory cell 76a in advance. The memory cell 76a stays OFF by being written with "0" therein. The input of the inverter row 76b is always fed with a low-level signal by the high-resistance resistor 76c, and the drain of the nMOS 45b is kept low level. In other words, the output 47b of the first latch 47 does not become low level and the flash memory 13 never shifts to the testing mode.

The data can be written in the memory cell 76a before delivery or after delivery of the flash memory 13. For example, by writing "0" in the memory cell 76a in a manufacturing process, a shift to the testing mode can be prevented in advance. Furthermore, by writing "0" in the memory cell 76a after the interconnection test, shifting to the testing mode thereafter can be prevented.

In this embodiment, the same effect as by the first embodiment of the semiconductor memory device described above can be obtained. Furthermore, in this embodiment, the activity prohibiting circuit 76 comprising the memory cell 76a of flash memory type is used and activation of the detecting unit 35 is prohibited by controlling the initialization circuit 45. Therefore, in the case where delivery of the semiconductor memory device to a customer not requiring the connection testing mode is known in advance, activation of the detecting unit 35 is always prohibited by writing "0" in the memory cell 76a in a manufacturing process, and activation of the SCITT decoder 37 is thus prevented. Furthermore, after the interconnection test between each of the terminals in the flash memory 13 and each of the lands 17 of the printed-wiring board 11, activation of the detecting unit 35 is prohibited by writing "0" in the memory cell 76a, and an operation of the SCITT decoder 37 is prevented from occurring.

In other words, either before or after delivery of the flash memory 13, a shift to the connection testing mode can be prohibited in advance, depending on a customer using the flash memory 13.

Figure 20:
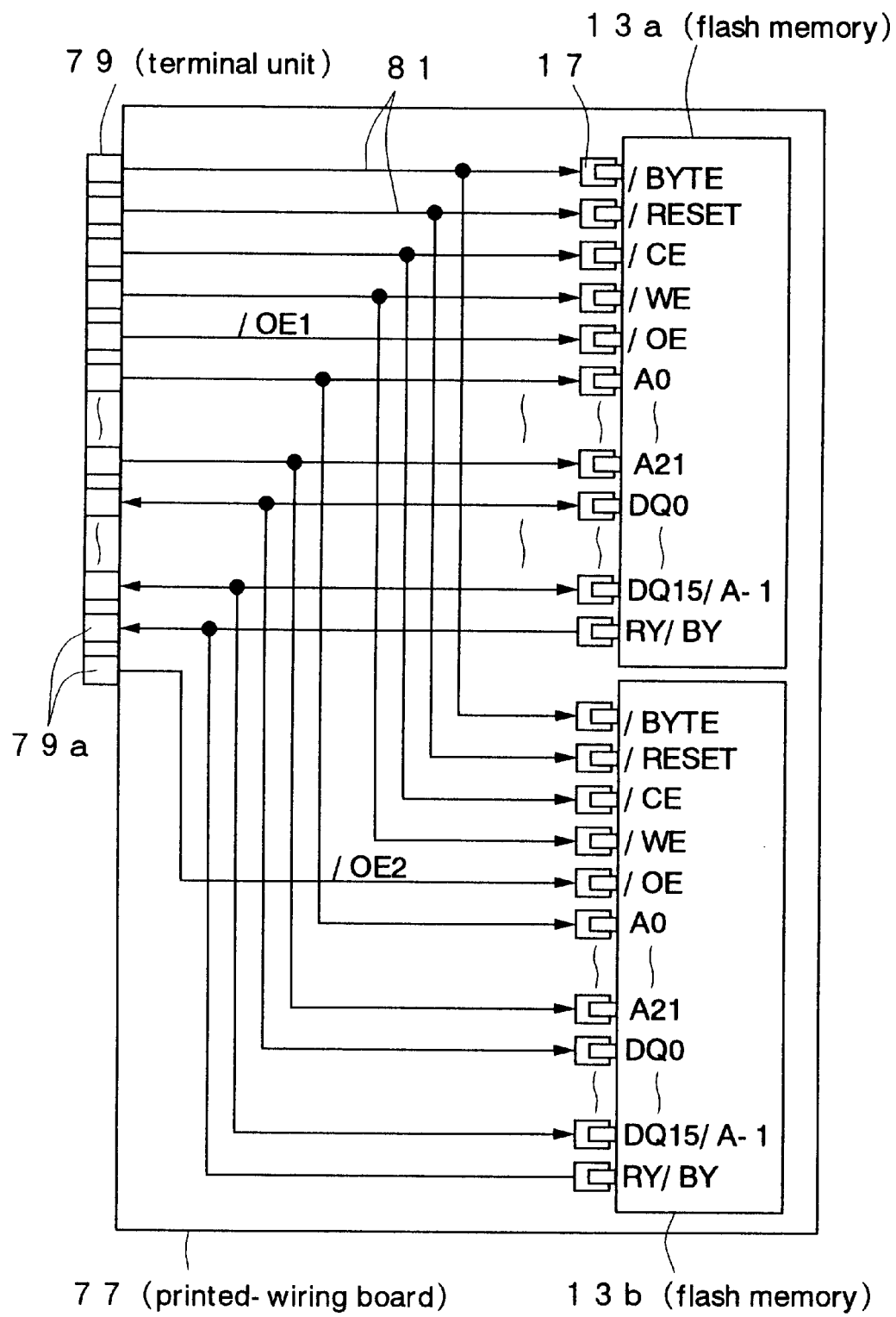
FIG. 20 is a whole configuration diagram showing the second embodiment of the circuit board mounted with the semiconductor memory device according to the present invention.

FIG. 20 shows the second embodiment of a circuit board mounted with the semiconductor memory device.

In this embodiment, a terminal unit 79 comprising a plurality of terminals 79a is formed on a printed-wiring board 77. The terminal unit 79 is connected to a connector or the like of an external controlling device (not shown). Two flash memories 13a and 13b are mounted on the printed-wiring board 77. The flash memories 13a and 13b are the same as the flash memory 13 in the first embodiment described above. Each of the terminals of the flash memories 13a and 13b is soldered on the land 17 formed on the printed-wiring board 11. The lands 17 of the flash memories 13a and 13b and the terminals 79a of the terminal unit 79 are connected to each other by a wiring pattern 81 shown by arrows in FIG. 20. The directions of the arrows show the directions in which signals are fed. The /OE terminals of the flash memories 13a and 13b are connected to a /OE1 terminal and /OE2 terminal of the terminal unit 79, respectively. For terminals other than the /OE terminal in the flash memories 13a and 13b, a common wiring pattern is used.

In this embodiment, the external control device feeds a signal via the terminal unit 79, and controls the flash memories 13a and 13b.

Figure 21:
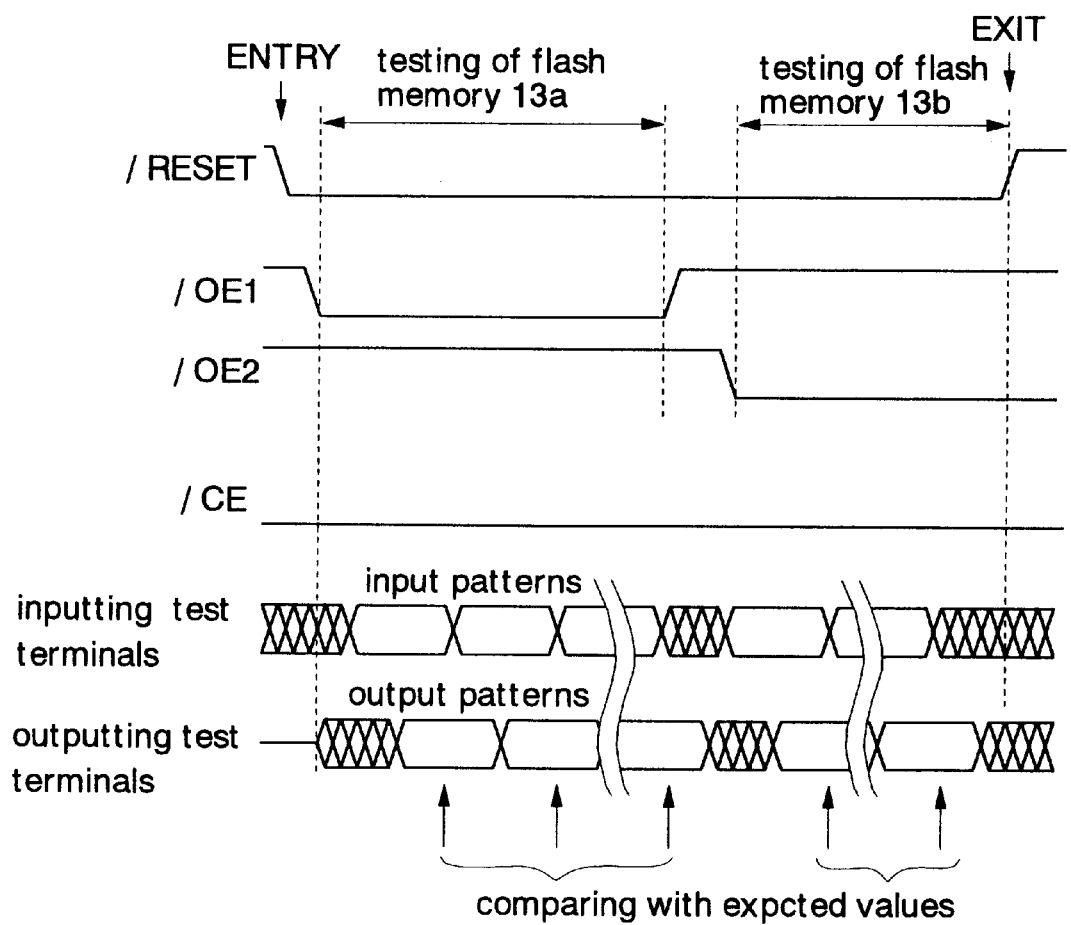
FIG. 21 is a timing chart showing the condition that the interconnection test is performed.

FIG. 21 shows timings of main signals at the time interconnection test between the flash memory 13a and 13b and the printed-wiring board 77 is performed under the control of the external controlling device.

The controlling device controls the /RESET signal, /CE signal, and the /WE signal, via the terminal unit 79 shown in FIG. 20, and causes the flash memories 13a and 13b to simultaneously shift to the testing mode. The controlling device changes only the /OE1 signal fed to the /OE terminal of the flash memory 13a to low level while keeping the /RESET signal and the /CE signal low level. In this state, an input pattern is fed from the controlling device and the interconnection test of the flash memory 13a is performed.

The control device then changes the /OE1 signal to high level and /OE2 signal of the flash memory 13b to low level. In this state, an input pattern is fed from the controlling device and the interconnection test of the flash memory 13b is performed. Thereafter, the controlling device changes the /RESET signal to high level and completes the connection testing mode. In other words, the flash memories 13a and 13b shift to the testing mode at the same time. However, output signals from the flash memories 13a and 13b do not conflict, since the output signals are controlled by the /OE1 and /OE2 signals. Therefore, the interconnection test of the printed-wiring board 77 mounted with a plurality of the flash memories can be carries out easily.

In this embodiment, the same effect as the first embodiment of the circuit board 11 mounted with the semiconductor memory device described above can be obtained. Furthermore, in this embodiment, the terminal unit 79 comprising the plurality of terminals is formed on the printed-wiring board 77 mounted with the flash memories 13a and 13b, and the terminals of the flash memories 13a and 13b are connected to the terminals 79a of the terminal unit 79 by the wiring pattern 81. Therefore, by controlling from the external the flash memories 13a and 13b via the terminal unit 79, the interconnection test can be performed between the terminals of the flash memories 13a and 13b and the terminal unit 79 of the printed-wiring board 77.

The /OE terminals of the flash memories 13a and 13b are each connected to the /OE1 and /OE2 terminals of the terminal unit 79, and the terminals other than the /OE terminals are connected to the common terminals of the terminal unit. Therefore, The flash memories 13a and 13b can be shifted to the testing mode at the same time. Moreover, by controlling the /OE terminals of the flash memories 13a and 13b having been shifted to the testing mode by using the /OE1 and /OE2 terminals, interconnection test of the flash memories 13a and 13b can be performed individually. As a result, a signal conflict in the wiring pattern on the printed-wiring board 77 can be prevented.

Figure 22:
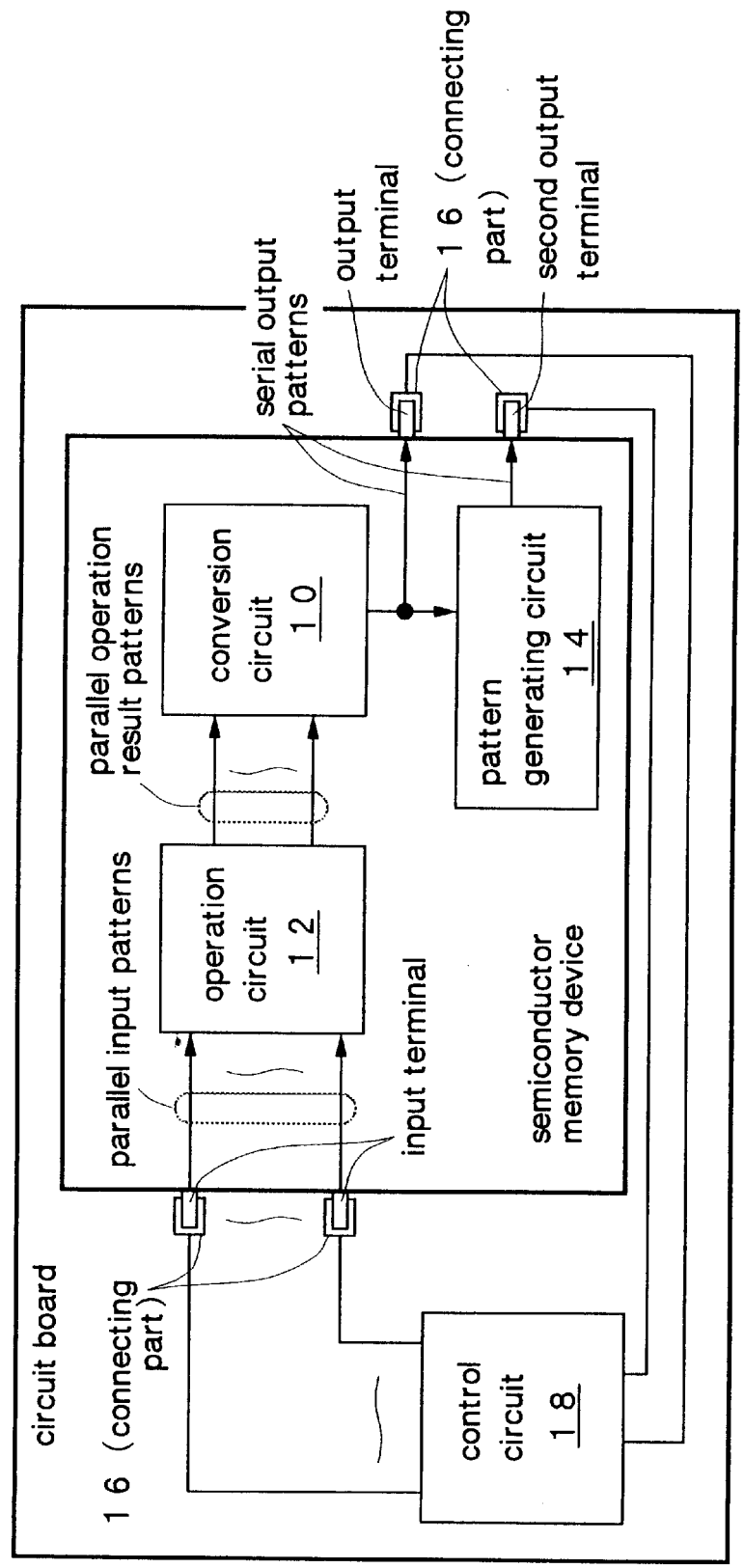
FIG. 22 is a block diagram showing another principle of the present invention.

FIG. 22 is a block diagram showing another principle of the present invention.

In the semiconductor memory device, a conversion circuit 10 receives parallel input patterns (testing patterns) via a plurality of input terminals at the time of testing a connection between each terminal and the circuit board, and converts the patterns into serial output patterns. The output patterns are sequentially output from an output terminal.

Furthermore, during a normal operation, an operation circuit 12 receives parallel input patterns (testing patterns) via a plurality of input terminals at the time of connection testing between each terminal and the circuit board, performs a logic operation, and outputs parallel output patterns. The conversion circuit 10 receives the parallel operation result patterns from the operation circuit 12 and converts the patterns into serial output patterns. The output patterns are sequentially output from the output terminal.

Moreover, the semiconductor memory device comprises a second output terminal used in a predetermined operation mode among a plurality of normal operation modes. A pattern generating circuit 14 sequentially receives the output patterns from the conversion circuit 10 and generates second serial output patterns different from the output patterns having been received. The generated output patterns are output from the second output terminal.

Meanwhile, the circuit board comprises a control circuit 18 and connecting parts 16 interconnecting terminals of the semiconductor memory device. The control circuit 18 feeds parallel input patterns to the input terminals of the semiconductor memory device via the connecting parts 16 and sequentially receives the serial output patterns from the output terminal. By comparing the output patterns with expected values, connection testing can be performed between the terminals of the semiconductor memory device and the connecting parts 16.

As has been described above, by feeding the parallel input patterns to the input terminals of the semiconductor memory device and by comparing the output patterns from the output terminal with the expected values, connection testing can be carried out between the terminals of the semiconductor memory device and the circuit board.

Figure 23:
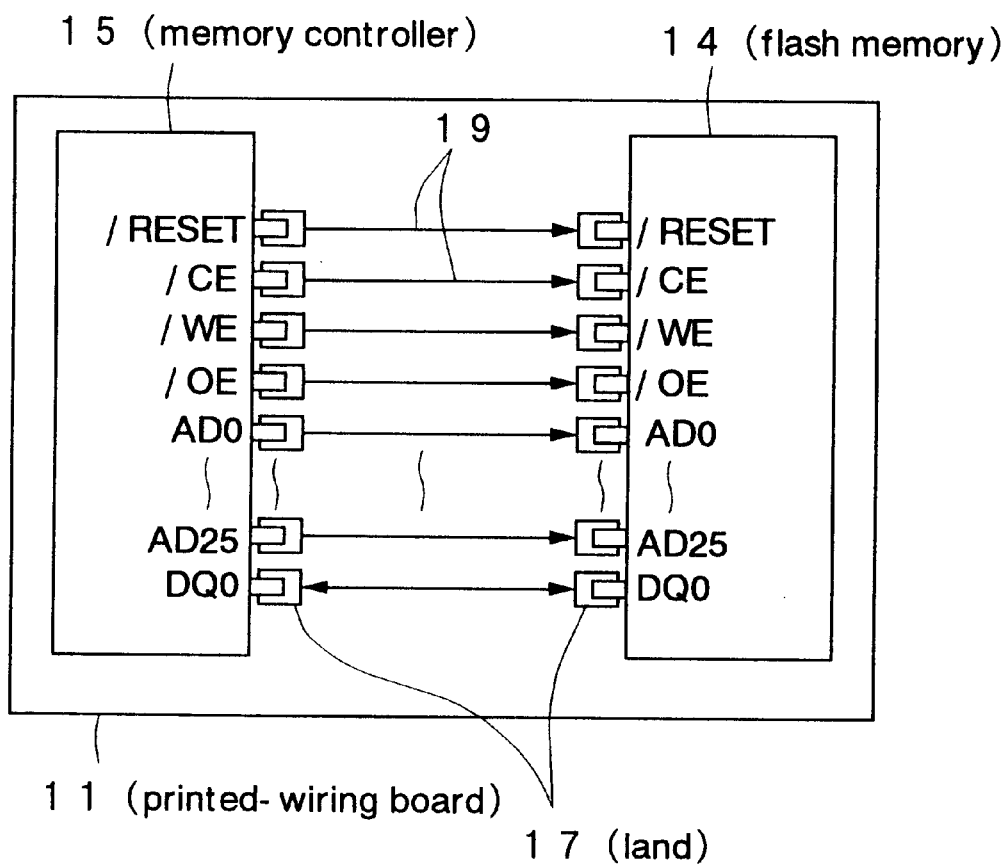
FIG. 23 is a whole configuration diagram showing the third embodiment of the semiconductor memory device, the third embodiment of the circuit board mounted with the semiconductor memory device, and the second embodiment of a method for testing interconnection between a semiconductor memory device with a circuit board.

FIG. 23 shows the third embodiment of the semiconductor memory device, the third embodiment of the circuit board mounted with the semiconductor memory device, and the second embodiment of method for testing interconnection between a semiconductor memory device with a circuit board according to the present invention.

In FIG. 23, a flash memory 14 and the memory controller 15 are mounted on the printed-wiring board 11. The printed-wiring board 11, the flash memory 14, and the memory controller 15 correspond to the circuit board, the semiconductor memory device, and the control circuit 18 shown in FIG. 22. Terminals (such as /RESET) of the flash memory 14 and the terminals of the memory controller 15 are soldered on the lands 17 formed on the printed-wiring board 11. The lands 17 correspond to the connecting parts 16 shown in FIG. 22. The lands 17 of the flash memory 14 and the lands 17 of the memory controller 15 are connected to each other by a wiring pattern 19 shown by arrows in FIG. 23. The directions of the arrows show the directions in which signals are fed.

The memory controller 15 is formed by a logic LSI such as a gate array. The memory controller15 has a control circuit for a normal operation of the flash memory 14, a circuit for feeding an input pattern to the flash memory 14 at the time of connection testing, and a circuit for comparing an output pattern from the flash memory 14 in response to the input pattern with expected values.

The flash memory 14 and the memory controller 15 respectively have the reset terminal /RESET, the chip enable terminal /CE, the write enable terminal /WE, the output enable terminal /OE, a plurality of address terminals A0–A25, and a data input/output terminal DQ0. In other words, data are written in the flash memory 14 by using the only data input/output terminal DQ0.

The reset terminal /RESET, the chip enable terminal /CE, the write enable terminal /WE, the output enable terminal /OE, and the address terminals A0–A25 correspond to the input terminals shown in FIG. 22. The data input/output terminal DQ0 corresponds to the output terminal shown in FIG. 22.

Figure 24:
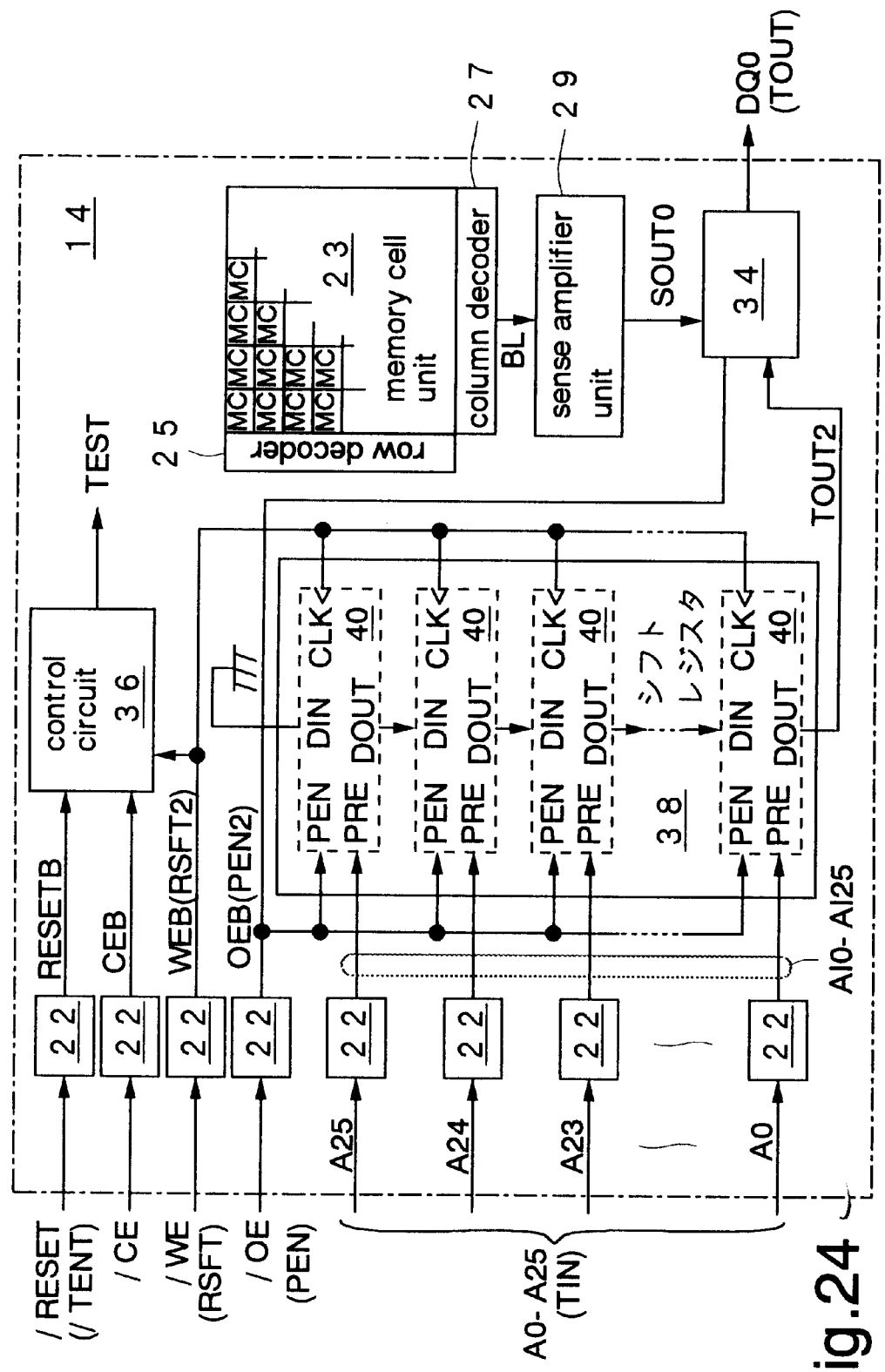
FIG. 24 is a block diagram showing the internal configuration. of the flash memory of FIG. 23.

FIG. 24 is a block diagram showing an internal configuration of the flash memory 14. In the explanation hereinafter, signals fed to the terminals have the same reference codes as the terminal names, such as "the reset signal /RESET". The names of the signals may be abbreviated, such as "/RESET signal" for the reset signal /RESET, and "/WE signal" for the write enable signal /WE.

The flash memory 14 comprises input buffers 22 each for inputting each input signal, a memory cell unit 23, the row decoder 25, the column decoder 27, the sense amplifier 29, an output buffer 34, a control circuit 36, and a shift register 38. The shift register 38 corresponds to the conversion circuit 10 shown in FIG. 22. An input circuit to the data input/output terminal DQ0 and a write circuit to the memory cell unit 23 are not shown in FIG. 24.

Each of the input buffers 22 inputs an input signal fed from the memory controller 15 in FIG. 23, and converts the signal having been input into an internal signal to be output within the chip. More specifically, the reset signal /RESET is converted into the reset signal RESETB, and the chip enable signal /CE is converted into the chip enable signal CEB. The write enable signal /WE is converted into the write enable signal WEB, and the output enable signal /OE is converted into the output enable signal OEB. The address signals A0–A25 are converted into address signals AI0–AI25. The internal signals suffixed with "B" are the signals of negative logic. he other internal signals are positive-logic signals. Signals shown in parentheses are signals fed to the terminals in the connection testing mode which will be explained later. In other words, in the connection testing mode, a test enable signal /TENT is fed to the reset terminal /RESET and a shift register signal RSFT is fed to the write enable terminal /WE. A preset enable signal PEN is fed to the output enable terminal /OE, and a testing pattern signal TIN is fed to the address terminals A0–A25.

The control circuit 36 receives the reset signal RESETB, the chip enable signal CEB, and the write enable signal WEB, and outputs a testing mode signal TEST. By activation of the testing mode signal TEST, the flash memory 14 changes from a normal operation mode to the connection testing mode.

The shift register 38 is formed by serially connecting a plurality of latch circuits 40 corresponding to the address terminals A0–A25. In this embodiment, the latch circuit 40 at the bottom of FIG. 24 corresponds to the lowest address terminal A0, while the latch circuit at the top corresponds to the highest address terminal A25. Each of the latch circuits 40 receives the testing pattern TIN by the preset terminal PRE at the time a preset enable signal PEN2 is high level, and latches the signal having been received. Each of the latch circuits 40 outputs data latched therein, in synchronicity with a shift register signal RSFT2 fed to a clock terminal, when the preset enable terminal PEN2 at a low level is received by the preset enable terminal PEN. An input terminal DIN of the latch circuit 40 at the first stage is connected to a ground line. A test output signal TOUT2 is output from an output terminal DOUT of the final stage latch circuit 40. Each of the latch circuits 40 is activated in the connection testing mode.

A plurality of the memory cells MC are arranged vertically and horizontally in the memory cell unit 23. The row decoder 25 and the column decoder 27 are circuits for selecting one of the memory cells MC in the direction of row and column, respectively. A signal output from the selected memory cell MC is output to the sense amplifier 29 via the column decoder 27 and the bit line BL. The sense amplifier 29 amplifies the weak signal output from the memory cell MC and outputs the signal as the data output signal SOUT0.

The output buffer 34 receives the data output signal SOUT0 in a normal operation, and outputs the data having been received to the data input/output terminal DQ0. The output buffer 34 receives the test output signal TOUT2 in the testing mode, and outputs the signal having been received to the data input/output terminal DQ0 as the test output signal TOUT. The output buffer 34 is controlled by the output enable signal OEB, and the signal is output from the output buffer 34 only when the output enable signal OEB is low level.

Figure 25:
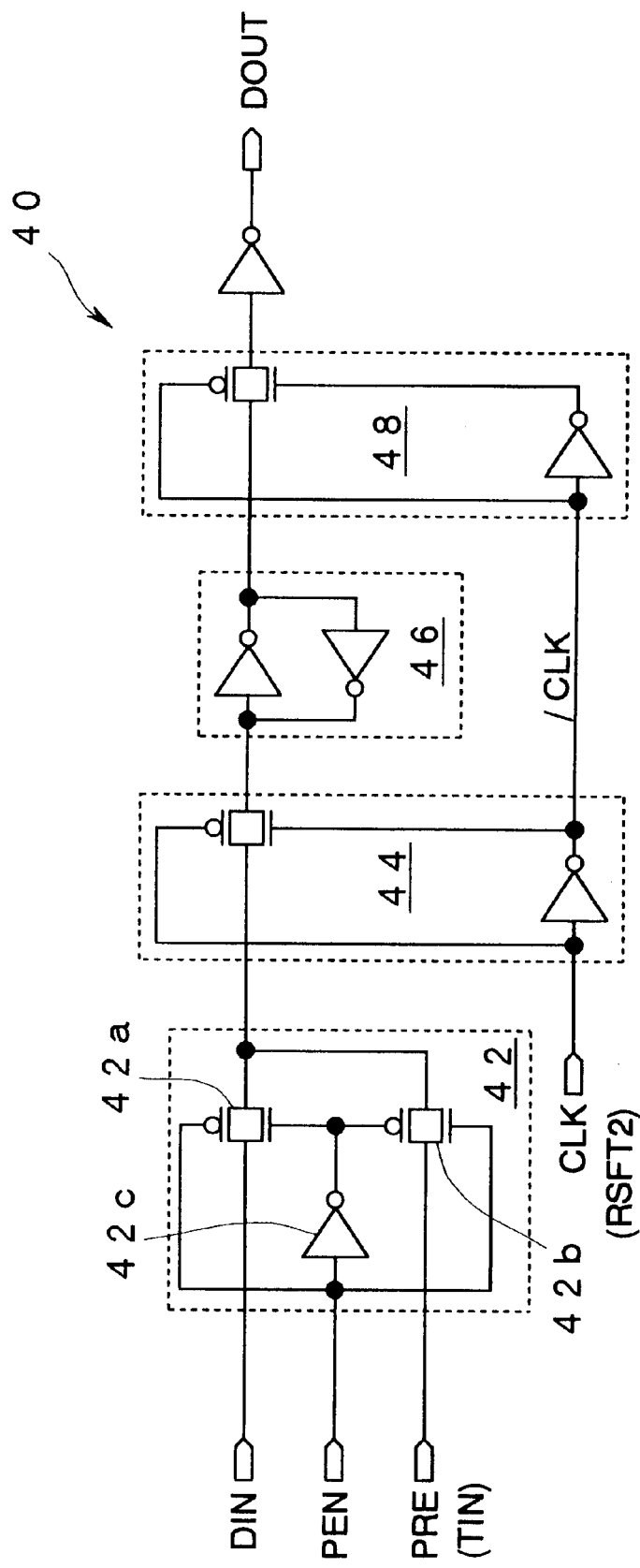
FIG. 25 is a circuit diagram showing a latch circuit of FIG. 24.

FIG. 25 shows the latch circuit 40 in detail.

The latch circuit 40 comprises a preset circuit 42, a switching circuit 44, a latch 46, and a switching circuit 48 connected in series.

The preset circuit 42 comprises CMOS transmission gates 42a and 42b whose outputs are connected to each other, and an inverter 42c controlling the CMOS transmission gates 42a and 42b. The CMOS transmission gates 42a and 42b are respectively formed by connecting a source and a drain of a PMOS and an nMOS thereof. The input terminal DIN is connected to an input of the CMOS transmission gate 42a. The preset terminal PRE is connected to an input of the CMOS transmission gate 42b. The preset enable terminal PEN is connected to a gate of the PMOS of the CMOS transmission gate 42a, a gate of the nMOS of the CMOS transmission gate 42b, and an input of the inverter 42c. An output of the inverter 42c is connected to a gate of the nMOS of the CMOS transmission gate 42a, and a gate of the PMOS of the CMOS transmission gate 42b.

The CMOS transmission gate 42a becomes ON when the preset enable signal PEN is low level, and transmits the input signal DIN to the output side. The CMOS transmission gate 42b becomes ON when the preset enable signal PEN is high level, and transmits the preset signal PRE to the output side. As the preset signal PRE, the testing pattern signal TIN is fed.

The switching circuits 44 and 48 respectively comprise a CMOS transmission gate and an inverter controlling the CMOS transmission gate. The switching circuit 44 becomes ON when a clock signal CLK is low level. The switching circuit 48 becomes ON when the clock signal CLK is high level (when a clock signal /CLK is low level). As the clock signal CLK, the register shift signal RSFT2 is fed.

The latch 46 comprises two inverters whose input and output are connected to each other.

The latch circuit 40 retains the signal from the switching circuit 44 in the latch 46 when the register shift signal RSFT2 is low level, while outputs the data retained in the latch 46 when the signal RSFT2 is high level.

In the printed-wiring board 11 mounted with the flash memory 14 and the memory controller 15 described above, interconnection test is performed in the following manner between each terminal of the flash memory 14 and each of the lands 17 of the printed-wiring board 11.

In the interconnection test, the memory controller 15 controls the flash memory 14 to cause the flash memory to shift to the testing mode when the power is turned on.

Figure 26:
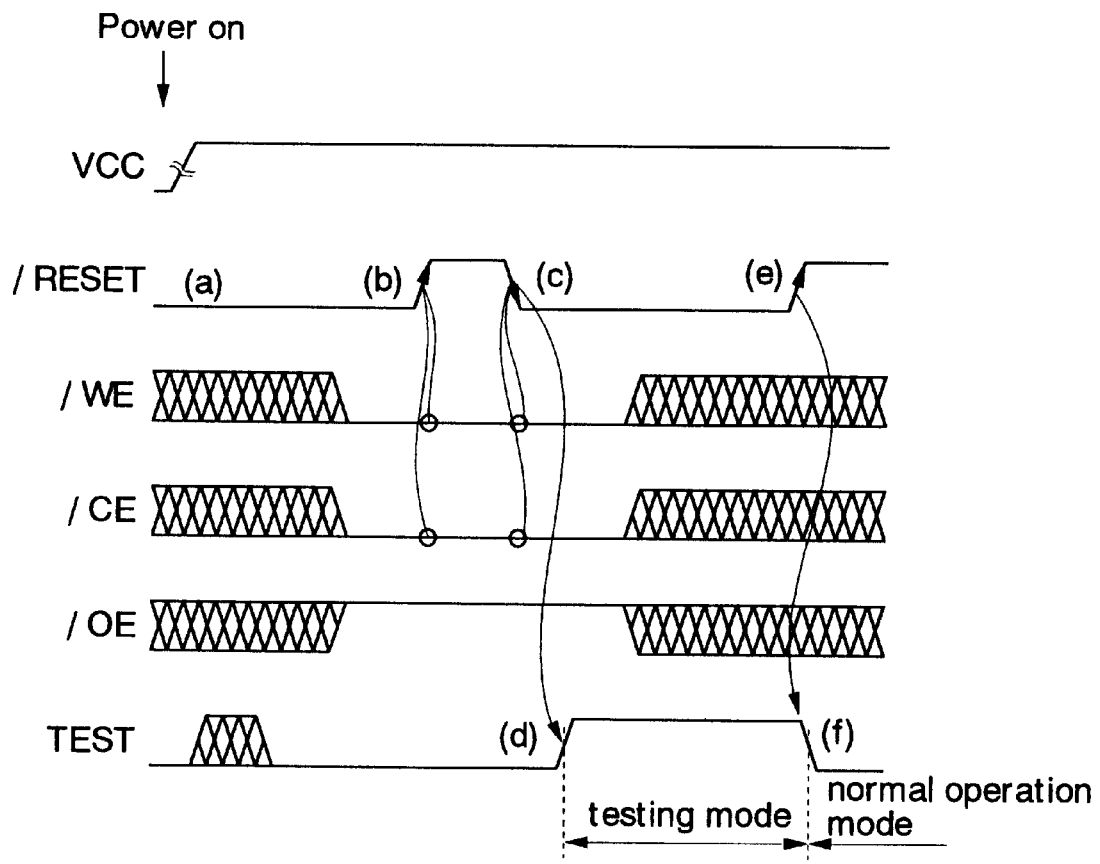
FIG. 26 is a timing chart showing the control of the shift to the connection testing mode.

FIG. 26 shows timings of main signals when the flash memory 14 shifts to the testing mode and then to a normal operation mode.

When the power is turned on, the power supply voltage VCC rises to a predetermined value. At this time, the memory controller 15 in FIG. 23 causes the /RESET signal to become low level (FIG. 26(a)).

The memory controller then causes the /WE and /CE signals to become low level, and causes the /RESET signal to become high level while maintaining the state of the /WE and /CE signals (FIG. 26(b)). The memory controller 15 then causes the /RESET signal to become low level (FIG. 26(c)).

The control circuit 36 in FIG. 24 activates the test signal TEST by receiving the change of the /RESET signal from high level to low level (FIG. 26(d)). The flash memory 14 is shifted to the testing mode and the shift register 38 in FIG. 24 is activated.

The memory controller 15 performs the interconnection test while keeping the /RESET signal low level. After completion of the testing, the memory controller 15 causes the /RESET signal to become high level (FIG. 26(e)). The control circuit 36 causes the test signal TEST to become low level by receiving the change of the /RESET signal to high level (FIG. 26(f)). The flash memory 14 then shifts to a normal operation.

In other words, in this embodiment, interconnection test is carried out in a resetting sequence before commencement of a normal operation. In a normal operation, the /RESET signal does not change when the /WE and /CE signals are low level. Therefore, the chip is prevented from shifting to the connection testing mode due to an erroneous operation or noise during a normal operation. As a result, a shift to the testing mode is ensured in the semiconductor memory device of asynchronous type not having the clock signal. Furthermore, terminals dedicated to testing are not necessary.

Figure 27:
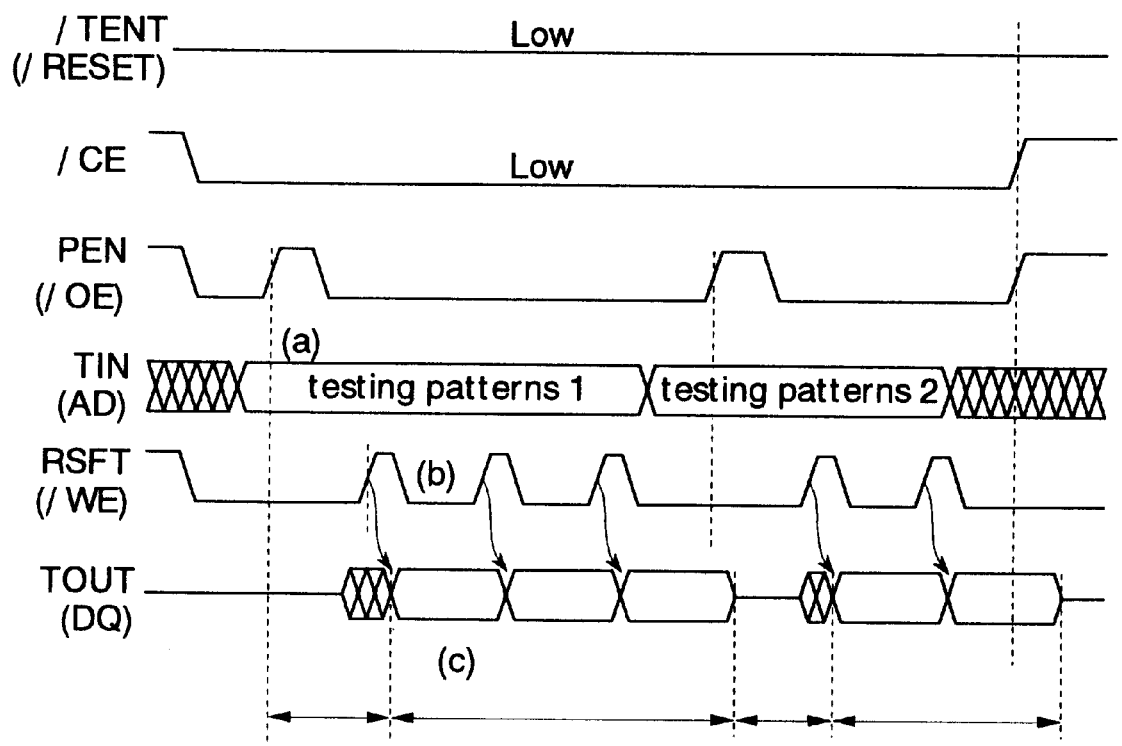
FIG. 27 is a timing chart showing the condition that the interconnection test is performed.

FIG. 27 shows timings of main signals when the memory controller 15 and the flash memory 14 perform the interconnection test. As has been described above, in the connection testing mode, the test enable signal /TENT is fed to the reset terminal /RESET and the preset enable signal PEN is fed to the output enable terminal /OE. The testing pattern signal TIN is fed to the address terminals As and the register shift signal RSFT is fed to the write enable terminal /WE. The test output signal TOUT is output from the data input/output terminal DQ0.

The memory controller 15 keeps the /RESET and /CE signals low level during the interconnection test.

The memory controller 15 feeds parallel testing patterns 1 to each of the test terminals TIN of the flash memory 14 in synchronicity with a rising edge of the PEN signal (FIG. 27(a)). The latch circuits 40 in FIG. 25 input the testing patterns 1 in the latch 46 by receiving the high-level PEN signal.

The memory controller 15 causes the RSFT signal to become high level in a predetermined period, and causes the shift register 38 in FIG. 23 to operate (FIG. 27(b)). Receiving the RSFT signal, the shift register 38 sequentially outputs the data latched in the final stage latch circuit 40 as the serial test output signal TOUT2. At this time, since the PEN signal (=/OE signal) is low level, the test output signal TOUT2 is output as the test output signal TOUT to the external (FIG. 27(c)). In other words, the testing patterns 1 fed in parallel are output as serial output patterns.

The memory controller 15 receives the serial test output signals TOUT output sequentially, and compares the signals with expected values. In this manner, a connection between each of the terminals in the flash memory 14 and each of the lands 17 is judged.

Figure 28:
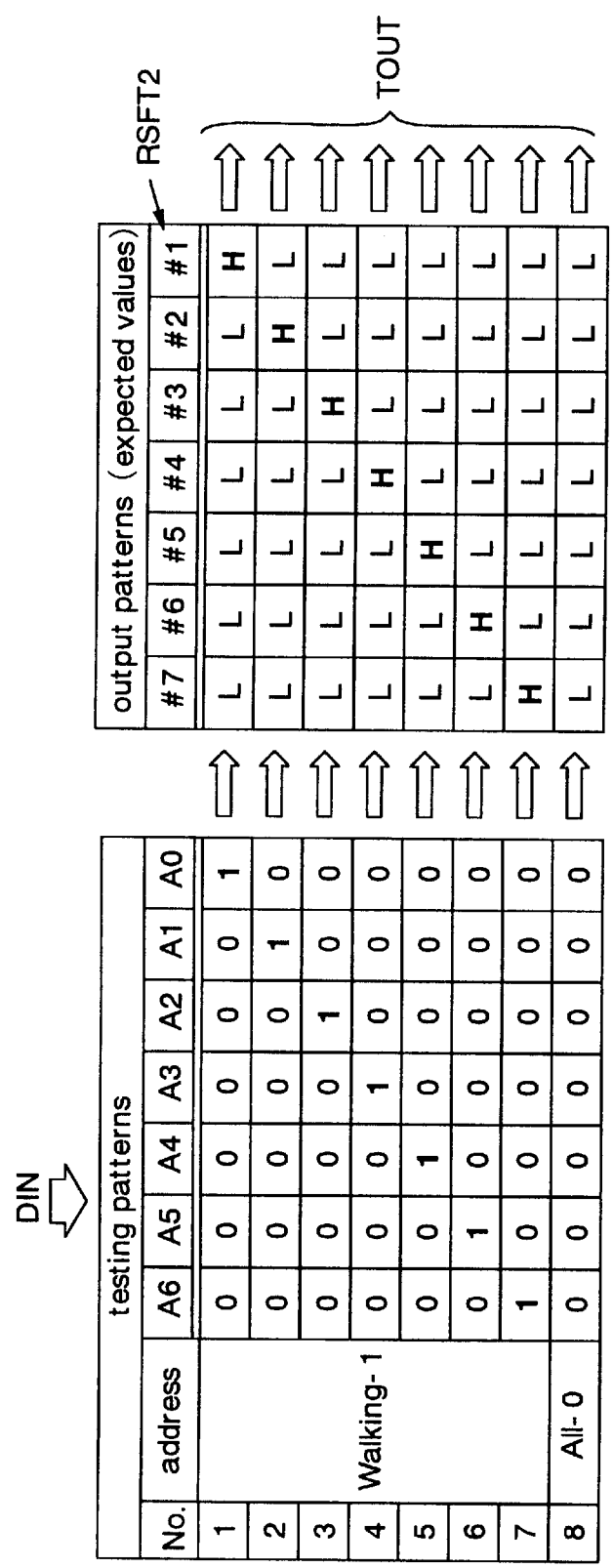
FIG. 28 is an explanation diagram showing testing patterns and output patterns in the third embodiment of the semiconductor memory device.

FIG. 28 shows an example of the testing patterns (input patterns) fed by the memory controller 15 to each test terminal TIN and output patterns (expected values) from the output terminal DQ0. In this example, for the sake of simpler explanation, the address signals are 7 bits, and the input patterns are "Walking-1" and "All-0".

"Walking-1" is a testing pattern sequentially feeding high-level data ("1" in FIG. 28) to only one target inputting test terminal. "All-0" is a testing pattern feeding low-level data ("0" in FIG. 28) to all of the inputting test terminals.

In the example, 8 testing patterns are fed to the flash memory 14. The shift register 38 in FIG. 24 inputs the parallel testing patterns from the PRE terminal, and sequentially outputs the patterns as serial output patterns (the TOUT signals) in synchronicity with the RSFT2 signal fed to a CLK terminal.

In the case where a connection between each of the terminals in the flash memory 14 and each of the lands 17 of the printed-wiring board 11 is normal, the testing patterns and the output patterns are in the same logic, as shown in FIG. 28. In other words, the testing patterns themselves are the expected values. Furthermore, testing can be carried out by using only one output terminal.

Moreover, the testing patterns "Walking-1", "Walking-0", "All-1", and "All-0" are needed for detecting all failures of each terminal.

Figure 29:
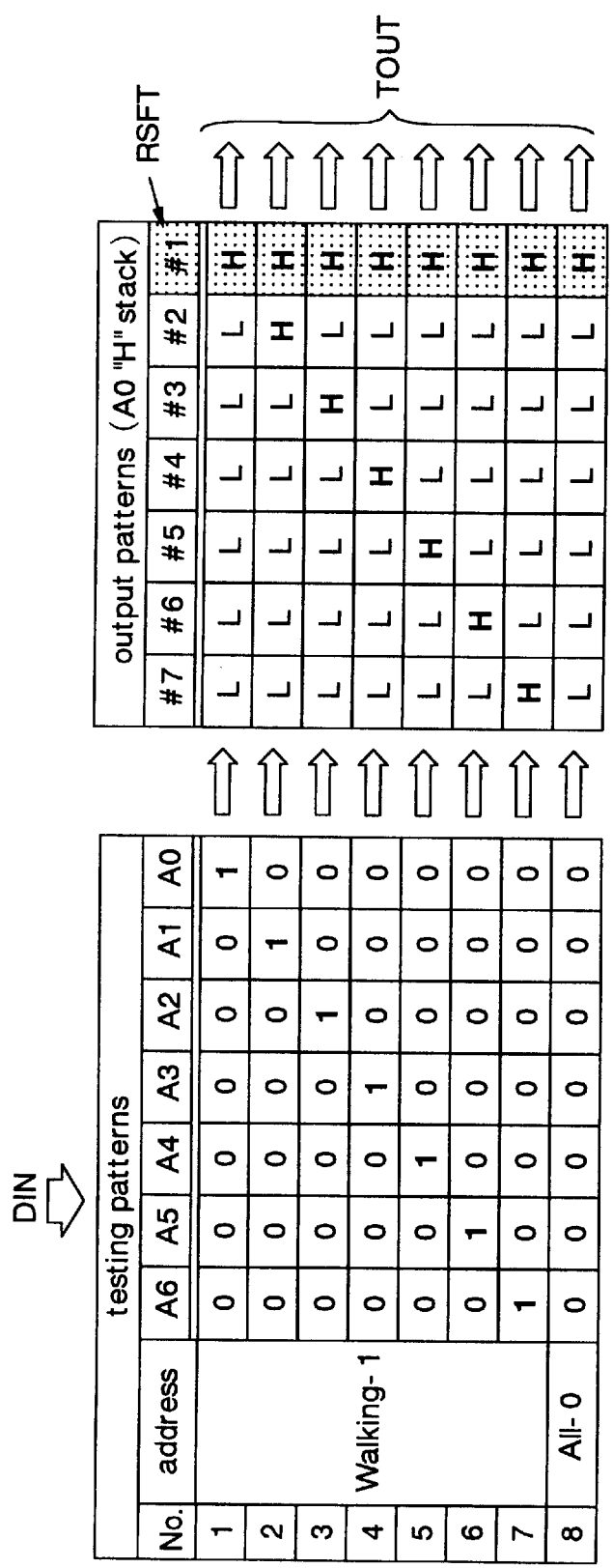
FIG. 29 is an explanation diagram showing an example of the output patterns at the time of the connection failure in the third embodiment of the semiconductor memory device.

FIG. 29 shows an output pattern in the case where the address terminal A0 has the stuck-at 1 failure.

In this case, in all testing patterns, the TOUT signal output in synchronicity with the first RSFT2 signal becomes "H" level meaning high level. Therefore, a user carrying out the testing can easily identify where the connection failure exists.

Figure 30:
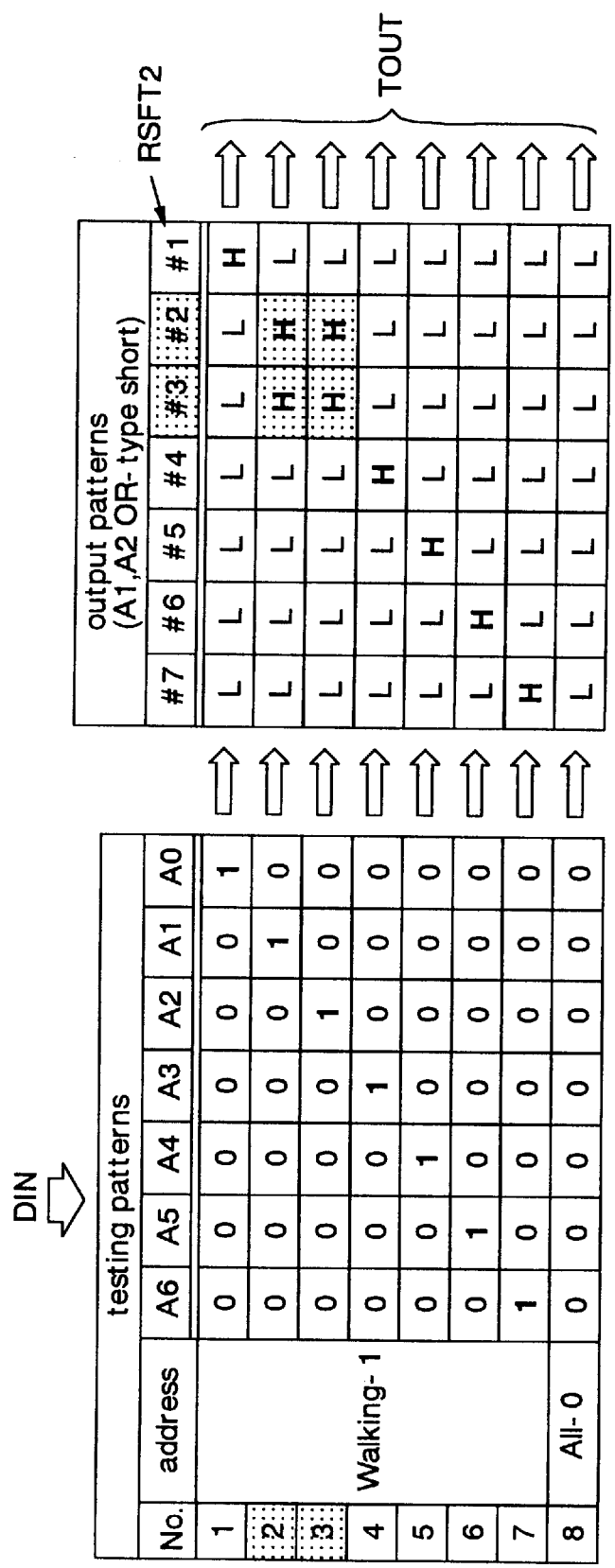
FIG. 30 is an explanation diagram showing an example of the output patterns at the time of another connection failure in the third embodiment of the semiconductor memory device.

FIG. 30 shows output patterns in the case where the address terminals A1 and A2 have 2-net OR-type short failures.

In the case, among the output patterns corresponding to the testing patterns in the second and third rows, the TOUT signals output in synchronicity with the second and third RSFT2 signals becomes high level. Therefore, as in the case shown in FIG. 29, where the connection failure exists can be identified easily.

In the semiconductor memory device, the circuit board mounted with the semiconductor memory device, and the method for testing interconnection between a semiconductor memory device with a circuit board in the embodiment described above, the parallel testing patterns (input patterns) are received by the shift register 38 and the patterns are output after being converted into the serial patterns. Therefore, even in the case where the number of the output terminals DQs is small, connection testing can be performed. The number of the output terminals does not depend on the number of the input terminals and at least one output terminal is sufficient.

Furthermore, connection testing can be carried out by causing the device to shift to the testing mode using only the terminals used in a normal operation, and terminals dedicated to testing are not necessary.

The output patterns (expected values) are patterns generated by converting the parallel input patterns into the serial patterns. Therefore, a user or the like carrying out the connection testing can easily identify where the failure exists.

The latch circuits 40 comprising the shift register 38 are formed only in the input terminals, which is different from the boundary scanning method (in the boundary scanning method, latch circuits are necessary for all terminals). Therefore, the scale of the circuit necessary for connection testing can be smaller. In other words, the testing circuit does not affect the circuit scale substantially.

Figure 31:
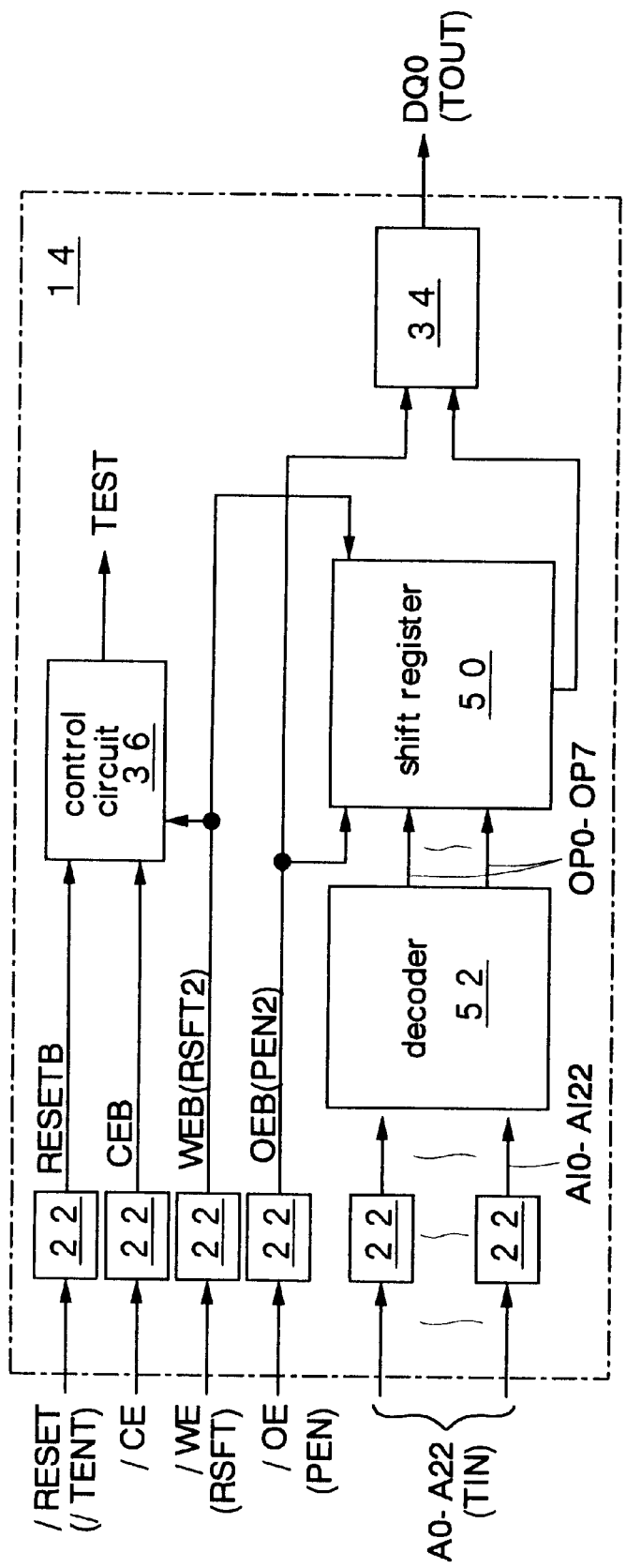
FIG. 31 is a block diagram showing the fourth embodiment of the semiconductor memory device according to the present invention

FIG. 31 shows the fourth embodiment of the semiconductor memory device of the present invention. In FIG. 31, the same circuits as the third embodiment have the same reference codes and detailed explanation for these circuits are omitted.

In this embodiment, the flash memory 14 has a decoder 52 between a shift register 50 and the input buffers 22 corresponding to the address terminals A0–A22.

The decoder 52 is activated in the testing mode, and receives the parallel testing patterns (address signals AI0–AI22) fed from each of the input buffers 22. The decoder 52 carries out a logic operation on the signals having been received and outputs the signals as parallel operation result patterns OP0–OP7.

The shift register 50 is formed by serially connecting eight latch circuits 40 (not shown). The shift register 50 is the same as the shift register 38 in the third embodiment, except for the number of the latch circuits 40. The shift register 50 is activated in the testing mode, and receives the operation result patterns OP0–OP7. The shift register 50 converts the patterns into serial output patterns and outputs the patterns having been converted to the output buffer 34.

The configuration of the fourth embodiment is the same as the third embodiment, except for the decoder 52 and the shift register 50. In FIG. 31, the memory cell unit 23, the row decoder 25, the column decoder 27, and the sense amplifier 29 are not shown.

Figure 32:
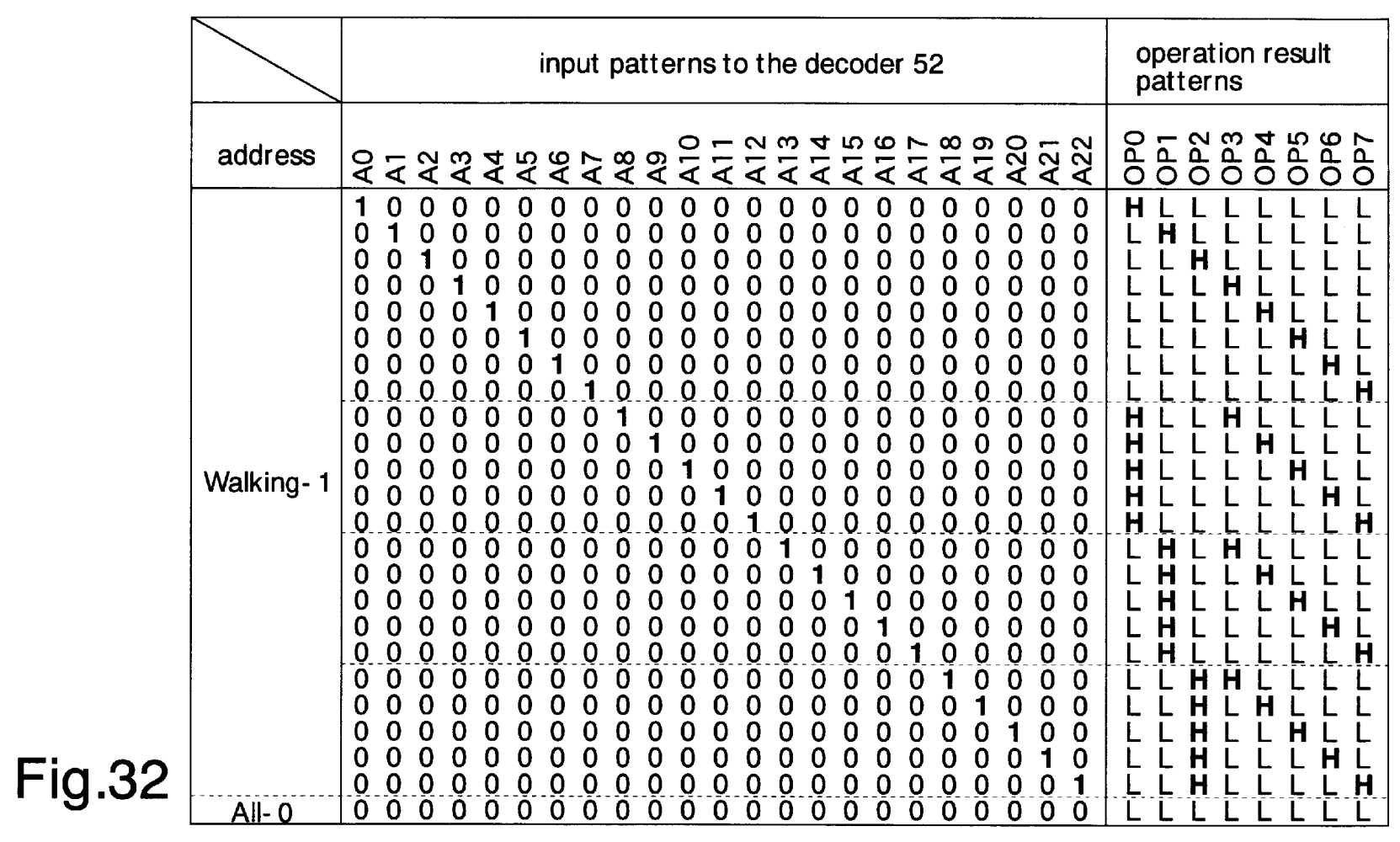

FIG. 32 shows an example of a logic table of the decoder 52.

The logic table can be formed by adopting a logic table used in the SCITT method, for example. In this logic table, 8 bits decoding signals (output patterns) are output in response to 23-bit input signals (input patterns). In this example, the input patterns are "Walking-1" and "All-0".

In this embodiment, the decoder 52 converts the 23-bit parallel input patterns fed from the external thereof to the input buffers 22 into the 8 bits parallel operation result patterns OP0–OP7. The operation result patterns are then fed to the shift register 50.

The shift register 50 converts the parallel operation result patterns OP0–OP7 having been received into the serial output patterns as in the third embodiment, and sequentially outputs the patterns as the test output signals TOUT via the output buffer 34. One testing pattern is output from the output buffer 34 by causing the shift register 50 to shift eight times. In other words, the testing time is substantially reduced when compared with the third embodiment.

By comparing the serial test output signals TOUT from the output buffer 34 with the expected values, a state of connection between each of the terminals in the flash memory 14 and each of the lands 17 can be judged.

In this embodiment, the same effect as by the third embodiment can be obtained. Furthermore, in this embodiment, i the decoder 52 converts the 23-bit parallel input patterns fed from the external thereof to the input buffers 22 into the 8 bits parallel operation result patterns OP0–OP7. Therefore, by causing the shift register 50 to shift 8 times, one testing pattern can be output from the output buffer 34. As a result, the testing time can be reduced substantially.

Figure 33:
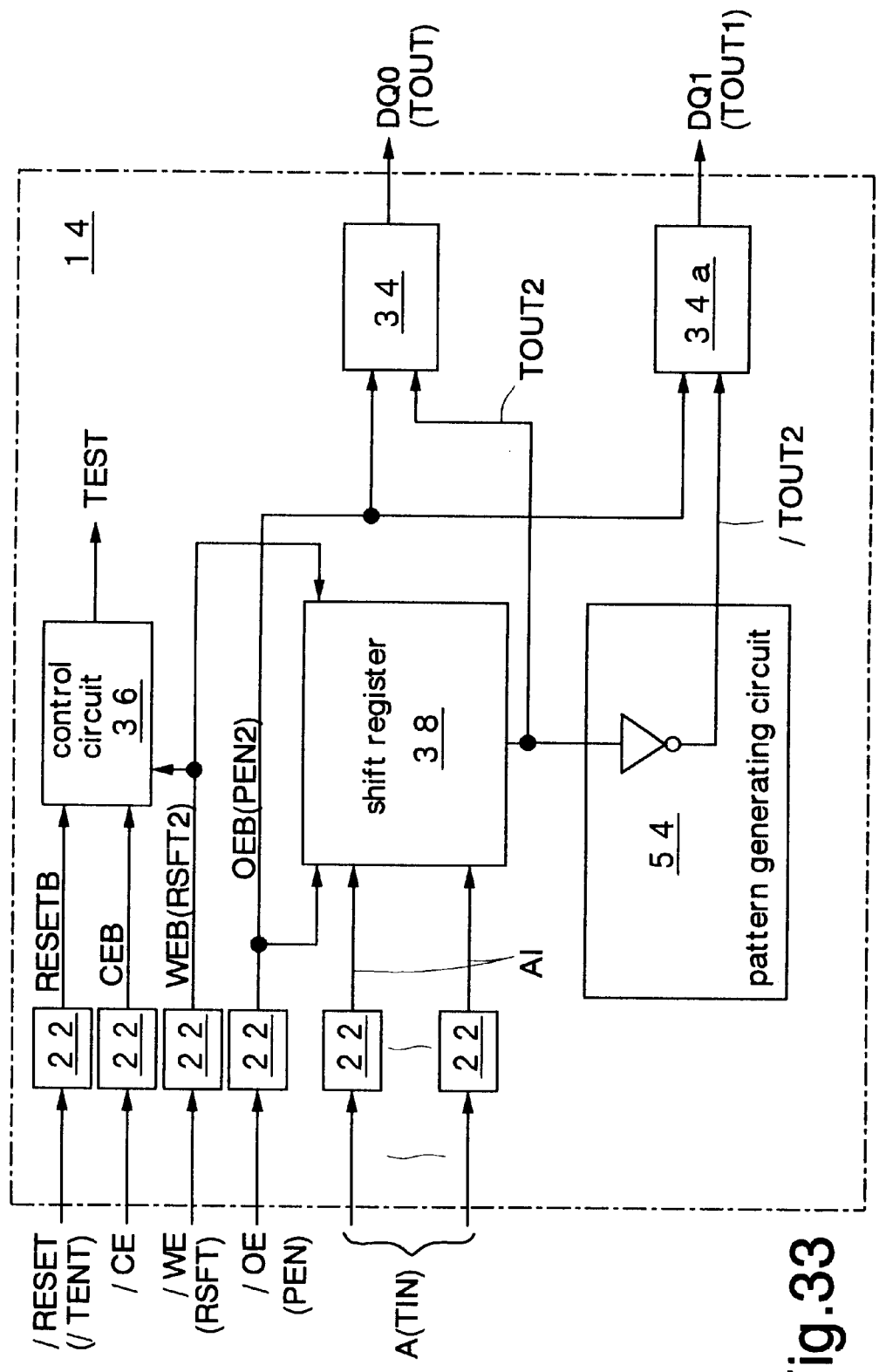
FIG. 33 is a block diagram showing the fifth embodiment of the semiconductor memory device according to the present invention.

FIG. 33 shows the fifth embodiment of the semiconductor memory device of the present invention. The same circuits as in the third embodiment have the same reference codes and the detailed explanation thereof is omitted here.

In this embodiment, the flash memory 14 has a pattern generating circuit 54 receiving the test output signals TOUT2 from the shift register 38, and an output buffer 34a receiving an output from the pattern generating circuit 54. The output buffer 34a is the same circuit as the output buffer 34 in FIG. 24.

The configuration of the fifth embodiment is the same as that of the third embodiment, except for the pattern generating circuit 54 and the output buffer 34a. In FIG. 33, the memory cell unit 23, the row decoder 25, the column decoder 27, and the sense amplifier 29 are not shown.

The pattern generating circuit 54 comprises an inverter. In other words, the pattern generating circuit 54 receives the test output signal TOUT2 and outputs to the output buffer 34a a test output signal /TOUT2 which is the inverse of the test output signal TOUT2.

In a normal operation, the output buffer 34a receives the data output signal from the sense amplifier which is not shown, and outputs data having been received thereby to the data input/output terminal DQ1. The output buffer 34a receives the test output signal /TOUT2 in the connection testing, and outputs the received signal as a test output signal TOUT1 to the data input/output terminal DQ1. The output buffer 34a is controlled by the output enable signal OEB, as the output buffer 34. The data input/output terminal DQ1 corresponds to the second output terminal shown in FIG. 22.

The data input/output terminal DQ1 is not connected to the external, depending on an operation mode. In other words, the semiconductor memory device in this embodiment can switch a word formation of the data input/output terminal between 1 bit and 2 bits.

In this embodiment, in the testing mode, regardless of the data input/output terminal DQ1 being used or not, the same testing patterns TIN are fed from the address terminals A. The shift register 38 receives the parallel address signals AI as in the third embodiment, and outputs the serial test output signals TOUT2. The pattern generating circuit 54 outputs the test output signals /TOUT2 which is the inverse of the test output signals TOUT2.

In the case where the data input/output terminal DQ1 is connected to the printed-wiring board, interconnection test is carried out by using both test output signals TOUT2 and /TOUT2. In the case where the data input/output terminal DQ1 is not connected to the printed-wiring board, interconnection test is carried out by using only the test output signals TOUT2. In other words, regardless of whether the data input/output terminal DQ1 is used or not, interconnection test can be carried out by using the same testing patterns.

In this embodiment, the same effect as by the third embodiment can be obtained. Furthermore, in this embodiment, the pattern generating circuit 54 generating the new output patterns /TOUT2 from the test output patterns TOUT2 output from the shift register 38 is used. Therefore, regardless of whether or not the data input/output terminal DQ1 is connected to the printed-wiring board, the connection testing can be performed by using the same testing patterns.

Figure 34:
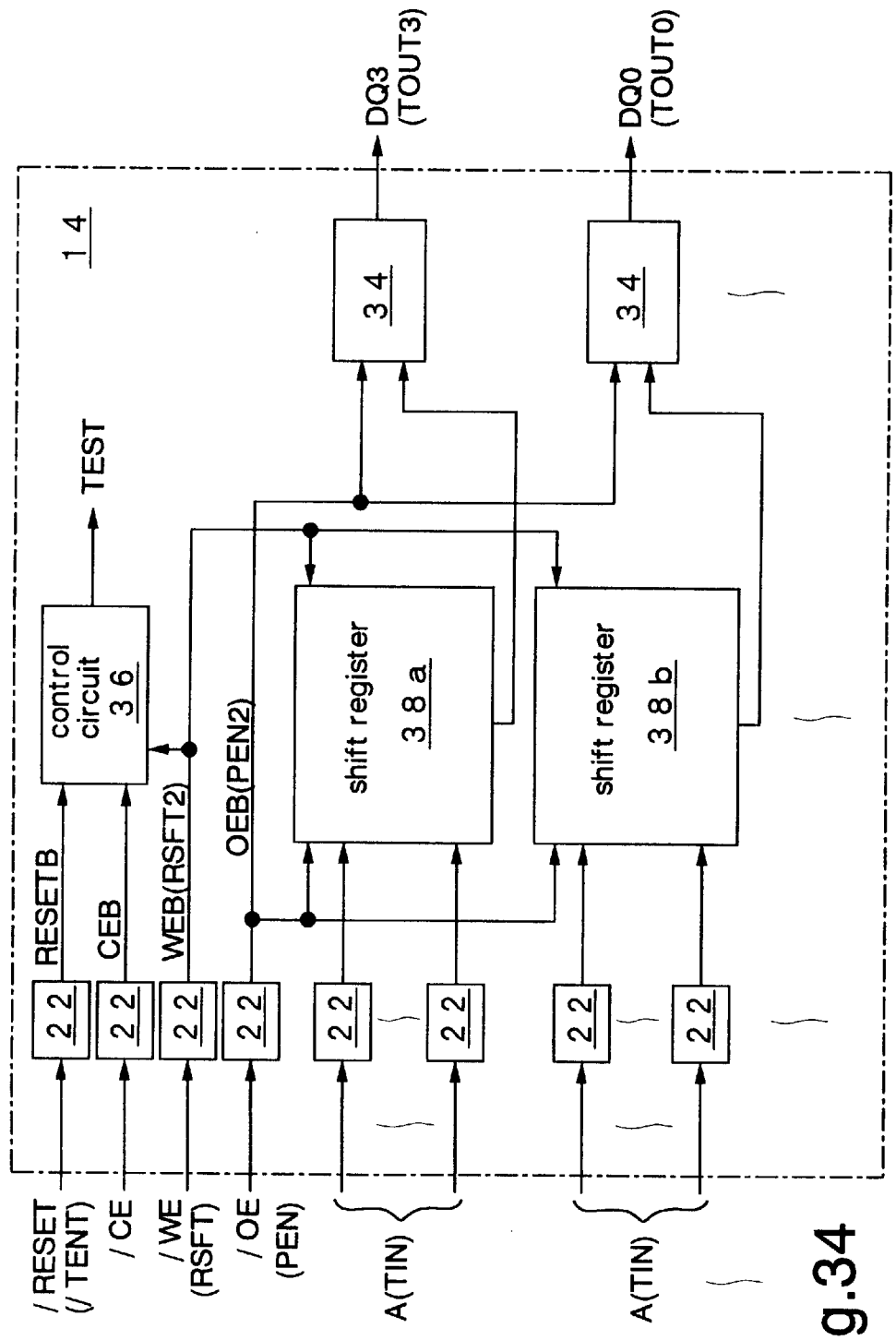
FIG. 34 is a block diagram showing the sixth embodiment of the semiconductor memory device according to the present invention.

FIG. 34 shows the sixth embodiment of the semiconductor memory device of the present invention.

The semiconductor memory device in this embodiment has a plurality of shift registers 38a, 38b and soon and a plurality of output buffers 34. The shift registers 38a, 38b, and so on are connected to the address terminals A via the input buffers 22. Each of the shift registers is formed by serially connecting the same quantity of latch circuits 40 as the quantity of address terminals. In other words, the address terminals A are grouped according to the shift registers.

For example, the shift register 38a has eight latch circuits 40 and the shift register 38b has ten latch circuits 40.

In the embodiment, in the testing mode, testing patterns are fed from the address terminals A corresponding to the plurality of shift registers 38. At this time, the number of the latch circuits in each shift register is smaller than the number of the latch circuits in the third embodiment. As a result, the time for outputting patterns can be reduced. Therefore, the time for testing is also reduced.

In the embodiment, the same effect as by the third embodiment can be obtained. Furthermore, in this embodiment, the plurality of shift registers 38a, 38b, . . . are formed, and the address terminals A are grouped according to the shift registers 38a, 38b, . . . . Therefore, in the testing mode, the time necessary for outputting the patterns can be reduced, leading to reduction in testing time. As has been described above, remarkable effects can be obtained by applying the present invention to not only the semiconductor memory devices having a small number of output terminals but also semiconductor memory devices having output terminals ranging from 8 to 16 or the like.

In the first embodiment of the semiconductor memory device described above, the present invention has been applied to the flash memory 13. However, the present invention may be applied to another type of clock asynchronous semiconductor memory devices or clock synchronous type semiconductor memory devices.

In the first embodiment of the semiconductor memory device described above, the present invention has been applied to the flash memory 13 enabling switching the data input/output terminals DQ0–DQ15 between 8 bits mode and 16 bits mode by using the switching terminal /BYTE. However, the present invention is applicable to semiconductor memory devices having data input/output terminals of a fixed-number of bits.

In the first embodiment of the semiconductor memory device described above, low-level state of the /CE and /WE signals is detected at consecutive rising or tailing edges of the /RESET signal, and the mode is shifted to the testing mode. However, the /CE and /WE signals becoming low level may be detected at 2 consecutive rising or tailing edges of the /RESET signal to shift to the testing mode. In this case, since the detection of the /CE and /WE signals can be performed by using only one type of edge of the /RESET signal, the circuit of the detecting unit 35 can be simpler.

In the first embodiment of the semiconductor memory device described above, low-level state of the /CE and /WE signals is detected at two consecutive edges of the /RESET signal to shift to the testing mode. However, the /CE and /WE signals becoming low level may be detected at three or more consecutive edges of the /RESET signal.

In the first embodiment of the semiconductor memory device described above, a shift to the testing mode is carried out by detecting that the /CE and /WE signals has become low level. However, in a semiconductor memory device comprising chip select signals ICS, /CS1, and /CS2, a read enable signal /RD, or the like, active levels of these control terminals may be detected to shift to the testing mode.

In the first embodiment of the circuit board mounted with the semiconductor memory device, each of the terminals of the flash memory 13 is soldered on the land 17 of the printed-wiring board 11, and the interconnection test is carried out for the soldered portion. However, the present invention is A not limited to this example, and the terminals of the flash memory 13 may be bonded on the printed-wiring board 11 by thermocompression bonding or the like, and interconnection test may be carried out for the thermocompression-bonding portion.

In the second embodiment of the semiconductor memory device described above, the activity prohibiting circuit 76 comprises the memory cell 76a of flash memory, and the initialization circuit 45 is controlled by the value written in the memory cell 76a. However, the present invention is not limited to this example, and an activity prohibiting circuit whose wiring becomes different by exchanging conductive-layer masks in the manufacturing process may be formed so that the initialization circuit is controlled by this activity prohibiting circuit.

In the fourth embodiment of the semiconductor memory device described above, the decoder 52 is formed by using the logic table of the SCITT method. However, the logic table of the decoder 52 is not limited to this table and any table in which the bit width of the output patterns is smaller than the bit width of the input patterns can be used.

In the fifth embodiment of the semiconductor memory device described above, the present invention has been applied to the flash memory having the data input/output terminal DQ1 which may not be connected to the external thereof. However, the present invention may be applied to a flash memory having the ready/busy terminal RY/BY which may not be connected to the external. Furthermore, the present invention may be applied to a semiconductor memory device enabling word-formation switching between 8 bits and 16 bits.

In the third embodiment of the circuit board mounted with the semiconductor memory device described above, the memory controller 15 is formed on the printed-wiring board 11, and the memory controller 15 controls the flash memory 14 to carry out the connection testing. However, as shown in FIG. 35, a terminal unit 60 having terminals 60a each connected to each of the lands 17 may be formed on a printed-wiring board 58 mounted with the flash memory 14, so that the flash memory 14 is controlled from the external of the printed-wiring board 58 via the terminal unit 60 to carry out the connection testing.

Although the present invention has been described above in detail, the embodiments and their modifications are mere examples of the present invention, and the present invention is not limited to these examples. It is obvious for those skilled in the art that various modifications can be made thereto within the spirit and scope of the present invention.

What is claimed is:

1. A semiconductor memory device comprising a detecting unit for detecting a state of the predetermined terminal a plurality of times when the power is switched on and a testing unit which is activated when all results of the detections by said detecting unit show expected values.

2. The semiconductor memory device according to claim 1, further comprising a reset terminal for receiving a reset signal for stopping an operation of an internal circuit, wherein
    said detecting unit detects the state of each of said predetermined terminals at the time said reset signal is changed.

3. The semiconductor memory device according to claim 2, wherein said detecting unit detects the signal levels of each of said predetermined terminals when said reset signal either activates or inactivates respectively twice or more.

4. The semiconductor memory device according to claim 2 further comprising an input circuit for transmitting a signal fed to said predetermined terminals to said detecting unit, wherein the input circuit is kept active regardless of the signal level of said reset signal.

5. The semiconductor memory device according to claim 2, wherein said detecting unit detects a signal level of each of said predetermined terminals at two successive edges of said reset signal.

6. The semiconductor memory device according to claim 5, wherein said predetermined terminals include an activation terminal for receiving an activation signal for activating the internal circuit and a control terminal for receiving a write control signal or a read control signal for accessing implemented memory elements, and said detecting unit detects the activation state of said activation terminal and said control terminal.

7. The semiconductor memory device according to claim 5, wherein said testing unit having been activated is inactivated when said reset signal is inactivated.

8. The semiconductor memory device according to claim 1 further comprising an activation storing circuit for storing information that said testing unit was activated after the power was switched on and for prohibiting activation of the testing unit when the stored information is retained therein.

9. The semiconductor memory device according to claim 1 further comprising an inactivation storing circuit for storing information that said testing unit having been activated after the power is switched on was inactivated and for prohibiting activation of the testing unit when the stored information is retained therein.

10. The semiconductor memory device according to claim 1 further comprising an activation prohibiting circuit for prohibiting activation of said testing unit when the device has been set to a predetermined state.

11. The semiconductor memory device according to claim 1, wherein
    said terminal, included in a portion of a plurality of terminals, is used as an inputting test terminal or an outputting test terminal while said testing unit is kept active and said testing unit comprises an operation circuit for carrying out logic operations on input patterns fed via said inputting test terminal and for outputting operation results as output patterns from said outputting test terminal.

12. The semiconductor memory device according to claim 11 further comprising an input/output terminal used for reading and writing data from and in implemented memory elements, an extended input/output terminal used together with said input/output terminal at the time of extending a word formation of said data, and a switching terminal for switching said word formation, wherein said input/output terminal and said extended input/output terminal are used as said outputting test terminals while said testing unit is kept active, and said testing unit makes the cases of word formation being extended or not extended each have different said output patterns output from said input/output terminal.

13. The semiconductor memory device according to claim 12, wherein said testing unit inverts the logic of a portion or all of said output patterns output from said extended input/output terminal at the time of extending the word formation.

14. The semiconductor memory device according to claim 13, wherein said testing unit inverts the logic of said output pattern output from said input/output terminal by being controlled by said switching terminal.

15. A semiconductor memory device comprising:

input terminals and an output terminal used in a normal operation and a conversion circuit for converting parallel input patterns received by said input terminals at the time of testing the interconnection between each of said terminals and a circuit board into serial output patterns sequentially output from said output terminal.

16. The semiconductor memory device according to claim 15 further comprising a plurality of said output terminals and a plurality of said conversion circuits corresponding to each of said output terminals.

17. The semiconductor memory device according to claim 15, wherein said conversion circuit is configured by a shift register comprising a plurality of latch circuits connected serially.

18. A semiconductor memory device comprising:

input terminals and an output terminal used in a normal operation;

an operation circuit for carrying out a logic operation on parallel input patterns received by a plurality of said input terminals at the time of testing the interconnection between each of said terminals and a circuit board; and a conversion circuit for receiving parallel operation result patterns from said operation circuit and converting the patterns into serial output patterns sequentially output from said output terminal.

19. The semiconductor memory device according to claim 15 further comprising a second output terminal used in a predetermined operation mode among a plurality of said normal operations and a pattern generating circuit for receiving said output patterns output from said conversion circuit, for generating second output patterns different from the output patterns having been received, and for sequentially outputting said second output patterns from said second output terminal.

20. A circuit board mounted with a semiconductor memory device, wherein the semiconductor memory device comprises:

(1) a detecting unit for detecting the state of a predetermined terminal a plurality of times when the power is switched on;

(2) a testing unit to be activated when all results of the detections by said detecting unit show expected values;

(3) a terminal used as an inputting test terminal or an outputting test terminal while said testing unit is active; and (4) an operation circuit formed in said testing unit for carrying out a logic operation on input patterns fed via said inputting test terminal and for outputting an operation result as an output pattern from said outputting test terminal; and wherein the circuit board comprises:

connecting parts each for connecting each terminal of the semiconductor memory device, and a control circuit for activating said testing unit by feeding a signal to said predetermined terminal via said connecting part, for inputting the input patterns to said inputting test terminal via said connecting part, and for judging the interconnection between each of said terminals of said semiconductor memory device and each of said connecting parts by receiving said output pattern output from said outputting test terminal.

21. A circuit board mounted with a semiconductor memory device, wherein the semiconductor memory device comprises:

(1) a detecting unit for detecting the state of a predetermined terminal a plurality of times when the power is switched on;

(2) a testing unit activated when all results of the detections by said detecting unit show expected values;

(3) a terminal used as inputting test terminal or outputting test terminal while said testing unit is active; and (4) an operation circuit formed in said testing unit for carrying out logic operations on input patterns fed via said inputting test terminal and for outputting operation results as output patterns from said outputting test terminals; and wherein the circuit board comprises:

connecting parts each for connecting each terminal of the semiconductor memory device, and terminal unit respectively connected to said inputting test terminals or said outputting test terminals via said connecting parts.

22. A circuit board mounted with a semiconductor memory device, wherein the semiconductor memory device comprises:

(1) input terminals and an output terminal used in a normal operation and (2) a conversion circuit for converting parallel input patterns received by a plurality of said input terminals at the time of testing the interconnection between each of said terminals and the circuit board into serial output patterns sequentially output from said output terminal; and wherein the circuit board comprises:

terminal unit each for connecting each of said terminals of the semiconductor memory device, and a controlling circuit for inputting said parallel input patterns to said input terminals via said connecting parts and for judging the interconnection between each of said terminals and each of said connecting parts of the semiconductor memory device by receiving said serial output patterns from said output terminal.

23. A circuit board mounted with a semiconductor memory device, wherein the semiconductor memory device comprises:

(1) input terminals and an output terminal used in a normal operation and (2) a conversion circuit for converting parallel input patterns received by a plurality of said input terminals at the time of testing the interconnection between each of said terminals and the circuit board into serial output patterns sequentially output from said output terminal, and wherein the circuit board comprises:

connecting parts each connecting said input terminals or said output terminal of the semiconductor memory device and terminal unit each connected to each of said terminals via each of the connecting parts.

24. A method for testing interconnection between a semiconductor memory device with a circuit board, wherein the semiconductor memory device comprises:

(1) a detecting unit for detecting the state of a predetermined terminal a plurality of times when the power is switched on;

(2) a testing unit activated when all results of the detections by said detecting unit show expected values;

(3) a terminal used as an inputting test terminal or an outputting test terminal while said testing unit is active; and (4) an operation circuit formed in said testing unit for carrying out logic operations on input patterns fed via said inputting test terminal and for outputting operation results as output patterns from said outputting test terminals; and wherein said testing method comprises the steps of:

activating said testing unit of said semiconductor memory device by feeding a predetermined signal a plurality of times to said predetermined terminal;

feeding said input patterns to said inputting test terminal; and judging the interconnection between each of said terminals of said semiconductor memory device and a circuit board mounted with the device, by receiving said output pattern output from said outputting test terminal.

25. In a method for testing interconnection between a semiconductor memory device with a circuit board according to the present invention, wherein the semiconductor memory device comprises:

(1) input terminals and an output terminal used in a normal operation and (2) a conversion circuit for converting parallel input patterns received by a plurality of said input terminals at the time of testing the interconnection between each of said terminals and a circuit board into serial output patterns sequentially output from said output terminal, and wherein said testing method comprises the steps of:

feeding said input patterns in parallel to a plurality of said input terminals of said semiconductor device and judging the interconnection between each of said terminals of said semiconductor memory device and said circuit board mounted with the device by receiving said output patterns output serially from said output terminal.

* * * * *